United States Patent
Nobukata

[11] Patent Number: 6,128,229
[45] Date of Patent: Oct. 3, 2000

[54] NON-VOLATILE SEMICONDUCTOR MEMORY AND METHOD OF VERIFYING AFTER WRITING AND READING THE SAME

[75] Inventor: Hiromi Nobukata, Kanagawa, Japan

[73] Assignee: Sony Corporation, Tokyo, Japan

[21] Appl. No.: 09/393,695

[22] Filed: Sep. 10, 1999

[30] Foreign Application Priority Data

Sep. 16, 1998 [JP] Japan .................................. 10-261303
Jan. 20, 1999 [JP] Japan .................................. 11-011743

[51] Int. Cl.[7] .................................................. G11C 16/34
[52] U.S. Cl. ................................ 365/185.22; 365/185.03; 365/185.17; 365/185.25
[58] Field of Search ........................ 365/185.03, 185.22, 365/185.17, 185.25

[56] References Cited

U.S. PATENT DOCUMENTS 4,677,590  6/1987  Arakawa .............................. 365/185.21
4,980,861  12/1990 Herdt et al. ......................... 365/185.17

FOREIGN PATENT DOCUMENTS 1-23878  5/1989  Japan ............................... G11C 11/34
1-46949  10/1989 Japan ............................... G11C 11/34

Primary Examiner—Andrew Q. Tran
Attorney, Agent, or Firm—Ronald P. Kananen; Rader, Fishman & Grauer

[57] ABSTRACT

In a non-volatile semiconductor memory device of a flash type for recording multivalue data into memory cells, a control is made such that a word line voltage is set in accordance with a distribution state of a threshold voltage at the time of verification of data after the writing, a precharge of a bit line is controlled in accordance with data latched in a latch circuit, whether a threshold value of the memory cell exceeds a voltage applied to word line or not is detected depending on whether a current sufficiently flows in the memory cell or not, a state of the latch circuit is specified by a detection output, and when data is sufficiently written, predetermined data is set into the latch circuit. At the time of reading, a control is made so that a word line voltage is set in accordance with the distribution state of the threshold voltage, the state of the latch circuit is specified depending on whether a current sufficiently flows in the memory cell or not, and the read data is set into the latch circuit. Thus, the number of elements constructing the latch circuit is reduced.

12 Claims, 31 Drawing Sheets

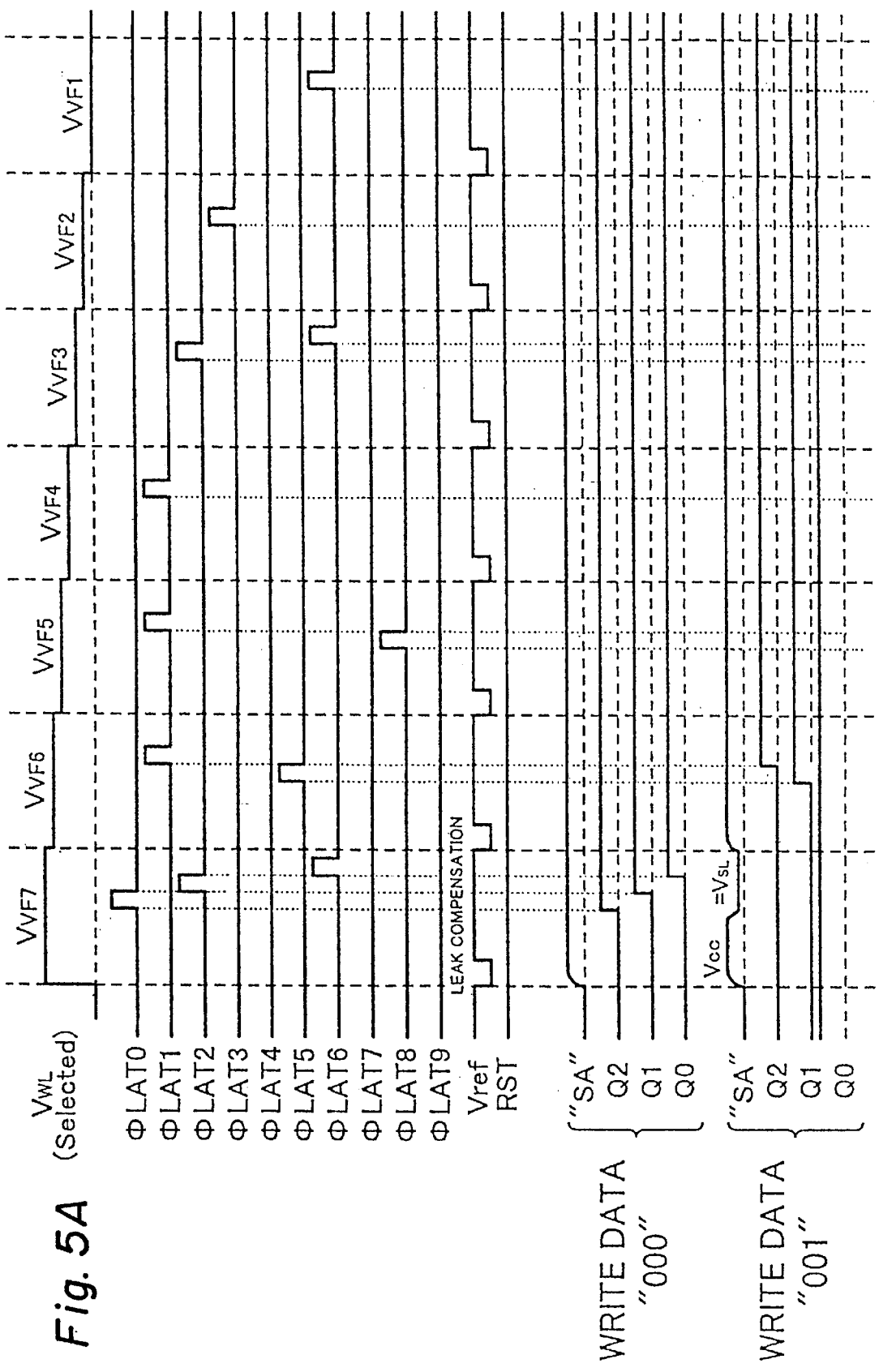

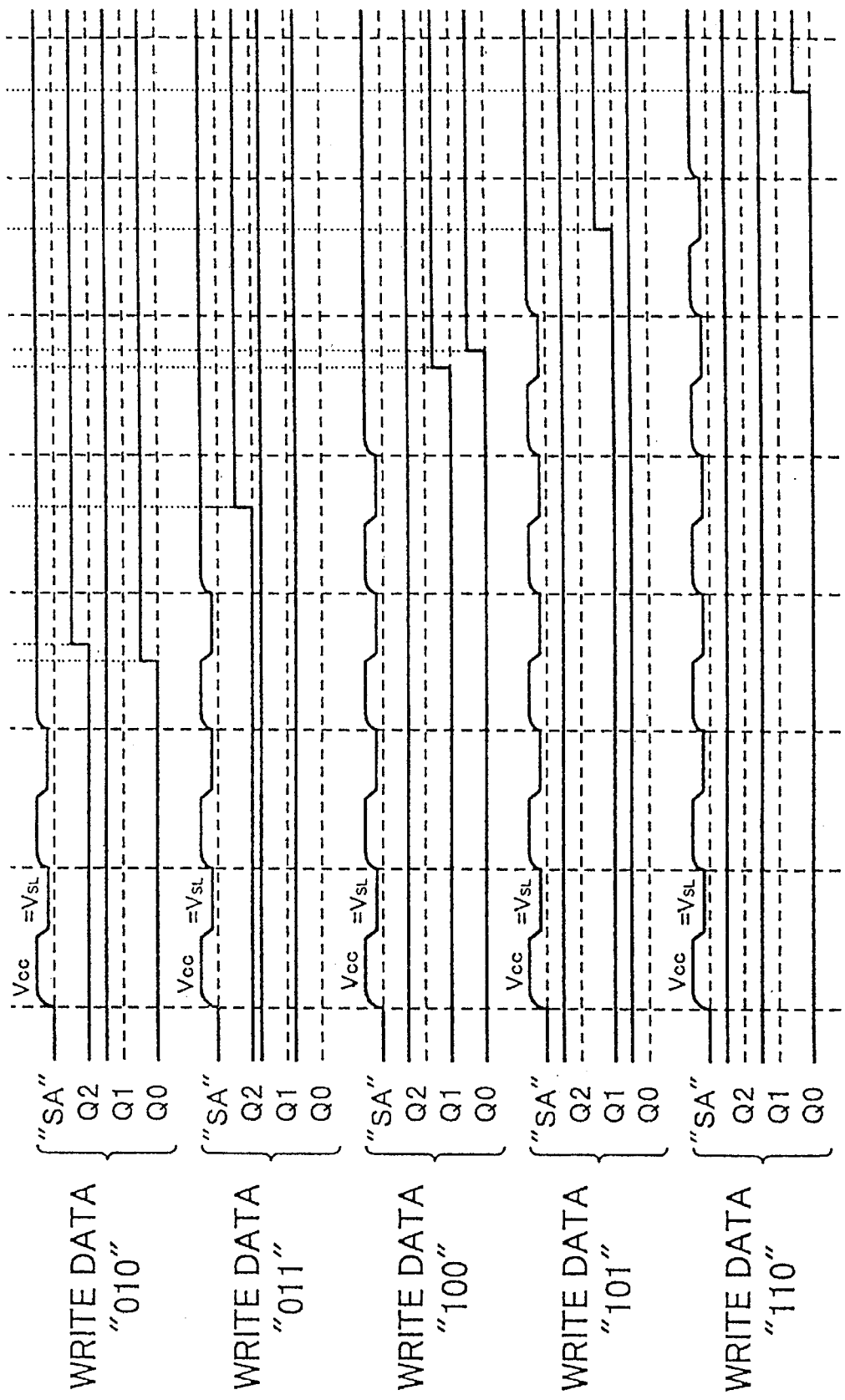

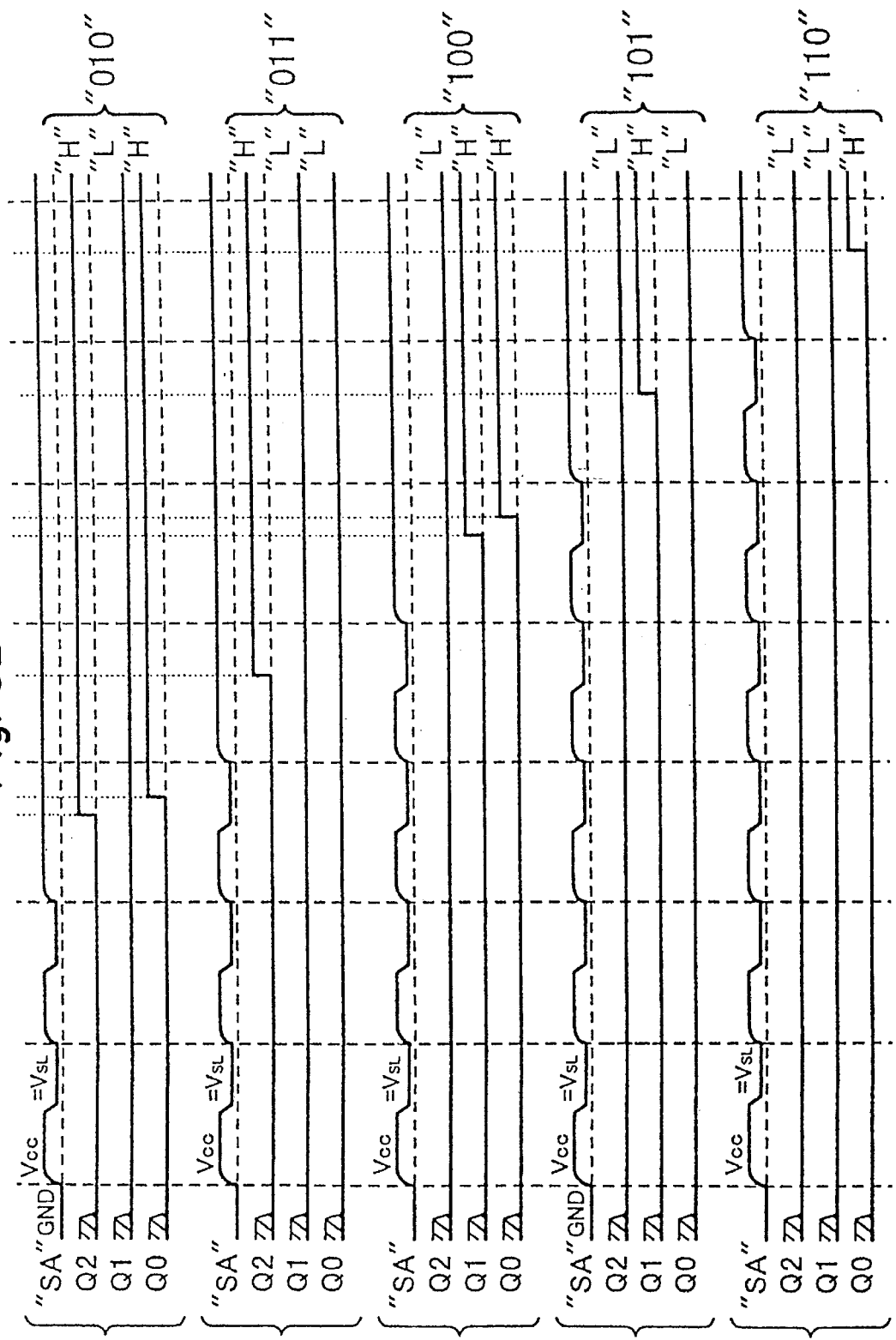

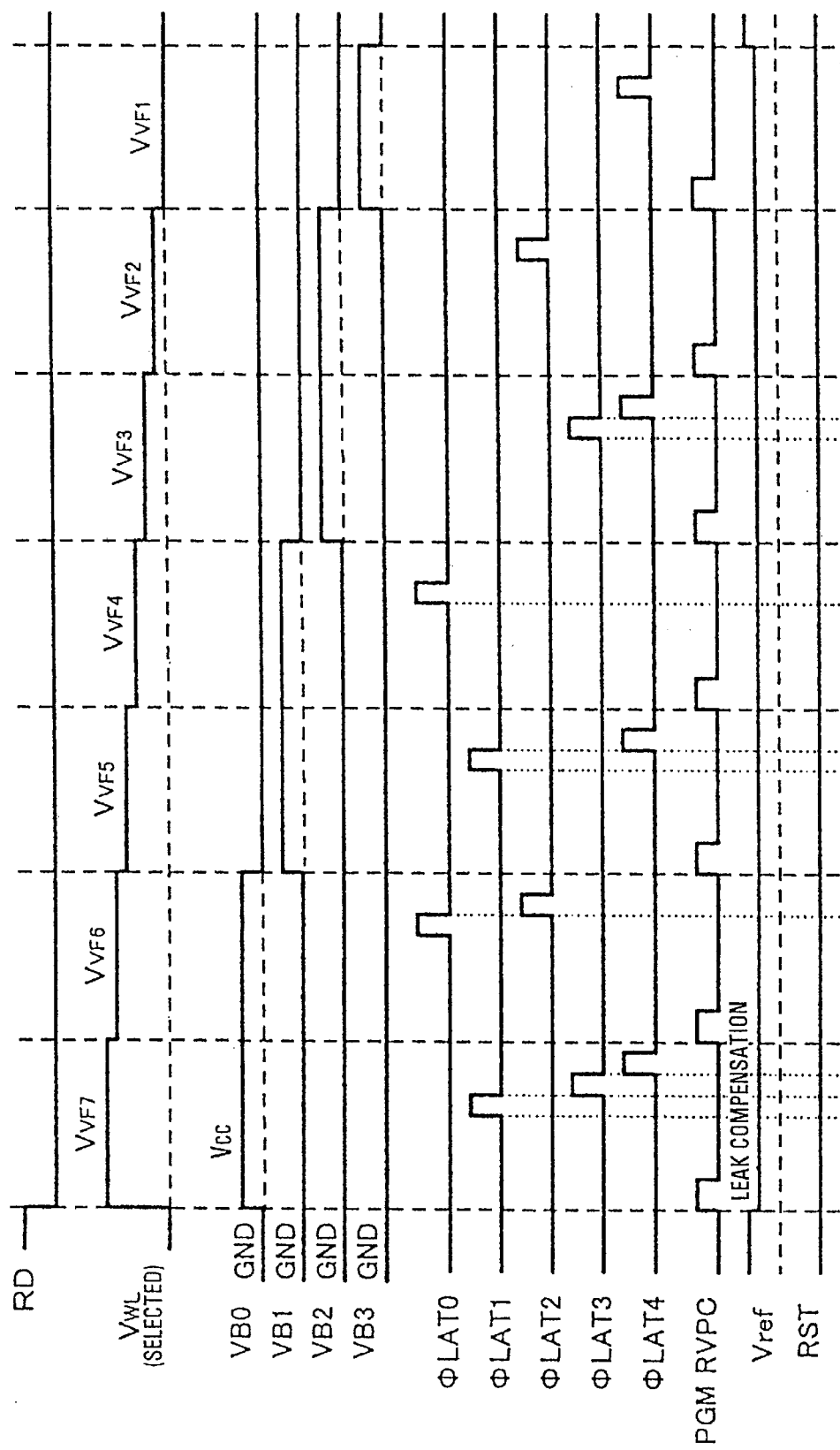

Fig. 17A

| VB \ VwL | VB0 | VB1 | VB2 | VB3 |
|---|---|---|---|---|
| VVF7 | Vcc | GND | GND | GND |
| VVF6 | Vcc | GND | GND | GND |
| VVF5 | GND | Vcc | GND | GND |
| VVF4 | GND | Vcc | GND | GND |
| VVF3 | GND | GND | Vcc | GND |
| VVF2 | GND | GND | Vcc | GND |
| VVF1 | GND | GND | GND | Vcc |

Fig. 17B

| VB \ VwL | VB0 | VB1 | VB2 | VB3 |
|---|---|---|---|---|
| VRD7 | Vcc | GND | GND | GND |
| VRD6 | Vcc | GND | GND | GND |
| VRD5 | Vcc | GND | GND | GND |
| VRD4 | Vcc | GND | GND | GND |
| VRD3 | Vcc | GND | GND | GND |
| VRD2 | Vcc | GND | GND | GND |
| VRD1 | Vcc | GND | GND | GND |

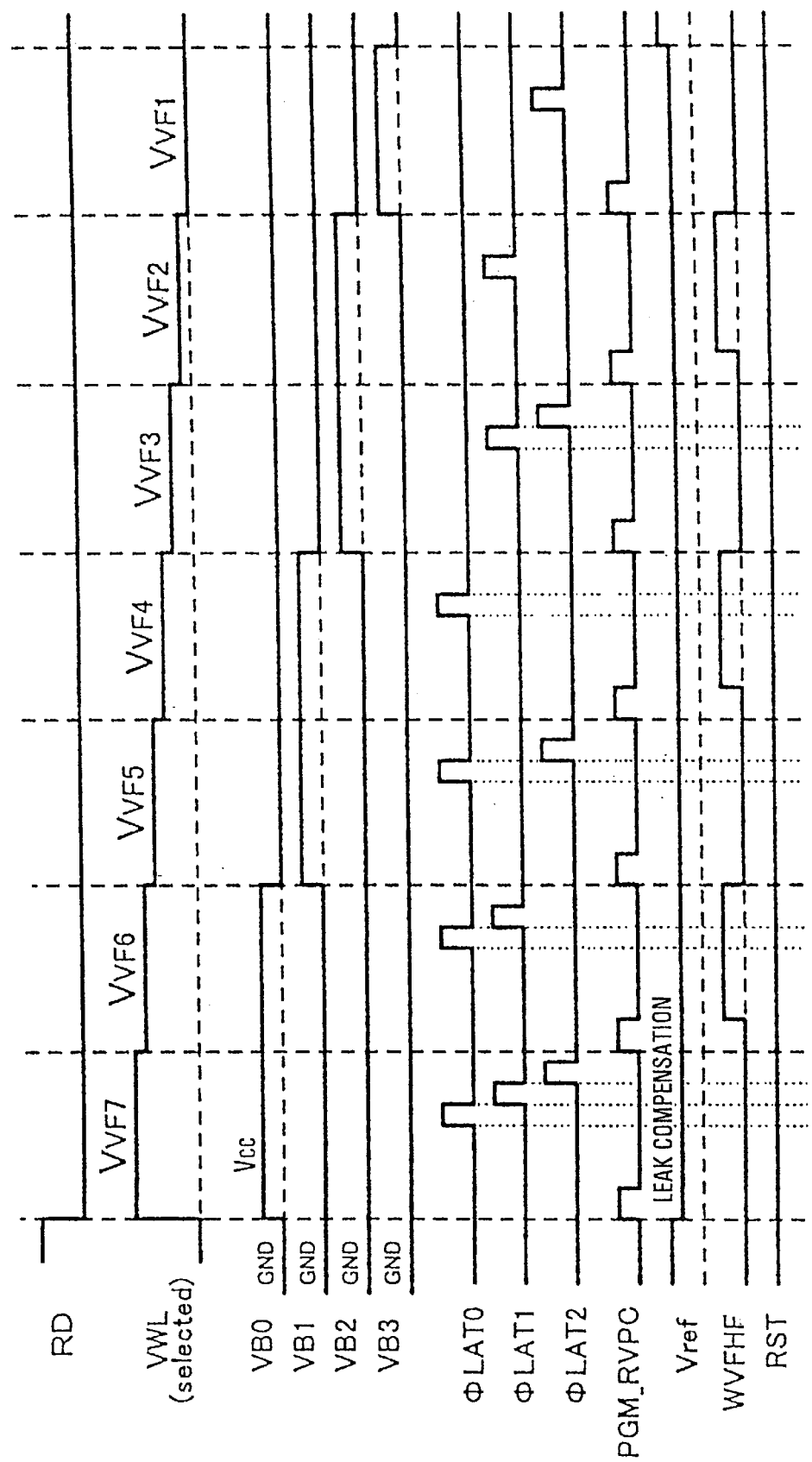

NON-VOLATILE SEMICONDUCTOR MEMORY AND METHOD OF VERIFYING AFTER WRITING AND READING THE SAME

BACKGROUND OF THE INVENTION

1. Field of the Invention

The invention relates to a non-volatile semiconductor memory device suitable for use in a multivalue type construction such that, for example, quartic (4 values: 2 bits) or octenary (8 values: 3 bits) data is recorded into a memory cell of a flash type and a verifying method and a reading method of such a non-volatile semiconductor memory device.

2. Description of the Related Art

A non-volatile semiconductor memory device such as a flash memory ordinarily has a binary type cell structure such that data having two values of "0" and "1" is recorded into one memory cell transistor. However, in the semiconductor memory device with the binary type construction, there is a limitation in a memory capacity. Particularly, it is considered that such a semiconductor memory device is used to record video data or audio data and a memory device having a large capacity such that video data or audio data of a long time can be recorded is demanded. A method of enabling multivalue data to be recorded into one memory cell, therefore, has been proposed.

However, if a storing level for one cell is set to, for example, the quartic value (4 values) or octenary value (8 values), a problem such that a circuit for verifying and a circuit for reading become complicated and a circuit scale increases occurs.

FIG. 1 shows an example of a non-volatile semiconductor memory device in which a storing multivalue level corresponds to the quartic value and which has already been proposed by the applicant of the present invention. As shown in FIG. 1, the non-volatile semiconductor memory device is constructed by: a memory array 211; a bit line voltage generating circuit 212; and a read/verify control circuit 213.

The memory array 211 has a construction such that a plurality of memory strings are arranged in a matrix form. One memory string is connected to a bit line BL0 and the other memory string is connected to a bit line BL1.

The memory string is constructed by an NAND string in which memory cell transistors each comprising a non-volatile semiconductor memory device having a floating gate are serially connected. Drains of the memory cell transistors of the NAND string are connected to the bit lines BL0 and BL1 through selection gates, respectively. Control gates of the memory cells of the same row are connected to a common word line. Multivalue data of the quartic value is written into the memory cell on a page unit basis by using a self boost.

The bit line voltage generating circuit 212 is constructed by NMOS transistors n101 to n108 and latch circuits LQ2 and LQ1 in each of which both inputs and both outputs of inverters are coupled, respectively. Supply lines of voltages VB1 and VB2 are led out from the bit line voltage generating circuit 212.

Upon writing, a bit line voltage according to write data is generated by the bit line voltage generating circuit 212 and supplied to memory cells in the memory array 211. The latch circuits LQ2 and LQ1 are included in the bit line voltage generating circuit 212. Upon verification, storing nodes Q2 and Q1 of the latch circuits LQ2 and LQ1 of the bit line voltage generating circuit 212 are set to "11" when data is sufficiently written into the memory cell in the memory array 211. Upon reading, a threshold voltage of the memory cell in the memory array 211 is detected and data is read out. In this instance, the read data is stored into the storing nodes Q2 and Q1 of the latch circuits LQ2 and LQ1.

The read/verify control circuit 213 is constructed by NMOS transistors n109 to n119. The read/verify control circuit 213 controls states of the latch circuits LQ2 and LQ1 upon reading or verifying. Supply lines of signals φLAT1 to φLAT4 are led out from the read/verify control circuit 213. Pulse-like signals are supplied to the supply lines of signals φLAT1 to φLAT4. Gate electrodes of the NMOS transistors n109 and n110 of the read/verify control circuit 213 are connected to a node SA. The node SA becomes a node to detect the threshold voltage of the memory cell in the memory array 211.

An NMOS transistor H103 of a high withstanding voltage is connected between the node SA and bit line BL0. An NMOS transistor H104 of a high withstanding voltage is connected between the node SA and the bit line BL1. An address decoding signal AnB is supplied to a gate electrode of the NMOS transistor H103. An address decoding signal AnN is supplied to a gate electrode of the NMOS transistor H104. An NMOS transistor H101 of a high withstanding voltage is connected between a supply line of a power voltage Vcc. (for example, 3.3V) and the bit line BL0. An NMOS transistor H102 of a high withstanding voltage is connected between the supply line of the power voltage Vcc and the bit line BL1. A control signal INHB is supplied to a gate electrode of the NMOS transistor H101. A control signal INHN is supplied to a gate electrode of the NMOS transistor H102.

The NMOS transistor n102 is connected between the node SA and a ground line GND. A PMOS transistor p101 is connected between the node SA and the power voltage Vcc. A reset signal RST1 is supplied to a gate electrode of the NMOS transistor n102. A signal Vref is supplied to a gate electrode of the PMOS transistor p101.

The NMOS transistor n101 is provided between the node SA and bit line voltage generating circuit 212. That is, a drain of the NMOS transistor n101 is connected to the node SA. A source of the NMOS transistor n101 is connected to drains of the NMOS transistors n103, n105, and n107, respectively. A control signal PGM is supplied to a gate electrode of the NMOS transistor n101.

The NMOS transistors n105 and n106 are serially connected between the source of the NMOS transistor n101 and the supply line of the voltage VB1. The NMOS transistors n107 and n108 are serially connected between the source of the NMOS transistor n101 and the supply line of the voltage VB2. The NMOS transistors n103 and n104 are serially connected between the source of the NMOS transistor n101 and the ground line.

The latch circuits LQ2 and LQ1 have the storing nodes Q2 and Q1 and their inversion storing nodes /Q2 and /Q1, respectively. "/" denotes a bar indicative of the inversion.

The inversion storing node /Q2 of the latch circuit LQ2 is connected to gate electrodes of the NMOS transistors n104 and n106. The storing node Q2 of the latch circuit LQ2 is connected to a gate electrode of the NMOS transistor n108.

The inversion storing node /Q1 of the latch circuit LQ1 is connected to gate electrodes of the NMOS transistors n103 and n107. The storing node Q1 of the latch circuit LQ1 is connected to a gate electrode of the NMOS transistor n105.

The NMOS transistors n111 and n112 are connected between the storing node Q2 of the latch circuit LQ2 and the ground line and between the storing node Q1 of the latch circuit LQ1 and the ground line, respectively.

In the read/verify control circuit 213, the gate electrodes of the NMOS transistors n109 and n110 are connected to the node SA. A drain of the NMOS transistor n109 is connected to the inversion storing node /Q2 of the latch circuit LQ2. A drain of the NMOS transistor n110 is connected to the inversion storing node /Q1 of the latch circuit LQ1.

The NMOS transistors n113 and n114 which are serially connected are connected between a source of the NMOS transistor n109 and the ground line. The NMOS transistor n115 is connected in parallel to the NMOS transistor n113.

The NMOS transistors n118 and n119 are serially connected between a source of the NMOS transistor n110 and the ground line. The NMOS transistors n116 and n117 which are serially connected are connected in parallel to the NMOS transistors n118 and n119.

Supply lines of the signals φLAT1 to φLAT4 are led out from the read/verify control circuit 213. A gate electrode of the NMOS transistor n119 is connected to the supply line of the signal φLAT1. A gate electrode of the NMOS transistor n117 is connected to the supply line of the signal φLAT2. A gate electrode of the NMOS transistor n114 is connected to the supply line of the signal φLAT3. A gate electrode of the NMOS transistor n113 is connected to the supply line of the signal φLAT4.

The inversion storing node /Q2 of the latch circuit LQ2 is connected to a gate electrode of the NMOS transistor n116. The storing node Q2 of the latch circuit LQ2 is connected to a gate electrode of the NMOS transistor n118. The storing node Q1 of the latch circuit LQ1 is connected to a gate electrode of the NMOS transistor n115.

The storing node Q2 of the latch circuit LQ2 is connected to a data bus line through a predetermined transistor (not shown). The storing node Q1 of the latch circuit LQ1 is connected to the data bus line through a predetermined transistor (not shown).

The writing operation will now be described. In a standby mode, the signal PGM is set to the low level, the NMOS transistor n101 is held non-conductive, and the bit lines BL0 and BL1 are disconnected from the latch circuits LQ2 and LQ1 of the bit line voltage generating circuit 212.

The reset signal RST1 is set to the high level, the signals AnB and AnN are set to the level (Vcc−Vth), and the bit lines BL0 and BL1 are set to the ground level. In this instance, the signals INHB and INHN are set to the low level.

When the writing operation is activated in this state, write data from the data bus is fetched and held in the latch circuits LQ2 and LQ1.

After that, the signal RST1 is switched to the low level and the bit lines BL0 and BL1 are disconnected from the ground line. The signals AnB and AnN are set to the high level (for example, passing voltage upon reading) of Vcc or higher. The signal Vref is set to the low level. The PMOS transistor p101 is held conductive. Thus, all of the bit lines BL0 and BL1 are charged to the power voltage Vcc.

Upon writing, an address on the side which is not selected by an address signal, for example, AnN is set to the ground level and, at the same time, the control signal INHN is set to the high level of Vcc or higher. The signal PGM is set to the high level and the voltages VB2 and VB1 are set to predetermined voltages which satisfy a relation of (VB2>VB1>0).

When the write data is "00", the inversion nodes /Q2 and /Q1 of the latch circuits LQ2 and LQ1 are at the high level.

Thus, the NMOS transistors n103 and n104 are made conductive and the bit line BL0 is set to the ground level.

When the write data is "1", the NMOS transistors n105 and n106 are made conductive and the bit line BL0 is set to the voltage VB1.

When the write data is "11", the NMOS transistors n107 and n108 are made conductive and the bit line BL0 is set to the voltage VB2.

When the write data is "10", both the path between the voltage VB2 and the ground line and the path between the voltage VB1 and the ground line are disconnected from the bit line. Thus, the voltage of the bit line is held at the Vcc level.

By the above processes, after the selection bit line BL0 was set to the voltage according to the write data, the word line is set to the writing voltage, the non-selection word line is set to the write passing voltage, and the writing operation is performed.

The verifying and reading operation will now be described with reference to a timing chart of FIG. 2. It is now assumed that the even bit line side is selected.

In the verifying operation, each time one writing operation is finished, write checks of "00", "01", and "11" are performed.

In the example, the verification is sequentially performed from the data at a higher level. That is, the word line voltage is sequentially reduced to VVF3→VVF2→VVF1 and the verification is performed. The verifying operation will now be specifically explained hereinbelow.

First, the signal Vref is set to the low level and the PMOS transistor p101 is held conductive. The signal RST1 is set to the low level and the NMOS transistor n102 is held non-conductive. The signal AnB is set to VAnB (VAnB=Vcc−Vth) and the voltage of the bit line is charged to the level dropped from the level of the signal AnB by a threshold voltage Vth' with a back bias. After that, by cutting off the NMOS transistor H103, the node SA is charged to the power voltage Vcc.

After the elapse of a predetermined time, the signal Vref is set to the voltage which enables the current enough to compensate a leak current of the bit line to be supplied to the PMOS transistor p101. A voltage P5V is set to the word line of the non-selection memory cell. The voltage VVF3 is applied to the word line to which the selection cell is connected.

First, the write data is subjected to the verification of "00". At this time, the selection word line voltage is set to VVF3.

When the threshold voltage Vth of the memory cell is larger than the word line voltage VVF3 (Vth>VVF3), since no current flows in the cell, the bit line voltage does not change, the node SA is held at the power voltage Vcc, and the NMOS transistors n109 and n110 are held conductive.

After the elapse of a predetermined time, the pulse-like signals φLAT1, φLAT3, and φLAT4 are set to the high level at the timings shown in FIG. 2.

For a period of time during which the signals φLAT3 and φLAT4 are at the high level, both the NMOS transistors n113 and n114 are switched to the conductive state. At this time, since the NMOS transistor n109 is conductive, the inversion node /Q2 of the latch circuit LQ2 is set to the low level and the node Q2 of the latch circuit LQ2 is inverted to the high level.

For a period of time during which the signal φLAT3 is at the high level, the NMOS transistor n119 is switched to the conductive state. At this time, since the gate electrode of the NMOS transistor n118 is set to the high level because the level of the node of the latch circuit LQ2 is inverted, the NMOS transistor n118 is also switched to the conductive state. The inversion node /Q1 of the latch circuit LQ1 is set to the low level and the node Q1 of the latch circuit LQ1 is inverted to the high level.

Consequently, when the threshold voltage Vth of the memory cell in which the write data is "00" is larger than the word line voltage VVF3 (Vth>VVF3), the latch data of the latch circuits LQ2 and LQ1 is inverted to "11". After that, upon rewriting, the bit line BL is set to the power voltage Vcc, the channel is boosted to a non-writing potential, and no data is written.

When the threshold voltage Vth of the memory cell is smaller than the word line voltage VVF3 (Vth<VVF3), a cell current larger than the leak compensation current flows, the bit line voltage drops, the NMOS transistor H103 is turned on, and redistribution of charges occurs. The electric potential of the node SA is set to (VAnB−Vth') that is almost equal to the bit line voltage. When the potential of the node SA is equal to (VAnB−Vth'), the NMOS transistors n109 and n110 cannot be made conductive at all.

After the elapse of a predetermined time, the pulse-like signals φLAT1, φLAT3, and φLAT4 are set to the high level at the timings shown in FIG. 2.

For a period of time during which the signals φLAT3 and φLAT4 are at the high level, both the NMOS transistors n113 and n114 are switched to the conductive state. Although the NMOS transistors n113 and n114 are switched to the conductive state, since the NMOS transistor n109 is not made conductive at all, the inversion of the node of the latch circuit LQ2 does not occur.

For a period of time during which the signal φLAT1 is at the high level, the NMOS transistor n119 is switched to the conductive state. At this time, since the NMOS transistor n116 is non-conductive (the inversion of the node of the latch circuit LQ2 does not occur), the inversion of the node of the latch circuit LQ1 does not occur.

Consequently, when the threshold voltage Vth of the memory cell in which the write data is "00" is smaller than the word line voltage VVF3 (Vth<VVF3), the latch data of the latch circuits LQ2 and LQ1 does not change but is held to "00". Upon rewriting, the bit line voltage is set to the writing potential and the data is written.

Subsequently, the verification of the write data "01" is performed. In this instance, the selection word line voltage is set to VVF2.

When the threshold voltage Vth of the memory cell is larger than the word line voltage VVF2 (Vth>VVF2), since no current flows in the cell, the bit line voltage does not change, the node SA is held at the power voltage Vcc, and the NMOS transistors n109 and n110 are held conductive.

After the elapse of a predetermined time, the pulse-like signal φLAT3 is set to the high level at the timing shown in FIG. 2.

For a period of time during which the signal φLAT3 is at the high level, the NMOS transistor n114 is switched to the conductive state. At this time, since the gate electrode of the NMOS transistor n115 is set to the high level by the Q2 output of the latch circuit LQ1, the NMOS transistor n115 is also switched to the conductive state. The inversion node /Q2 of the latch circuit LQ2 is set to the low level and the node Q1 of the latch circuit LQ1 is inverted to the high level.

Consequently, when the threshold voltage Vth of the memory cell in which the write data is "01" is larger than the word line voltage VVF2 (Vth>VVF2), the latch data of the latch circuits LQ2 and LQ1 is inverted to "11". After that, upon rewriting, the bit line BL is set to the power voltage Vcc, the channel is boosted to a non-writing potential, and no data is written.

When the threshold voltage Vth of the memory cell is smaller than the word line voltage VVF2 (Vth<VVF2), a cell current larger than the leak compensation current flows, the bit line voltage drops, the NMOS transistor H103 is turned on, and redistribution of charges occurs. The electric potential of the node SA is set to (VAnB−Vth) that is almost equal to the bit line voltage. When the potential of the node SA is equal to (VAnB−Vth'), the NMOS transistors n109 and n110 cannot be made conductive at all.

After the elapse of a predetermined time, the pulse-like signal φLAT3 is set to the high level at the timing shown in FIG. 2.

For a period of time during which the signal φLAT3 is at the high level, the NMOS transistor n114 is switched to the conductive state. At this time, since the NMOS transistor n109 is not made conductive at all, the inversion of the node of the latch circuit LQ2 does not occur.

Subsequently, the verification of the write data "10" is performed. In this instance, the selection word line voltage is set to VVF1.

When the threshold voltage Vth of the memory cell is larger than the word line voltage VVF1 (Vth>VVF1), since no current flows in the cell, the bit line voltage does not change, the node SA is held at the power voltage Vcc, and the NMOS transistors n109 and n110 are held conductive.

After the elapse of a predetermined time, the pulse-like signal φLAT1 is set to the high level at the timing shown in FIG. 2.

For a period of time during which the signal φLAT1 is at the high level, the NMOS transistor n119 is switched to the conductive state. At this time, since the gate electrode of the NMOS transistor n118 is set to the high level by the Q2 output of the latch circuit LQ2, the NMOS transistor n118 is also switched to the conductive state. The inversion node /Q1 of the latch circuit LQ1 is set to the low level and the node Q1 of the latch circuit LQ1 is inverted to the high level.

Consequently, when the threshold voltage Vth of the memory cell in which the write data is "10" is larger than the word line voltage VVF1 (Vth>VVF1), the latch data of the latch circuits LQ2 and LQ1 is inverted to "11". After that, upon rewriting, the bit line BL is set to the power voltage Vcc, the channel is boosted to a non-writing potential, and no data is written.

When the threshold voltage Vth of the memory cell is smaller than the word line voltage VVF1 (Vth<VVF1), a cell current larger than the leak compensation current flows, the bit line voltage drops, the NMOS transistor H103 is turned on, and redistribution of charges occurs. The electric potential of the node SA is set to (VAnB−Vth') that is almost equal to the bit line voltage. When the potential of the node SA is equal to (VAnB−Vth'), the NMOS transistors n109 and n110 cannot be made conductive at all.

After the elapse of a predetermined time, the pulse-like signal φLAT1 is set to the high level at the timing shown in FIG. 2.

For a period of time during which the signal φLAT1 is at the high level, the NMOS transistor n119 is switched to the conductive state. Since the NMOS transistor n110 is not made conductive at all, the inversion of the node of the latch circuit LQ1 does not occur.

Consequently, when the threshold voltage Vth of the memory cell in which the write data is "10" is smaller than the word line voltage VVF1 (Vth<VVF1), the latch data of the latch circuits LQ2 and LQ1 does not change but is held to "10". Upon rewriting, the bit line voltage is set to the writing potential and the data is written.

At the end of the verification at the word line voltage VVF1, the wired OR of the inversion signals of all latch data is calculated. If any one of them is equal to "0", the result of the wired OR is set to the low level and the processing routine advances to the rewriting process. If all of them are equal to "1", the writing operation is finished. The foregoing writing and verifying cycle is repeated until it is determined that the data has sufficiently been written into all of the memory cells or until the number of writing times reaches a predetermined value.

The reading operation will now be described with reference to a timing chart of FIG. 3. Upon reading, in a manner similar to the case of the verification, the data is read out in order from the data at a higher level. That is, the word line voltage is sequentially reduced to VRD3→VRD2→VRD1 and the data is read out. It is assumed that the even bit line side is selected.

Upon reading, first, prior to the reading operation, a signal RST2 is held at the high level for a predetermined period of time and the latch circuits LQ2 and LQ1 are reset. In a manner similar to the case of the verification, the signal Vref is set to the low level, the PMOS transistor p101 is held conductive, the signal RST1 is set to the low level, and the NMOS transistor n102 is held non-conductive. The signal AnB is set to VAnB (VAnB=Vcc−Vth). The bit line voltage is charged to the level dropped from the level of the signal AnB by the threshold voltage Vth' with the back bias. After that, by cutting off the NMOS transistor H103, the node SA is charged to the power voltage Vcc.

After the elapse of a predetermined time, the signal Vref is set to the voltage which enables the current enough to compensate a leak current of the bit line to be supplied to the PMOS transistor p101. The voltage P5V is set to the word line of the non-selection memory cell. The voltage VRD3 is applied to the word line to which the selection cell is connected.

When the threshold voltage Vth of the memory cell is larger than the word line voltage VRD3 (Vth>VRD3) as a result of the reading at the word line voltage VRD3, since no cell current flows, the node SA is held at the power voltage Vcc. In this instance, the NMOS transistors n109 and n110 are made conductive.

After the elapse of a predetermined time, the pulse-like signals φLAT3, φLAT4, and φLAT1 are set to the high level at the timings shown in FIG. 3. The NMOS transistors n113 and n114 are made conductive.

When the threshold voltage Vth of the memory cell is larger than the word line voltage VRD3, the NMOS transistor n109 is conductive. Therefore, the inversion node /Q2 of the latch circuit LQ2 is set to "0" and the node Q2 of the latch circuit LQ2 is inverted to "1".

When the signal φLAT1 is set to the high level, the NMOS transistor n119 is made conductive. In this instance, since the gate electrode of the NMOS transistor n118 is set to the high level by the Q2 output of the latch circuit LQ2, the NMOS transistor n118 is also switched to the conductive state. The NMOS transistor n110 is conductive. Therefore, when the signal φLAT1 is set to the high level, the inversion node /Q1 of the latch circuit LQ1 is set to "0" and the node Q1 of the latch circuit LQ1 is inverted to "1".

Thus, when the threshold voltage Vth of the memory cell is larger than the word line voltage VRD3 (Vth>VRD3), the latch data of the latch circuits LQ2 and LQ1 is inverted to "11".

On the other hand, when the threshold voltage Vth of the memory cell is smaller than the word line voltage VRD3 (Vth<VRD3), the cell current larger than the leak compensation current flows, the bit line voltage drops, the NMOS transistor H103 is made conductive, and redistribution of charges occurs. The voltage of the node SA is set to (VAnB−Vth') that is almost equal to the bit line voltage. Thus, the NMOS transistors n109 and n110 cannot be made conductive at all.

After the elapse of a predetermined time, the pulse-like signals φLAT3 and φLAT4 are set to the high level and the NMOS transistors n113 and n114 are made conductive. However, since the NMOS transistor n109 is not made conductive at all, the inversion of the node of the latch circuit LQ2 does not occur.

When the signal φLAT1 is set to the high level, the NMOS transistor n119 is made conductive. However, since the NMOS transistor n110 is not made conductive at all, the inversion of the node of the latch circuit LQ1 does not occur.

Subsequently, the word line voltage is set to VRD2 and the data is read out. When the threshold voltage Vth of the memory cell is larger than the word line voltage VRD2 (Vth>VRD2) as a result of the reading at the word line voltage VRD2, since no cell current flows, the node SA is held at the power voltage Vcc. In this instance, the NMOS transistors n109 and n110 are made conductive.

After the elapse of a predetermined time, the pulse-like signals φLAT3 and φLAT4 are set to the high level and the NMOS transistors n113 and n114 are made conductive. At this time, since the NMOS transistor n109 is conductive, the inversion node /Q2 of the latch circuit LQ2 is set to "0" and the node Q2 of the latch circuit LQ2 is inverted to "1".

Consequently, when the threshold voltage Vth of the memory cell is larger than the word line voltage VRD2 (Vth>VRD2), the latch data of the latch circuits LQ2 and LQ1 is inverted to "10".

When the threshold voltage Vth of the memory cell is smaller than the word line voltage VRD2 (Vth<VRD2), the cell current larger than the leak compensation current flows, the bit line voltage drops, the NMOS transistor H103 is made conductive, and redistribution of charges occurs. The voltage of the node SA is set to (VAnB−Vth) that is almost equal to the bit line voltage. Thus, the NMOS transistors n109 and n110 are not made conductive at all.

After the elapse of a predetermined time, the pulse-like signals φLAT3 and φLAT4 are set to the high level and the NMOS transistors n113 and n114 are made conductive. However, since the NMOS transistor n109 is not made conductive at all, the inversion of the node of the latch circuit LQ2 does not occur.

Subsequently, the word line voltage is set to VRD1 and the data is read out. When the threshold voltage Vth of the memory cell is larger than the word line voltage VRD1 (Vth>VRD1) as a result of the reading at the word line voltage VRD1, since no cell current flows, the node SA is held at the power voltage Vcc. In this instance, the NMOS transistors n109 and n110 are held conductive.

After the elapse of a predetermined time, the pulse-like signal φLAT2 is set to the high level and the NMOS transistor n117 is made conductive. At this time, the NMOS transistor n110 is conductive. Since the gate electrode of the NMOS transistor n116 is set to the high level by the /Q2 output of the latch circuit LQ2, the NMOS transistor n116 is also made conductive. Therefore, when the signal φLAT2 is set to the high level, the inversion node /Q1 of the latch circuit LQ1 is set to "0" and the node Q1 of the latch circuit LQ1 is inverted to "1".

Consequently, when the threshold voltage Vth of the memory cell is larger than the word line voltage VRD1 (Vth>VRD1), the latch data of the latch circuits LQ2 and LQ1 is inverted to "01".

When the threshold voltage Vth of the memory cell is smaller than the word line voltage VRD1 (Vth<VRDL), the cell current larger than the leak compensation current flows, the bit line voltage drops, the NMOS transistor H103 is made conductive, and redistribution of charges occurs. The voltage of the node SA is set to (VAnB−Vth) that is almost equal to the bit line voltage. Thus, the NMOS transistors n109 and n110 are not made conductive at all.

After the elapse of a predetermined time, the pulse-like signal φLAT2 is set to the high level and the NMOS transistor n117 is made conductive. However, since the NMOS transistor n110 is not made conductive at all, the inversion of the node of the latch circuit LQ1 does not occur.

FIG. 4 shows an example of a non-volatile semiconductor memory device in which the storing multivalue level corresponds to the octenary value and which has already been proposed by the applicant of the present invention. The non-volatile semiconductor memory device is constructed by: a memory array 111; a bit line voltage generating circuit 112; and a read/verify control circuit 113.

The memory array 111 has a construction such that a plurality of memory strings are arranged in a matrix form. One memory string is connected to the bit line BL0 and the other memory string is connected to the bit line BL1.

The memory string is constructed by an NAND string in which memory cell transistors each comprising a non-volatile semiconductor memory device having a floating gate are serially connected. Drains of the memory cell transistors of the NAND string are connected to the bit lines BL0 and BL1 through selection gates, respectively. Control gates of the memory cells of the same row are connected to a common word line. Multivalue data of the octenary value is written into the memory cell on a page unit basis by using a self boost.

The bit line voltage generating circuit 112 is constructed by NMOS transistors N101 to N114 and latch circuits LQ2, LQ1, and LQ0 in each of which both inputs and both outputs of inverters are coupled, respectively. Supply lines of voltages, VB0, VB1, VB2, and VB3 are led out from the bit line voltage generating circuit 112.

Upon writing, a bit line voltage according to write data is generated by the bit line voltage generating circuit 112 and supplied to memory cells in the memory array 111. The latch circuits LQ2, LQ1, and LQ0 are included in the bit line voltage generating circuit 112. Upon verification, storing nodes Q2, Q1, and Q0 of the latch circuits LQ2, LQ1, and LQ0 of the bit line voltage generating circuit 112 are set to "111" when data is sufficiently written into the memory cell in the memory array 11. Upon reading, a threshold voltage of the memory cell in the memory array 111 is detected and data is read out. In this instance, the read data is decoded and set into the storing nodes Q2, Q1, and Q0 of the latch circuits LQ2, LQ1, and LQ0.

The read/verify control circuit 113 is constructed by NMOS transistors N115 to N141. The read/verify control circuit 113 controls states of the latch circuits LQ2, LQ1, and LQ0 upon reading or verification. Supply lines of signals φLAT0 to φLAT9 are led out from the read/verify control circuit 113. Pulse-like signals are supplied to the supply lines of the signals φLAT0 to φLAT9. Gate electrodes of the NMOS transistors N115, N116, and N117 of the read/verify control circuit 113 are connected to the node SA. The node SA becomes a node to detect the threshold voltage of the memory cell in the memory array 111.

A serial connection of an NMOS transistors HN101 and HN103 of a high withstanding voltage is provided between the node SA and the bit line BL0. A serial connection of NMOS transistors HN102 and HN104 of a high withstanding voltage is provided between the node SA and the bit line BL1. An address decoding signal AiB is supplied to a gate electrode of the NMOS transistor HN103. An address decoding signal AiN is supplied to a gate electrode of the NMOS transistor HN104. A control signal TRN is supplied to gate electrodes of the NMOS transistors HN101 and HN102.

The NMOS transistor N101 is connected between the node SA and the ground line GND. The PMOS transistor P101 is connected between the node SA and the supply line of the power voltage Vcc (for example, 3.3V). A control signal DIS is supplied to the gate electrode of the NMOS transistor N101. The signal Vref is supplied to the gate electrode of the PMOS transistor P101.

The NMOS transistor N102 is provided between the node SA and bit line voltage generating circuit 112. That is, a drain of the NMOS transistor N102 is connected to the node SA. A source of the NMOS transistor N102 is connected to drains of the NMOS transistors N103, N105, N107, and N109. The control signal PGM is supplied to the gate electrode of the NMOS transistor N102.

The NMOS transistors N103 and N104 are serially connected between a source of the NMOS transistor N102 and the supply line of the voltage VB0. The NMOS transistors N105 and N106 are serially connected between the source of the NMOS transistor N102 and the supply line of the voltage VB1. The NMOS transistors N107 and N108 are serially connected between the source of the NMOS transistor N102 and the supply line of the voltage VB2. The NMOS transistors N109, N110, and N111 are serially connected between the source of the NMOS transistor N102 and the supply line of the voltage VB3.

The latch circuits LQ2, LQ1, and LQ0 have the storing nodes Q2, Q1, and Q0 and their inversion storing nodes /Q2, /Q1, and /Q0, respectively. "/" denotes a bar indicative of the inversion.

The inversion storing node /Q2 of the latch circuit LQ2 is connected to gate electrodes of the NMOS transistors N104 and N106. The storing node Q2 of the latch circuit LQ2 is connected to gate electrodes of the NMOS transistors N107 and N109.

The inversion storing node /Q1 of the latch circuit LQ1 is connected to gate electrodes of the NMOS transistors N103 and N108. The storing node Q1 of the latch circuit LQ1 is connected to gate electrodes of the NMOS transistors N105 and N110.

The inversion storing node /Q0 of the latch circuit LQ0 is connected to a gate electrode of the NMOS transistor N111.

The NMOS transistors N112, N113, and N114 are connected between the storing node Q2 of the latch circuit LQ2 and the ground line, between the storing node Q1 of the latch circuit LQ1 and the ground line, and between the storing node Q0 of the latch circuit LQ0 and the ground line, respectively. Gate electrodes of the NMOS transistors N112, N113, and N114 are connected to a supply line of a reset signal RST.

In the read/verify control circuit 113, the gate electrodes of the NMOS transistors N115, N116, and N117 are connected to the node SA. A drain of the NMOS transistor N115 is connected to the inversion storing node /Q2 of the latch circuit LQ2. A drain of the NMOS transistor N116 is connected to the inversion storing node /Q1 of the latch circuit LQ1. A drain of the NMOS transistor N117 is connected to the inversion storing node /Q0 of the latch circuit LQ0.

The NMOS transistor N118 is connected between a source of the NMOS transistor N115 and the ground line. A serial circuit of the NMOS transistors N119, N120, and N121 is connected in parallel to it.

A source of the NMOS transistor N116 is connected to a drain of the NMOS transistor N122 and a drain of the NMOS transistor N127. The NMOS transistors N123 and N124 are serially connected between a source of the NMOS transistor N122 and the ground line. A serial circuit of the NMOS transistors N125 and N126 is connected in parallel to them.

The NMOS transistors N128 and N129 are serially connected between a source of the NMOS transistor N127 and the ground line. A serial circuit of the NMOS transistors N130 and N131 is connected in parallel to them.

A source of the NMOS transistor N117 is connected to a drain of the NMOS transistor N132 and a drain of the NMOS transistor N137. The NMOS transistors N133 and N134 are serially connected between a source of the NMOS transistor N132 and the ground line. A serial circuit of the NMOS transistors N135 and N136 is connected in parallel to them.

The NMOS transistors N138 and N139 are serially connected between a source of the NMOS transistor N137 and the ground line. A serial circuit of the NMOS transistors N140 and N141 is connected in parallel to them.

Supply lines of the signals φLAT0 to φLAT9 are led out from the read/verify control circuit 113. A gate electrode of the NMOS transistor N118 is connected to the supply line of the signal φLAT0. A gate electrode of the NMOS transistor N121 is connected to the supply line of the signal φLAT1. A gate electrode of the NMOS transistor N124 is connected to the supply line of the signal φLAT2. A gate electrode of the NMOS transistor N126 is connected to the supply line of the signal φLAT3. A gate electrode of the NMOS transistor N129 is connected to the supply line of the signal φLAT4. A gate electrode of the NMOS transistor N131 is connected to the supply line of the signal φLAT5. A gate electrode of the NMOS transistor N134 is connected to the supply line of the signal φLAT6. A gate electrode of the NMOS transistor N136 is connected to the supply line of the signal φLAT7. A gate electrode of the NMOS transistor N139 is connected to the supply line of the signal φLAT8. A gate electrode of the NMOS transistor N141 is connected to the supply line of the signal φLAT9.

The inversion storing node /Q2 of the latch circuit LQ2 is connected to gate electrodes of the NMOS transistors N127 and N137. The storing node Q2 of the latch circuit LQ2 is connected to gate electrodes of the NMOS transistors N122 and N132. The inversion storing node /Q1 of the latch circuit LQ1 is connected to gate electrodes of the NMOS transistors N135 and N140. The storing node Q1 of the latch circuit LQ1 is connected to gate electrodes of the NMOS transistors N133 and N138. The inversion storing node /Q0 of the latch circuit LQ0 is connected to gate electrodes of the NMOS transistors N128 and N123. The storing node Q0 of the latch circuit LQ0 is connected to gate electrodes of the NMOS transistors N130, N125, and N120.

An NMOS transistor N151 is connected between the storing node Q2 of the latch circuit LQ2 and a bus line IO0. An NMOS transistor N152 is connected between the storing node Q1 of the latch circuit LQ1 and a bus line IO1. An NMOS transistor N153 is connected between the storing node Q0 of the latch circuit LQ0 and a bus line IO2. Gate electrodes of the NMOS transistors N151, N152, and N153 serving as column gates are connected to a supply line of a signal Y1_0.

The writing operation will now be described. In the standby mode, the signal PGM is set to the low level, the NMOS transistor N102 is held non-conductive, and the bit lines BL0 and BL1 are disconnected from the latch circuits LQ2, LQ1, and LQ0 of the bit line voltage generating circuit 112.

The signal DIS is set to the high level and the signals TRN, AiB, and AiN are set to (Vcc−Vth). The bit lines BL0 and BL1 are set to the ground level.

When the writing operation is activated in this state, the signal Y1_0 is set to the high level and the write data is fetched and held into the latch circuits LQ2, LQ1, and LQ0.

After that, the signal DIS is switched to the low level and the bit lines BL0 and BL1 are disconnected from the ground line. The signals TRN, AiB, and AiN are set to the high level (for example, passing voltage upon reading) that is equal to or higher than Vcc, the signal Vref is set to the low level. A PMOS transistor P101 is held conductive. Thus, all bit lines BL0 and BL1 are charged to the power voltage Vcc.

Upon writing, the address on the side that is not selected by the address signal, for example, AiN is set to the ground level and the signal PGM is set to the high level. The voltage VB3 is set to the highest voltage, the voltage VB2 is set to the second highest voltage, the voltage VB1 is set to the third highest voltage, and the voltage VB0 is set to the ground level.

When the write data is "00x" (x is equal to 0 or 1), the inversion nodes /Q2 and /Q1 of the latch circuits LQ2 and LQ1 are at the high level. Therefore, the NMOS transistors N103 and N104 are made conductive and the bit line BL0 is set to the voltage VB0 (ground level).

When the write data is "01x", the NMOS transistors N105 and N106 are made conductive and the bit line BL0 is set to the voltage VB1.

When the write data is "10x", the NMOS transistors N107 and N108 are made conductive and the bit line BL0 is set to the voltage VB2.

When the write data is "110", the NMOS transistors N109, N110, and N111 are made conductive and the bit line BL0 is set to the voltage VB3.

When the write data is "111", all of the paths from the voltages VB0 to VB3 are disconnected from the bit line. Therefore, the voltage of the bit line is held at the Vcc level.

After the selection bit line BL0 was set to the voltage according to the write data by the above processes, the word line is set to the writing voltage, the non-selection word line is set to the write passing voltage, and the data is written.

The verifying and reading operations will now be described with reference to FIG. 5.

In the verifying operation, each time the one writing operation is finished, the write checks of "000", "001", "010", "011", "100", "101", and "110" are performed.

In this example, the verification is performed in order from the data at a higher level. That is, the word line voltage is sequentially reduced to VVF7→VVF6→VVF5 VVF4→VVF3→VVF2→VVF1 and the verification is performed. The verifying operation will now be specifically explained.

First, the signal Vref is set to the low level and the PMOS transistor P101 is held conductive. The signal TRN is set to VTRN (VTRN=Vcc−Vth). The bit line voltage is charged to the level dropped from the level of the signal TRN by the threshold voltage Vth' with the back bias. After that, by cutting off the NMOS transistor HN101, the node SA is charged to the power voltage Vcc.

After the elapse of a predetermined time, the signal Vref is set to the voltage for enabling the current enough to compensate the leak current of the bit line to be supplied to the PMOS transistor P101. The voltage P5V is set to the word line of the non-selection memory cell. The voltage VVF7 is applied to the word line to which the selection cell is connected.

First, the verification of the write data "000" is performed.

When the threshold voltage Vth of the memory cell is larger than the word line voltage VVF7 (Vth>VVF7), since no current flows in the cell, the bit line voltage does not change, the node SA is held at the power voltage Vcc, and the NMOS transistors N115, N116, and N117 are held conductive.

After the elapse of a predetermined time, the pulse-like signals φLAT0, φLAT2, and φLAT6 are sequentially set to the high level.

For a period of time during which the signal φLAT0 is at the high level, the NMOS transistor N118 is switched to the conductive state. At this time, since. the NMOS transistor N115 is conductive, the inversion node /Q2 of the latch circuit LQ2 is set to the low level and the node Q2 of the latch circuit LQ2 is inverted to the high level.

For a period of time during which the signal φLAT2 is at the high level, the NMOS transistor N124 is switched to the conductive state. At this time, since the NMOS transistor N123 is conductive and the NMOS transistor N122 is switched to the conductive state (because the node of the latch circuit LQ2 has been inverted) and the NMOS transistor N116 is conductive, the inversion node /Q1 of the latch circuit LQ1 is set to the low level and the node Q1 of the latch circuit LQ1 is inverted to the high level.

For a period of time during which the signal φLAT6 is at the high level, the NMOS transistor N134 is switched to the conductive state. At this time, the NMOS transistor N133 is switched to the conductive state and the NMOS transistor N132 is switched to the conductive state (because the nodes of the latch circuits LQ2 and LQ1 have been inverted), and the NMOS transistor N117 is conductive. Thus, the inversion node /Q0 of the latch circuit LQ0 is set to the low level and the node Q0 of the latch circuit LQ0 is inverted to the high level.

Consequently, when the threshold voltage Vth in the memory cell in which the write data is "000" is larger than the word line voltage VVF7 (Vth>VVF7), the latch data of the latch circuits LQ2, LQ1, and LQ0 is inverted to "111". After that, upon rewriting, the bit line BL is set to the power voltage Vcc, the channel is boosted to the non-writing potential, and no data is written.

When the threshold voltage Vth of the memory cell is smaller than the word line voltage VVF7 (Vth<VVF7), a cell current larger than the leak compensation current flows, the bit line voltage drops, the NMOS transistor HN101 is turned on, and redistribution of charges occurs. The electric potential of the node SA is set to (VTRN−Vth') that is almost equal to the bit line voltage. When the potential of the node SA is equal to (VTRN−Vth'), the NMOS transistors N115, N116, and N117 cannot be made conductive at all.

After the elapse of a predetermined time, the pulse-like signals φLAT0, φLAT2, and φLAT6 are sequentially set to the high level.

For a period of time during which the signal φLAT0 is at the high level, the NMOS transistor N118 is switched to the conductive state. Although the NMOS transistor N118 is switched to the conductive state, since the NMOS transistor N115 is not made conductive at all, the inversion of the node of the latch circuit LQ2 does not occur.

For a period of time during which the signal. φLAT2 is at the high level, the NMOS transistor N124 is switched to the conductive state. In this instance, since the NMOS transistor N122 is non-conductive (because the inversion of the node of the latch circuit LQ2 does not occur), the inversion of the node of the latch circuit LQ1 does not occur.

For a period of time during which the signal φLAT6 is at the high level, the NMOS transistor N134 is switched to the conductive state. In this instance, since the NMOS transistor N133 is non-conductive and the NMOS transistor N132 is non-conductive (because the inversion of the nodes of the latch circuits LQ2 and LQ1 does not occur), the inversion of the node of the latch circuit LQ0 does not occur.

Consequently, when the threshold voltage Vth of the memory cell in which the write data is "000" is smaller than the word line voltage VVF7 (Vth<VVF7), the latch data of the latch circuits LQ2, LQ1, and LQ0 does not change but is held to "000". Upon rewriting, the bit line voltage is set to the writing potential and the data is written.

Subsequently, the verification of the write data "001" is performed. In this instance, the selection word line voltage is set to VVF6.

When the threshold voltage Vth of the memory cell is larger than the word line voltage VVF6 (Vth>VVF6), since no current flows in the cell, the bit line voltage does not change, the node SA is held at the power voltage Vcc, and the NMOS transistors N115, N116, and N117 are held conductive.

After the elapse of a predetermined time, the pulse-like signals φLAT5 and φLAT1 are sequentially set to the high level.

For a period of time during which the signal φLAT5 is at the high level, the NMOS transistor N131 is switched to the conductive state. At this time, the NMOS transistor N130 is conductive, the NMOS transistor N127 is conductive, and the NMOS transistor N116 is conductive, so that the inversion node /Q1 of the latch circuit LQ1 is set to the low level and the node Q1 of the latch circuit LQ1 is inverted to the high level.

For a period of time during which the signal φLAT1 is at the high level, the NMOS transistor N121 is made conductive, the NMOS transistor N120 is conductive, the NMOS transistor N119 is switched to the conductive state, and the NMOS transistor N115 is conductive, so that the inversion node /Q2 of the latch circuit LQ2 is set to the low level and the node Q2 of the latch circuit LQ2 is inverted to the high level.

Consequently, when the threshold voltage Vth of the memory cell in which the write data is "001" is larger than the word line voltage VVF6 (Vth>VVF6), the latch data of the latch circuits LQ2, LQ1, and LQ0 is inverted to "111". After that, upon rewriting, the. bit line BL is set to the power voltage Vcc, the channel is boosted to the non-writing potential, and no data is written.

When the threshold voltage Vth of the memory cell is smaller than the word line voltage VVF6 (Vth<VVF6), a cell current larger than the leak compensation current flows, the bit line voltage drops, the NMOS transistor HN101 is turned on, and redistribution of charges occurs. The electric potential of the node SA is set to (VTRN−Vth') that is almost equal to the bit line voltage. When the potential of the node SA is equal to (VTRN−Vth'), the NMOS transistors N115, N116, and N117 cannot be made conductive at all.

After the elapse of a predetermined time, the pulse-like signals φLAT5 and φLAT1 are sequentially set to the high level.

For a period of time during which the signal φLAT5 is at the high level, the NMOS transistor N131 is switched to the conductive state. In this instance, since the NMOS transistor N116 is not made conductive at all, the inversion of the node of the latch circuit LQ1 does not occur.

For a period of time during which the signal φLAT1 is at the high level, the NMOS transistor N121 is switched to the conductive state. In this instance, since the NMOS transistor N119 is non-conductive, the inversion of the node of the latch circuit LQ2 does not occur.

Consequently, when the threshold voltage Vth of the memory cell in which the write data is "001" is smaller than the word line voltage VVF6 (Vth<VVF6), the latch data of the latch circuits LQ2, LQ1, and LQ0 does not change but is held to "001". Upon rewriting, the bit line voltage is set to the writing potential and the data is written.

In a manner similar to the above, in case of the word line voltage VVF5, it is controlled in a manner such that only when the threshold voltage Vth of the memory cell in which the write data is "010" is larger than the word line voltage VVF5 (Vth>VVF5), the latch data of the latch circuits LQ2, LQ1, and LQ0 is inverted to "111".

In case of the word line voltage VVF4, it is controlled in a manner such that only when the threshold voltage Vth of the memory cell in which the write data is "011" is larger than the word line voltage VVF4 (Vth>VVF4), the latch data of the latch circuits LQ2, LQ1, and LQ0 is inverted to "111".

In case of the word line voltage VVF3, it is controlled in a manner such that only when the threshold voltage Vth of the memory cell in which the write data is "100" is larger than the word line voltage VVF3 (Vth>VVF3), the latch data of the latch circuits LQ2, LQ1, and LQ0 is inverted to "111".

In case of the word line voltage VVF2, it is controlled in a manner such that only when the threshold voltage Vth of the memory cell in which the write data is "101" is larger than the word line voltage VVF2 (Vth>VVF2), the latch data of the latch circuits LQ2, LQ1, and LQ0 is inverted to "111".

In case of the word line voltage VVF1, it is controlled in a manner such that only when the threshold voltage Vth of the memory cell in which the write data is "110" is larger than the word line voltage VVF1 (Vth>VVF1), the latch data of the latch circuits LQ2, LQ1, and LQ0 is inverted to "111".

At the end of the verification at the word line voltage VVF1, the wired OR of the inversion signals of all latch data is calculated. If any one of them is equal to "0", the result of the wired OR is set to the low level and the processing routine advances to the rewriting process. If all of them are equal to "1", the writing operation is finished. The foregoing writing and verifying cycle is repeated until it is determined that the data has sufficiently been written into all of the memory cells or until the number of writing times reaches a predetermined value.

The reading operation will now be described with reference to FIG. 6. Upon reading, the reset signal RST is set to the high level for a predetermined period of time, thereby initializing the storing nodes Q2, Q1, and Q0 of the latch circuits LQ2, LQ1, and LQ0 to the low level. In a manner similar to the case of the verification, the data is read out in order from the data at a higher level. That is, the word line voltage is sequentially reduced to VRD7→VRD6→VRD5→VRD4→VRD3→VRD2→VRD1 and the data is read out.

Upon reading, in a manner similar to the case of the verification, first, the signal Vref is set to the low level, and the PMOS transistor P101 is held conductive. The signal TRN is set to VTRN (VTRN=Vcc−Vth). The bit line voltage is charged to the level dropped from the level of the signal TRN by the threshold voltage Vth' with the back bias. After that, by cutting off the NMOS transistor HN101, the node SA is charged to the power voltage Vcc.

After the elapse of a predetermined time, the signal Vref is set to the voltage which enables the current enough to compensate a leak current of the bit line to be supplied to the PMOS transistor P101. The voltage P5V is set to the word line of the non-selection memory cell. The voltage VRD7 is applied to the word line to which the selection cell is connected.

When the threshold voltage Vth of the memory cell is larger than the word line voltage VRD7 (Vth>VRD7) as a result of the reading at the word line voltage VRD7, since no cell current flows, the node SA is held at the power voltage Vcc. In this instance, the NMOS transistors N115, N116, and N117 are made conductive.

After the elapse of a predetermined time, the pulse-like signals φLAT0, φLAT2, and φLAT6 are sequentially set to the high level.

When the signal φLAT0 is set to the high level, the NMOS transistor N118 is made conductive. Since the NMOS transistor N115 is conductive, the inversion node /Q2 of the latch circuit LQ2 is set to "0", and the node Q2 of the latch circuit LQ2 is inverted to "1".

When the signal φLAT2 is set to the high level, the NMOS transistor N124 is made conductive. In this instance, the NMOS transistor N123 is conductive and the NMOS transistor N122 is switched to the conductive state. Since the NMOS transistor N116 is conductive, the inversion node /Q1 of the latch circuit LQ1 is set to "0" and the node Q1 of the latch circuit LQ1 is inverted to "1".

When the signal φLAT6 is set to the high level, the NMOS transistor N134 is made conductive. In this instance, the NMOS transistors N133 and N132 are switched to the conductive state. Since the NMOS transistor N117 is conductive, the inversion node /Q0 of the latch circuit LQ0 is inverted to "0" and the node Q0 of the latch circuit LQ0 is inverted to "1".

Consequently, when the threshold voltage Vth. of the memory cell is larger than the word line voltage VRD7 (Vth>VRD7), the latch data of the latch circuits LQ2, LQ1, and LQ0 is inverted to "111".

When the threshold voltage Vth of the memory cell is smaller than the word line voltage VRD7 (Vth<VRD7), a cell current larger than the leak compensation current flows, the bit line voltage drops, the NMOS transistor HN101 is made conductive, and redistribution of charges occurs. The voltage of the node SA is set to (VTRN−Vth') that is almost equal to the bit line voltage. Thus, the NMOS transistors N115, N116, and N117 cannot be made conductive at all.

After the elapse of a predetermined time, the pulse-like signals φLAT0, φLAT2, and φLAT6 are sequentially set to the high level.

When the signal φLAT0 is set to the high level, the NMOS transistor N118 is made conductive. However, since the NMOS transistor N115 is not made conductive at all, the inversion of the node of the latch circuit LQ2 does not occur.

When the signal φLAT2 is set to the high level, the NMOS transistor N124 is made conductive. However, since the NMOS transistor N122 is non-conductive, the inversion of the node of the latch circuit LQ1 does not occur.

When the signal φLAT6 is set to the high level, the NMOS transistor N134 is made conductive. However, since the NMOS transistors N132 and N133 are non-conductive, the inversion of the node of the latch circuit LQ0 does not occur.

Subsequently, the word line voltage is set to VRD6 and the reading operation is performed. When the threshold voltage Vth of the memory cell is larger than the word line voltage VRD6 (Vth>VRD6) as a result of the reading at the word line voltage VRD6, since no cell current flows, the node SA is held at the power voltage Vcc. In this instance, the NMOS transistors N115, N116, and N117 are made conductive.

After the elapse of a predetermined time, the pulse-like signals φLAT0 and φLAT2 are sequentially set to the high level.

When the signal φLAT0 is set to the high level, the NMOS transistor N118 is made conductive. Since the NMOS transistor N115 is conductive, the inversion node /Q2 of the latch circuit LQ2 is set to "0", and the node Q2 of the latch circuit LQ2 is inverted to "1".

When the signal φLAT2 is set to the high level, the NMOS transistor N124 is made conductive. In this instance, the NMOS transistor N123 is conductive. The NMOS transistor N122 is switched to the conductive state. Since the NMOS transistor N116 is conductive, the inversion node /Q1 of the latch circuit LQ1 is set to "0" and the node Q1 of the latch circuit LQ1 is inverted to "1".

Consequently, when the threshold voltage Vth of the memory cell is larger than the word line voltage VRD6 (Vth>VRD6), the latch data of the latch circuits LQ2, LQ1, and LQ0 is inverted to "110".

When the threshold voltage Vth of the memory cell is smaller than the word line voltage VRD6 (Vth<VRD6), a cell current larger than the leak compensation current flows, the bit line voltage drops, the NMOS transistor HN101 is made conductive, and redistribution of charges occurs. The voltage of the node SA is set to (VTRN−Vth') that is almost equal to the bit line voltage. Thus, the NMOS transistors N115, N116, and N117 cannot be made conductive at all.

After the elapse of a predetermined time, the pulse-like signals φLAT0 and φLAT2 are sequentially set to the high level.

When the signal φLAT0 is set to the high level, the NMOS transistor N118 is made conductive. Since the NMOS transistor N115 is not made conductive at all, however, the inversion of the node of the latch circuit LQ2 does not occur.

When the signal φLAT2 is set to the high level, the NMOS transistor N124 is made conductive. However, since the inversion of the node of the latch circuit LQ2 does not occur, the NMOS transistor N122 is non-conductive. Therefore, the inversion of the node of the latch circuit LQ1 does not occur.

Subsequently, the word line voltage is set to VRD5 and the reading operation is performed. When the threshold voltage Vth of the memory cell is larger than the word line voltage VRD5 (Vth>VRD5) as a result of the reading at the word line voltage VRD5, since no cell current flows, the node SA is held at the power voltage Vcc. In this instance, the NMOS transistors N115, N116, and N117 are held conductive.

The following cases are considered with respect to the latch data.

(1) When Vth>VRD7: latch data is "111"
(2) When VRD7>Vth>VRD6: latch data is "110"
(3) When VRD6>Vth>VRD5: latch data is "000"

Only in the case of (3), it is necessary to construct such that the inversion of the nodes of the latch circuits LQ2 and LQ0 occurs and the read data becomes "101". At this time, it is necessary to construct such that no influence is exercised on the cases of (1) and (2).

After the elapse of a predetermined time, the pulse-like signals φLAT0 and φLAT7 are sequentially set to the high level.

When the signal φLAT0 is set to the high level, the NMOS transistor N118 is made conductive. Since the NMOS transistor N115 is conductive, the inversion node /Q2 of the latch circuit LQ2 is set to "0", and the node Q2 of the latch circuit LQ2 is inverted to "1".

In the cases of (1) and (2), since the node Q2 of the latch circuit LQ2 is inherently set to "1", there is no influence.

When the signal φLAT7 is set to the high level, the NMOS transistor N136 is made conductive. In this instance, in the case of (3), the NMOS transistor N135 is conductive and the NMOS transistor N132 is switched to the conductive state. Since the NMOS transistor N117 is conductive, the inversion node /Q0 of the latch circuit LQ0 is set to "0" and the node Q0 of the latch circuit LQ0 is inverted to "1".

At this time, in the cases of (1) and (2), since the NMOS transistor N135 is made non-conductive, the inversion of the node does not occur.

Thus, when the threshold voltage Vth of the memory cell is larger than the word line voltage VRD5 (Vth>VRD5), the latch data of the latch circuits LQ2, LQ1, and LQ0 is inverted to "101".

When the threshold voltage Vth of the memory cell is smaller than the word line voltage VRD5 (Vth<VRD5), a cell current larger than the leak compensation current flows, the bit line voltage drops, the NMOS transistor HN101 is made conductive, and redistribution of charges occurs. The voltage of the node SA is set to (VTRN−Vth) that is almost equal to the bit line voltage. Thus, the NMOS transistors N115, N116, and N117 are not made conductive at all.

After the elapse of a predetermined time, the pulse-like signals φLAT0 and φLAT7 are sequentially set to the high level.

When the signal φLAT0 is set to the high level, the NMOS transistor N118 is made conductive.

Since the NMOS transistor N115 is not made conductive at all, however, the inversion of the node of the latch circuit LQ2 does not occur.

When the signal φLAT7 is set to the high level, the NMOS transistor N136 is made conductive. However, since the inversion of the node of the latch circuit LQ2 does not occur, the NMOS transistor N132 is non-conductive. Therefore, the inversion of the node of the latch circuit LQ0 does not occur.

In a manner similar to the above, the following control is performed. In case of the word line voltage VRD4, it is controlled so that the latch data of the latch circuits LQ2, LQ1, and LQ0 is inverted to "100" only when VRD5>Vth>VRD4.

In case of the word line voltage VRD3, it is controlled so that the latch data of the latch circuits LQ2, LQ1, and LQ0 is inverted to "011" only when VRD4>Vth>VRD3.

In case of the word line voltage VRD2, it is controlled so that the latch data of the latch circuits LQ2, LQ1, and LQ0 is inverted to "010" only when VRD3>Vth>VRD2.

In case of the word line voltage VRD1, it is controlled so that the latch data of the latch circuits LQ2, LQ1, and LQ0 is inverted to "001" only when VRD2>Vth>VRD1.

As shown in the foregoing two examples, when the storing level is converted into the quartic value or octenary value, a problem such that the circuit for verifying and the circuit for reading out become complicated and the circuit scale enlarges occurs. Particularly, upon verification, it is necessary to sequentially change the word line voltage and perform the verification with respect to only the memory cell of predetermined write data. The circuit construction for this purpose becomes complicated.

That is, in the example of the quartic value mentioned above, at the time of the verification, the word line is switched to VVF3 to VVF1 three times and, when the data is sufficiently written into the memory cell, the latch data is inverted to "11". This means that when the conditions such that the threshold voltage Vth of the memory cell is equal to or higher than the voltage applied to the word line and the write data is target data upon verification are satisfied, the latch data is inverted to "11".

For example, it is now assumed that in the memory cell in which the write data is "00", the data is not sufficiently written in the memory cell and a distribution 2 (refer to FIG. 8A) is obtained. It is also assumed that the word line voltage is simply compared with the threshold voltage and the latch data is inverted. When the word line voltage is sequentially switched to VVF3 to VVF1, if the word line voltage is set to VVF2, the latch data of the memory cell is inverted to "11" and the data is sufficiently written. If the occurrence of such a phenomenon is avoided, the circuit construction becomes complicated as mentioned above.

In the example of the octenary value mentioned above, upon verification, the word line is switched to VVF7 to VVF1 seven times and if the data is sufficiently written into the cell, the latch data is inverted to "111". This means that when the conditions such that the threshold voltage Vth of the memory cell is equal to or higher than the voltage applied to the word line and the write data is the target data upon verification are satisfied, the latch data is inverted to "111".

For example, it is assumed that in the memory cell in which the write data is "000", the data is not sufficiently written in the memory cell and a distribution 4 (refer to FIG. 14) is obtained. It is also assumed that the word line voltage is simply compared with the threshold voltage and the latch data is inverted. When the word line voltage is sequentially switched to VVF7 to VVF1, if the word line voltage is set to VVF4, the latch data of the memory cell is inverted to "111" and the data is sufficiently written. If the occurrence of such a phenomenon is avoided, the circuit construction becomes complicated as mentioned above.

In the examples of the quartic value and octenary value mentioned above, upon reading, the word line voltage is sequentially changed to VRD3 to VRD1 in the example of the quartic value and the word line voltage is sequentially changed to VRD7 to VRD1 in the example of the octenary value. While discriminating whether the threshold voltage of the memory cell has exceeded a predetermined level, the read data is decoded. In this case, it is necessary to hold the data in the latch circuit so as to prevent a situation such that the data which has once been decoded and held in the latch circuit is rewritten when the word line voltage is switched. If such a process is realized, the circuit construction becomes complicated as mentioned above.

OBJECTS AND SUMMARY OF THE INVENTION

It is an object of the invention to provide a non-volatile semiconductor memory device which can prevent an increase in circuit scale even when multivalue data is recorded into a memory cell and provide a verifying method and a reading method of the non-volatile semiconductor memory device.

According to a main feature of the invention, there is provided a non-volatile semiconductor memory device which has memory cells in each of which an amount of charges accumulated in a charge accumulating unit changes in accordance with voltages applied to a word line and a bit line, a threshold voltage changes in accordance with the change in charge amount, and data of a value according to the threshold voltage is stored, and in which multivalue data of n bits is written into the memory cells, comprising:

n latch circuits in each of which write data is latched at the time of writing and, when the data is sufficiently written at the time of verification, it is set to predetermined data, and further, read data is set at the time of reading;

write control means for setting into a bit line voltage according to the data latched in the latch circuit at the time of writing;

verify control means for setting a word line voltage in accordance with a distribution state of the threshold voltage at the time of verification, specifying the latch circuit depending on whether the threshold voltage of the memory cell exceeds the voltage applied to the word line or not, and controlling so that when the data is sufficiently written at the time of the verification, predetermined data is set into the latch circuit; and read control means for setting the word line voltage in accordance with the distribution state of the threshold voltage at the time of reading, specifying the latch circuit depending on whether the threshold voltage of the memory cell exceeds the voltage applied to the word line or not, and controlling so that the read data is set into the latch circuit, wherein in the verifying operation, the verify control means sets the word line voltage to (2n−1) stages in accordance with the distribution state of the threshold voltage, controls so that the bit line is precharged or not in accordance with the data latched in the latch circuit, detects whether the threshold voltage of the memory cell exceeds the voltage applied to the word line or not on the basis of whether a current flows in the memory cell or not, and specifies the latch circuit in accordance with an output of the detection, thereby allowing the predetermined data to be set into the latch circuit when the data is sufficiently written at the time of the verification.

According to another aspect of the invention, the memory cell comprises a memory string connected to the bit line and a source line through a selection transistor in which conductive states of one end and the other end are controlled in accordance with a gate voltage.

According to another feature of the invention, the verify control means includes: means for controlling so as to supply a precharge current to the bit line only when the predetermined data excluding the least significant bit has been latched in the latch circuit; and means for controlling so that the state of the latch circuit is not inverted in accordance with the status of the least significant bit.

According to still another aspect of the invention, the verify control means includes: means for controlling so as to supply a precharge current to the bit line only when the predetermined data excluding the least significant bit has been latched in the latch circuit; and means for controlling so as to discharge the bit line in accordance with the status of the least significant bit.

According to another feature of the invention, the multi-value data of (n=2) bits is written into the memory cell.

According to another feature of the invention, the multi-value data of (n=3) bits is written into the memory cell.

According to aspect of the invention, there is provided a non-volatile semiconductor memory device which has memory cells in each of which an amount of charges accumulated in a charge accumulating unit changes in accordance with voltages applied to a word line and a bit line, a threshold voltage changes in accordance with the change in charge amount, and data of a value according to the threshold voltage is stored, and in which multivalue data of n bits is written into the memory cells, comprising:

n latch circuits in each of which write data is latched at the time of writing and, when the data is sufficiently written at the time of verification, it is set to predetermined data, and further, read data is set at the time of reading;

write control means for setting into a bit line voltage according to the data latched in the latch circuit at the time of writing;

verify control means for setting a word line voltage in accordance with a distribution state of the threshold voltage at the time of verification, specifying the latch circuit depending on whether the threshold voltage of the memory cell exceeds the voltage applied to the word line or not, and controlling so that when the data is sufficiently written at the time of the verification, predetermined data is set into the latch circuit; and read control means for setting the word line voltage in accordance with the distribution state of the threshold voltage at the time of reading, specifying the latch circuit depending on whether the threshold voltage of the memory cell exceeds the voltage applied to the word line or not, and controlling so that the read data is set into the latch circuit, wherein at the time of reading, the read control means sets the word line voltage to a plurality of stages in accordance with the distribution state of the threshold voltage, precharges the bit line only when an inversion of a node of the latch circuit had not occurred until the previous time, detects whether the threshold voltage of the memory cell exceeds the voltage applied to the word line or not on the basis of whether a current flows in the memory cell or not, and specifies the latch circuit in accordance with an output of the detection, thereby allowing the read data to be set into the latch circuit at the time of the reading.

According to another aspect of the invention, the memory cell comprises a memory string connected to the bit line and a source line through a selection transistor in which conductive states of one end and the other end are controlled in accordance with a gate voltage.

According to another feature of the invention, the multi-value data of (n=2) bits is written into the memory cell.

According to another feature of the invention, the multi-value data of (n=3) bits is written into the memory cell.

According to yet another aspect of the invention, there is provided a verifying method of a non-volatile semiconductor memory device which has memory cells in each of which an amount of charges accumulated in a charge accumulating unit changes in accordance with voltages applied to a word line and a bit line, a threshold voltage changes in accordance with the change in charge amount, and data of a value according to the threshold voltage is stored, and in which multivalue data of n bits is written into the memory cells, comprising the steps of:

setting a word line voltage to a plurality of stages in-accordance with a distribution state of the threshold voltage;

controlling so that the bit line is precharged or not in accordance with data latched in a latch circuit;

detecting whether the threshold voltage of the memory cell exceeds the voltage applied to the word line or not on the basis of whether a current flows in the memory cell or not; and specifying the latch circuit in accordance with an output of the detection, thereby allowing predetermined data to be set into the latch circuit when the data is sufficiently written at the time of the verification.

According to another feature of the invention, there is provided a reading method of a non-volatile semiconductor memory device which has memory cells in each of which an amount of charges accumulated in a charge accumulating unit changes in accordance with voltages applied to a word line and a bit line, a threshold voltage changes in accordance with the change in charge amount, and data of a value according to the threshold voltage is stored, and in which multivalue data of n bits is written into the memory cells, comprising the steps of:

setting a word line voltage to a plurailty of stages in accordance with a distribution state of the threshold voltage;

precharging the bit line only when an inversion of a node of the latch circuit had not occurred until the previous time;

detecting whether the threshold voltage of the memory cell exceeds the voltage applied to the word line or not on the basis of whether a current flows in the memory cell or not; and specifying the latch circuit in accordance with an output of the detection, thereby allowing read data to be set into the latch circuit at the time of reading.

In the verifying operation, the word line voltage is sequentially switched to a plurality of stages in accordance with a distribution state of the threshold voltage, and whether the bit line is precharged or not is controlled in accordance with the latched data.

That is, if the storing level is set to the quartic value, when the word line voltage is set to VVF3, a voltage of Vcc is applied to only a voltage VB0 and voltages VB1 and VB2 are held at the ground level. Therefore, only when the write data latched in the latch circuit is "00", (NMOS transistors n3 and n4 are made conductive), the bit line is precharged, and in case of the other data, the bit line is not precharged.

Similarly, when the word line voltage is set to VVF2, the voltage of Vcc is applied to only the voltage VB1 and the voltages VB0 and VB2 are held at the ground level. Only when the write data latched in the latch circuit is "01", the bit line is precharged. In case of the other data, the bit line is not precharged. When the word line voltage is set to VVF1, the voltage of Vcc is applied to only the voltage VB2 and the voltages VB0 and VB1 are held at the ground level. Only when the write data latched in the latch circuit is "10", the bit line is precharged. In the other data, the bit line is not precharged.

If the storing level is set to the octenary value, when the word line voltage is set to VVF7 and VVF6, the voltage of Vcc is applied to only the voltage VB0 and the voltages VB1, VB2, and VB3 are held at the ground level. Therefore, only when the write data latched in the latch circuit is "00x", (NMOS transistors N3 and N4 are made conductive), the bit line is precharged, and in case of the other data, the bit line is not precharged.

Similarly, when the word line voltage is set to VVF5 and VVF4, the voltage of Vcc is applied to only the voltage VB1 and the voltages VB0, VB2, and VB3 are held at the ground level. Only when the write data latched in the latch circuit is "01x", the bit line is precharged. In case of the other data, the bit line is not precharged. When the word line voltage is set to VVF3 and VVF2, the voltage of Vcc is applied to only the voltage VB2 and the voltages VB0, VB1, and VB3 are held at the ground level. Only when the write data latched in the latch circuit is "10x", the bit line is precharged. In case of the other data, the bit line is not precharged. When the word line voltage is set to VVF1, the voltage of Vcc is applied to only the voltage VB3 and the voltages VB0, VB1, and VB2 are held at the ground level. Only when the write data latched in the latch circuit is "110", the bit line is precharged. In case of the other data, the bit line is not precharged.

As mentioned above, by controlling whether the bit line is precharged or not in accordance with the latched data, the construction of the circuit at the time of verification is simplified.

As mentioned above, when the verification is performed, if the storing level is the octenary value, as for the least significant bit, a status of the node of the least significant bit is supplied to gates of the NMOS transistors N19 and N23 and a status of the inversion node is supplied to NMOS transistors N21 and N25, thereby controlling whether the latch circuits LQ2 and LQ1 are set or not set in accordance with the status of the latch circuit of the least significant bit.

Further, when the verification is performed as mentioned above, if the storing level is the octenary value, as for the least significant bit which is latched into the latch circuit LQ0, the discharge of the bit line is controlled by the NMOS transistors N72 and N73 in accordance with the status of the least significant bit.

At the time of reading in which the storing level is set to the quartic value, it is controlled so as to precharge the bit line only when there is no inversion of the node of the latch circuit so far and, if the inversion of the node of the latch circuit had occurred until the previous time, it is prevented that the precharge current flows in the bit line. That is, at the time of reading, only the voltage VB0 is set to Vcc and the voltages VB1 and VB2 are held at the ground level. Only when the inversion of the latch circuit does not occur by the reading operation so far, the NMOS transistors n4 and n3 are made conductive, the bit line is precharged by the voltage VB0, the data is read out, and the read data is set into the latch circuit. When the inversion of the latch circuit occurs due to the reading so far, the bit line is not precharged and the data so far is held.

At the time of reading in which the storing level is set to the octenary value, it is controlled so as to precharge the bit line only when there is no inversion of the node of the latch circuit so far and, if the inversion of the node of the latch circuit had occurred until the previous time, it is prevented that the precharge current flows in the bit line. That is, at the time of reading, only the voltage VB0 is set to Vcc and the voltages VB1, VB2, and VB3 are held at the ground level. Only when the inversion of the latch circuit does not occur by the reading operation so far, the NMOS transistors N4 and N3 are made conductive, the bit line is precharged by the voltage VB0, the data is read out, and the read data is set into the latch circuit. When the inversion of the latch circuit occurs due to the reading so far, the bit line is not precharged and the data so far is held.

With the above construction, since a circuit to protect the data which has once been set in the latch circuit is unnecessary, the circuit scale upon reading is remarkably reduced.

The above and other objects and features of the present invention will become apparent from the following detailed description and the appended claims with reference to the accompanying drawings.

BRIEF DESCRIPTION OF THE DRAWINGS

FIG. 5 is a timing chart for use in explanation upon verification in the conventional non-volatile semiconductor memory device of the octenary recording;

FIGS. 17A and 17B are schematic diagrams for use in explanation of a voltage which is applied to a voltage supply terminal;

DETAILED DESCRIPTION OF THE PREFERRED EMBODIMENTS

Embodiments of the invention will now be described in the following order with reference to the drawings.

Figure 1:
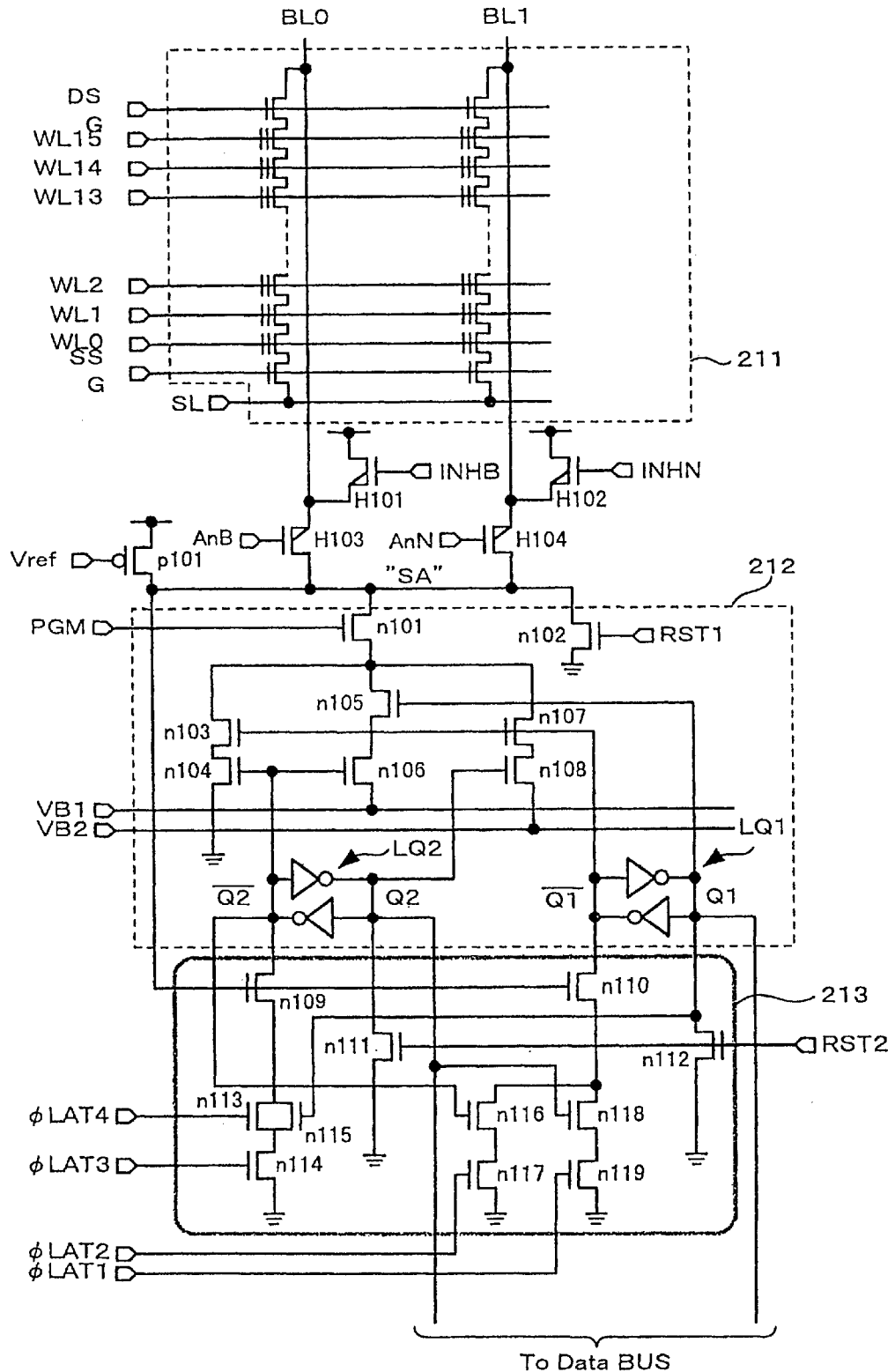
FIG. 1 is a circuit diagram of an example of a conventional non-volatile semiconductor memory device of the quartic recording.
Figure 2:
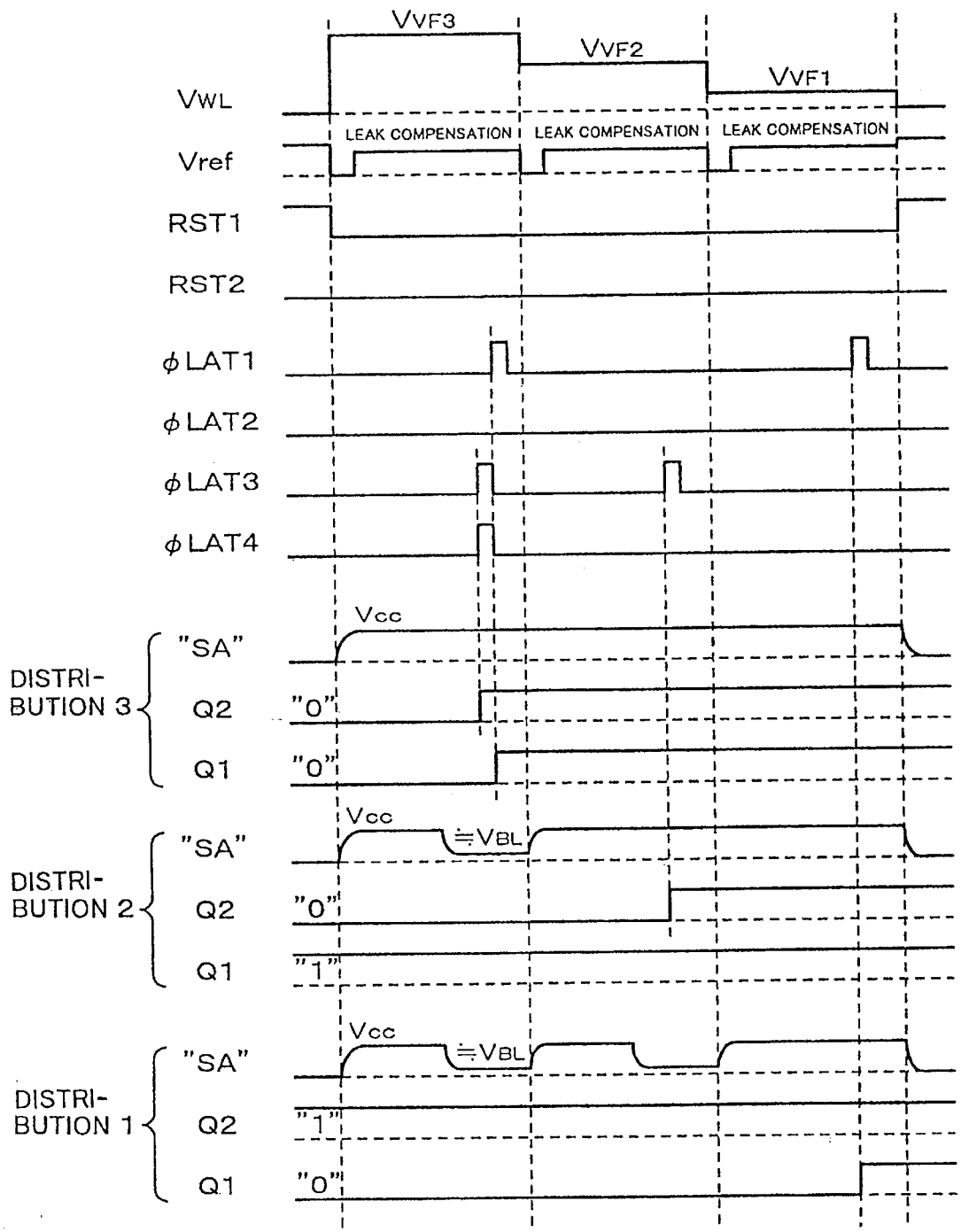
FIG. 2 is a timing chart for use in explanation upon verification in the conventional non-volatile semiconductor memory device of the quartic recording.
Figure 3:
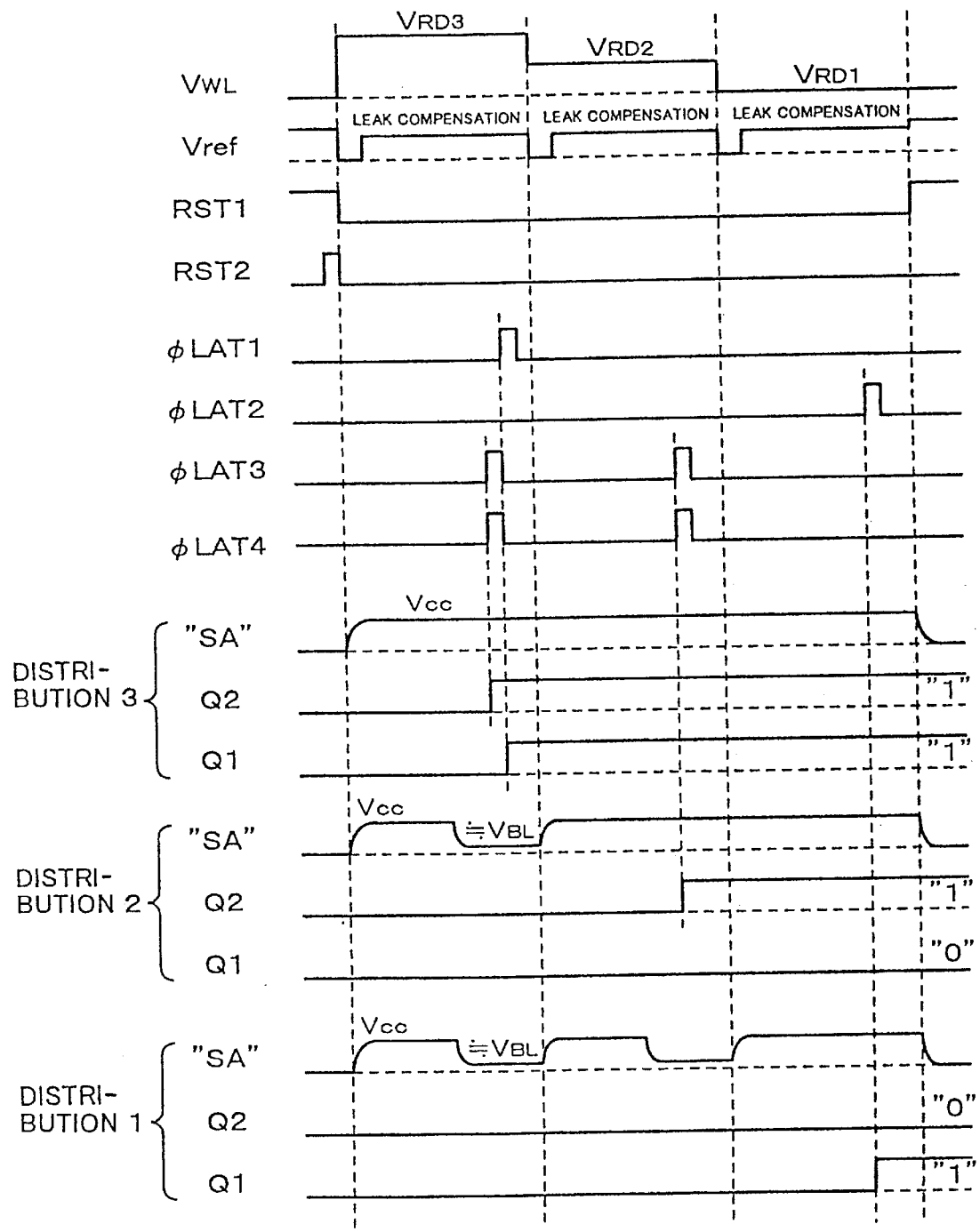
FIG. 3 is a timing chart for use in explanation upon reading in the conventional non-volatile semiconductor memory device of the quartic recording.
Figure 4:
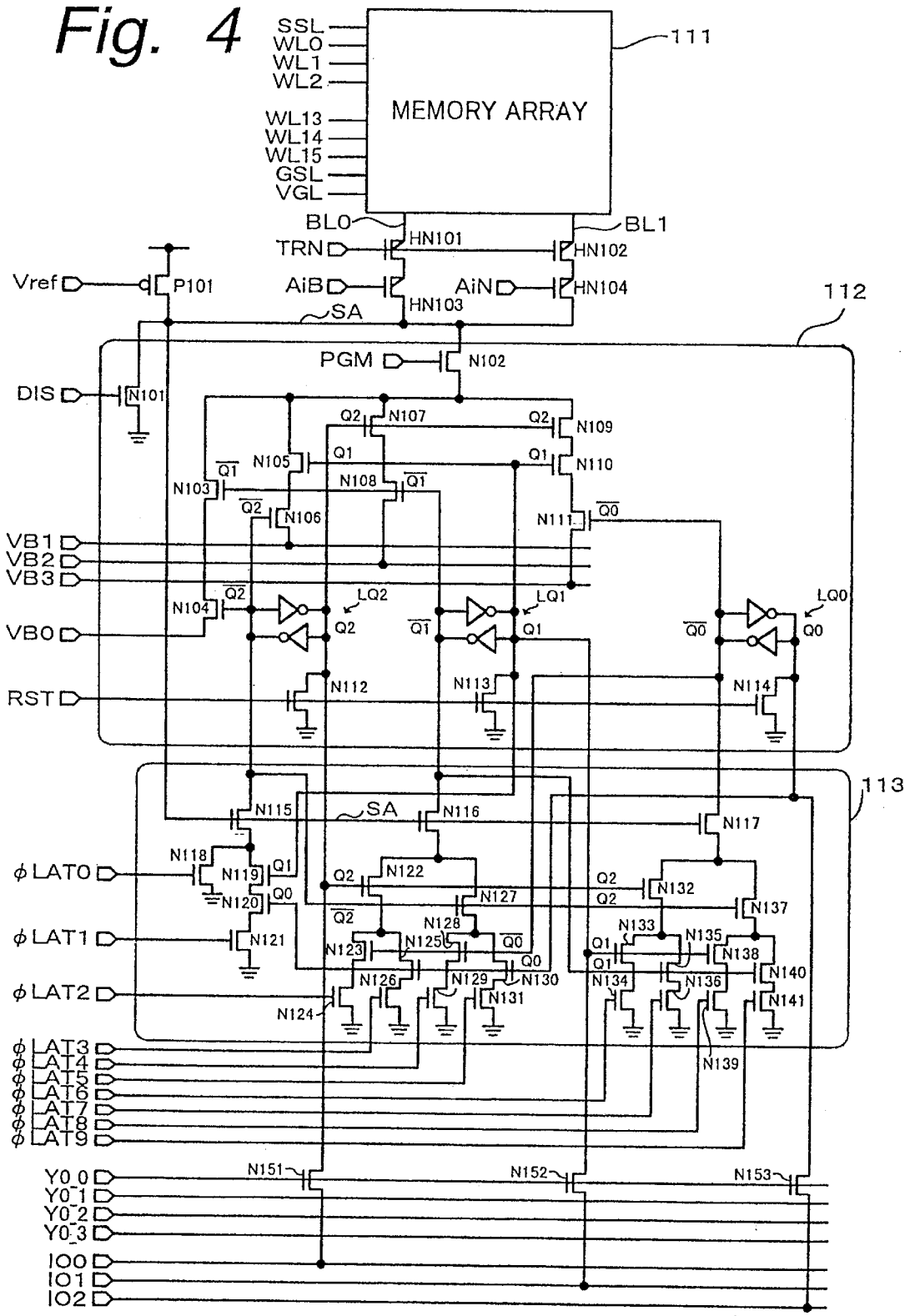
FIG. 4 is a circuit diagram of an example of a conventional non-volatile semiconductor memory device of the octenary recording.
Figure 6A:
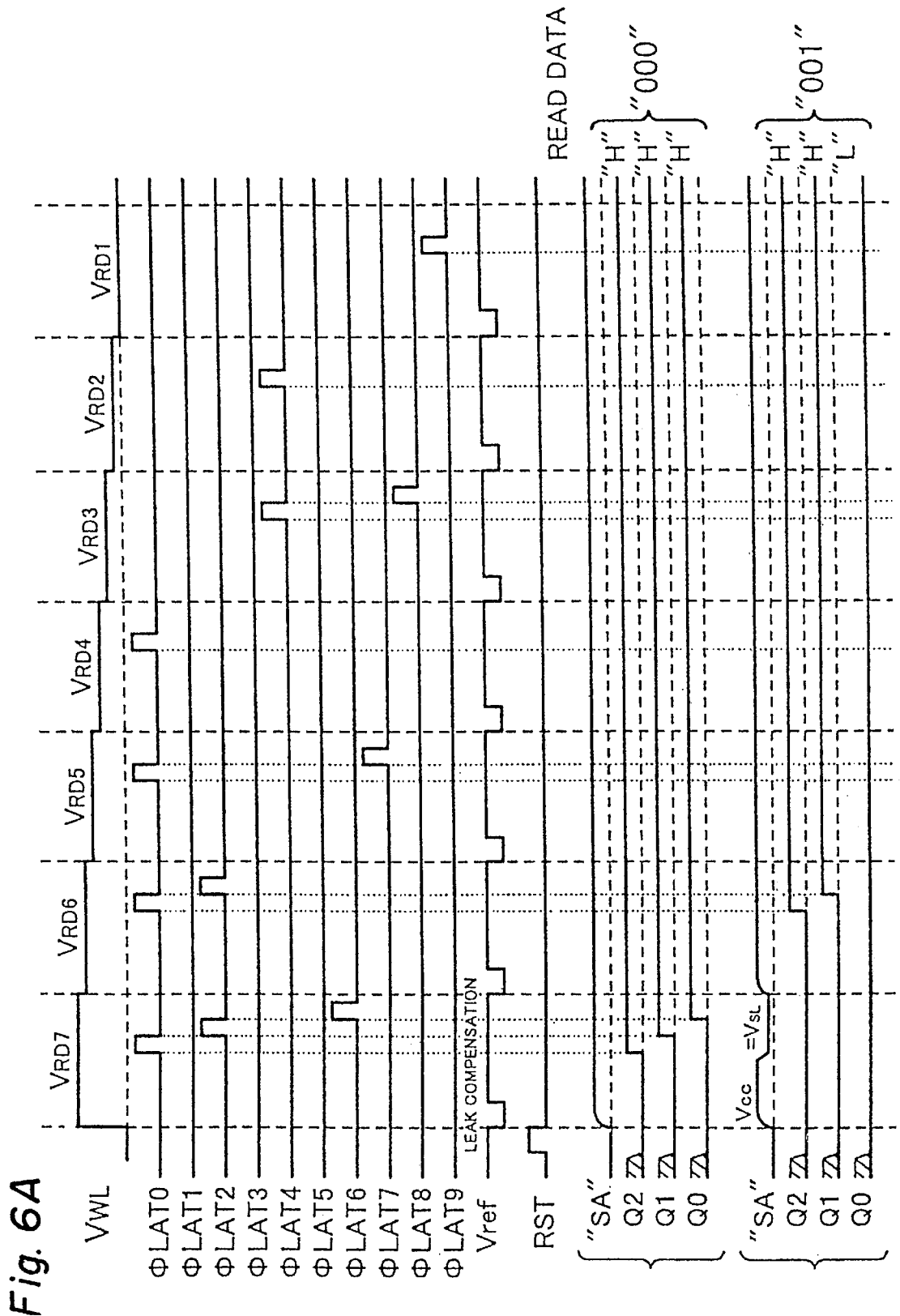
FIG. 6 is a timing chart for use in explanation upon reading in the conventional non-volatile semiconductor memory device of the octenary recording.
Figure 7:
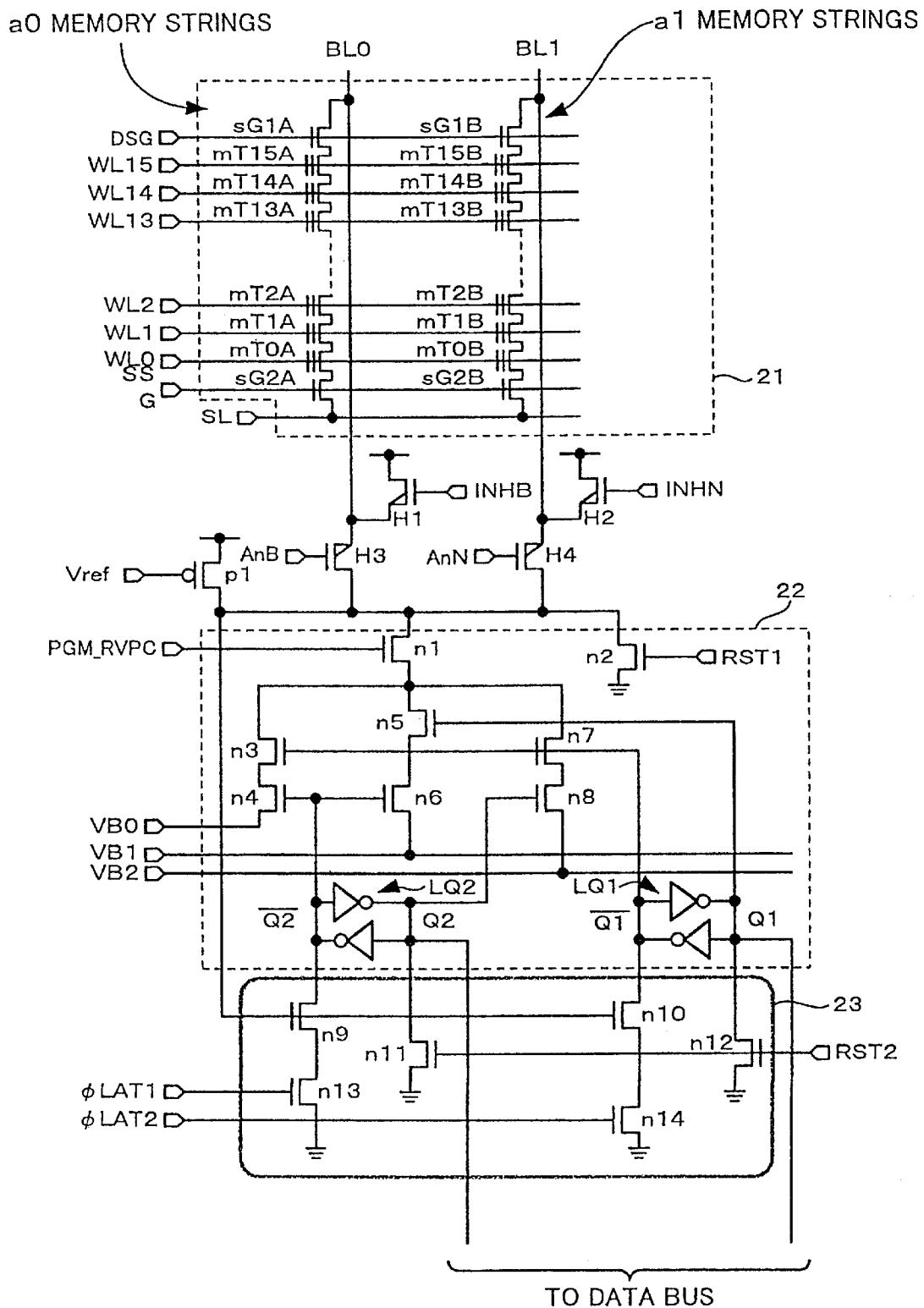
FIG. 7 is a circuit diagram showing the first embodiment of the invention.

1. First Embodiment
1-1. Whole Construction of the First Embodiment
1-2. Operation Upon Writing in the First Embodiment 1-3. Operation Upon Verification Reading in the First Embodiment
1-4. Operation Upon Reading in the First Embodiment 2. Second Embodiment
2-1. Whole Construction of the Second Embodiment
2-2. Operation upon Writing in the Second Embodiment
2-3. Operation Upon Verification Reading in the Second Embodiment
2-4. Operation Upon Reading in the Second Embodiment 3. Third Embodiment
3-1. Whole Construction of the Third Embodiment
3-2. Operation Upon Writing in the Third Embodiment
3-3. Operation Upon Verification Reading in the Third Embodiment
3-4. Operation Upon Reading in the Third Embodiment 4. Modification 1. First Embodiment FIG. 7 shows the first embodiment of a non-volatile semiconductor memory device according to the invention. In the non-volatile semiconductor memory device according to the invention, a storing multivalue level corresponds to the quartic value.

1-1. Whole Construction of the First Embodiment

As shown in FIG. 7, the non-volatile semiconductor memory device to which the invention is applied is constructed by a memory array 21; a bit line voltage generating circuit 22; and a read/verify control circuit 23.

As shown in FIG. 7, the memory array 21 has a construction such that memory strings a0, a1, . . . in which memory cells are connected to common word lines WL0 to WL15 are arranged in a matrix form. A page is constructed by the memory cells connected to the same word lines WL0 to WL15.

The memory strings a0 and a1 are constructed by NAND strings in which memory cell transistors mT0A to mT15A and mT0B to mT15B comprising non-volatile semiconductor memory devices having floating gates are serially connected. Drains of the memory cell transistors mT15A and mT15B of the NAND strings are connected to the bit lines BL0 and BL1 through selection gates sG1A and sG1B, respectively. Sources of the memory cell transistors mT0A and mT0B are connected to a reference potential line SL through selection gates sG2A and sG2B, respectively. Gates of the selection gates sG1A and sG1B are connected in common to a selection signal supply line DSG. Gates of the selection gates sG2A and sG2B are connected in common to a selection signal supply line SSG. Control gates of the memory cells of the same row are connected to the common word lines WL0, WL1, . . . .

Upon writing, for example, the voltage of 20V is applied to the word line of the selected memory cell and the quartic multivalue data is written into the memory cell on a page unit basis. At this time, the selection gates sG1A and sG1B are made conductive, a passing voltage is applied to the word line of the memory cells other than the selected memory cell, and the selection gates sG2A and sG2B are made non-conductive.

Figure 8:
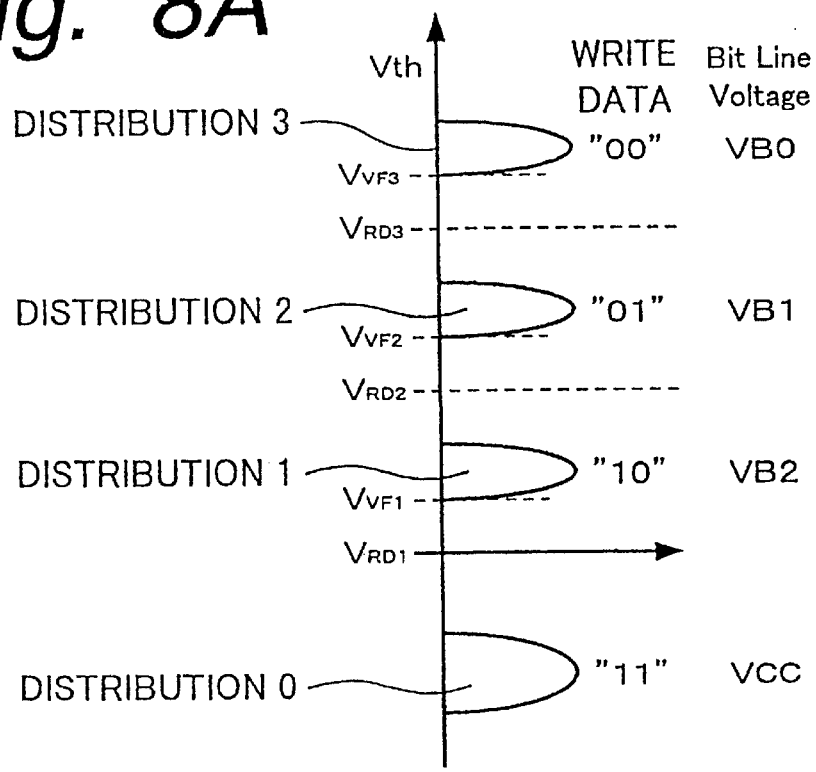
FIGS. 8A, 8B, and 8C are schematic diagrams for use in explanation of the operation of the first embodiment of the invention.

A quartic data recording as shown in FIG. 8A is performed to the memory cell transistor. As shown in FIG. 8A, upon writing, the data is written into each memory cell so that the threshold voltage of the memory cell lies within distributions "3" to "0" in accordance with four values of the write data "00" to "11", respectively.

In this instance, the verifying operation is performed by the verifying voltages VVF3 to VVF1 and the threshold voltages of the memory cells are controlled so that they lie within distributions "3" to "0" corresponding to each data, respectively. Upon reading, the threshold voltages of the memory cells are detected and read out by the reading voltages VRD3 to VRD1.

At the time of verification and reading, the verifying voltages VVF3 to VVF1 and reading voltages VRD3 to VRD1 are applied to the word line of the selected memory cell. The other memory cells are made conductive. The selection gates sG1A and sG1B and selection gates sG2A and sG2B are made conductive. At this time, whether the threshold voltage of the memory cell exceeds the verifying voltages VVF3 to VVF1 and reading voltages VRD3 to VRD1 or not is discriminated on the basis of whether a current flows in the memory cell or not. The verification and the reading are executed.

In FIG. 7, the bit line voltage generating circuit 22 is constructed by the latch circuits LQ2 and LQ1 in which all inputs of NMOS transistors n1 to n8 and inverters are coupled and all outputs of them are coupled. The supply lines of the voltages VB0, VB1, and VB2 are led out from the bit line voltage generating circuit 22.

Upon writing, a bit line voltage according to the write data is generated by the bit line voltage generating circuit 22 and supplied to the memory cell of the memory array 21. Upon verification, storing nodes Q2 and Q1 of the latch circuits LQ2 and LQ1 of the bit line voltage generating circuit 22 are set to "11" when the data is sufficiently written into the memory cell of the memory array 21. Upon reading, the threshold voltage of the memory cell of the memory array 21 is detected and the data is read out. At this time, the read data is stored into the storing nodes Q2 and Q1 of the latch circuits LQ1 and LQ2.

The read/verify control circuit 23 is constructed by NMOS transistors n9 to n14. Upon reading or verification, the read/verify control circuit 23 controls states of the latch circuits LQ2 and LQ1. Supply lines of the signals φLAT1 and φLAT2 are led out from the read/verify control circuit 23 and pulse-like signals are supplied. Gate electrodes of the NMOS transistors n9 and n10 of the read/verify control circuit 23 are connected to the node SA. The node SA becomes a node to detect the threshold voltage of the memory cell of the memory array 21. That is, as will be explained hereinlater, when the threshold voltage of the memory cell is larger than the word line voltage, no current flows in the cell, so that the node SA is held at the power voltage Vcc (for example, 3.3V). When the threshold voltage of the memory cell is smaller than the word line voltage, the node SA drops to the voltage that is almost equal to the bit line voltage. By the node SA, the NMOS transistors n9 and n10 are controlled and the operation of the read/verify control circuit 23 is set.

An NMOS transistor H3 of a high withstanding voltage is connected between the node SA and the bit line BL0. An NMOS transistor H4 of a high withstanding voltage is connected between the node SA and the bit line BL1. The address decoding signal AnB is supplied to a gate electrode of the NMOS transistor H3. The address decoding signal AnN is supplied to a gate electrode of the NMOS transistor H4. An NMOS transistor H1 of a high withstanding voltage is connected between the supply line of the power voltage Vcc and the bit line BL0. An NMOS transistor H2 of a high withstanding voltage is connected between the supply line of the power voltage Vcc and the bit line BL1. The control signal INHB is supplied to a gate electrode of the NMOS transistor H1. The control signal INHN is supplied to a gate electrode of the NMOS transistor H2.

The NMOS transistor n2 is connected between the node SA and the ground line (GND). A PMOS transistor p1 is connected between the node SA and the supply line of the power voltage Vcc. The reset signal RST1 is supplied to a gate electrode of the NMOS transistor n2. The signal Vref is supplied to a gate electrode of the PMOS transistor p1.

The NMOS transistor n1 is provided between the node SA and the bit line voltage generating circuit 22. That is, a drain of the NMOS transistor n1 is connected to the node SA. A source of the NMOS transistor n1 is connected to drains of the NMOS transistors n3, n5, and n7. A control signal PGM_RVPC is supplied to a gate electrode of the NMOS transistor n1.

The NMOS transistors n3 and n4 are serially connected between the source of the NMOS transistor n1 and the supply line of the voltage VB0. The NMOS transistors n5 and n6 are serially connected between the source of the NMOS transistor n1 and the supply line of the voltage VB1. The NMOS transistors n7 and n8 are serially connected between the source of the NMOS transistor n1 and the supply line of the voltage VB2.

The latch circuits LQ2 and LQ1 have the storing nodes Q2 and Q1 and their inversion storing nodes /Q2 and /Q1, respectively. "/" denotes a bar indicative of the inversion.

The inversion storing node /Q2 of the latch circuit LQ2 is connected to gate electrodes of the NMOS transistors n4 and n6. The storing node Q2 of the latch circuit LQ2 is connected to a gate electrode of the NMOS transistor n8.

The inversion storing node /Q1 of the latch circuit LQ1 is connected to gate electrodes of the NMOS transistors n3 and n7. The storing node Q1 of the latch circuit LQ1 is connected to a gate electrode of the NMOS transistor n5.

The NMOS transistors n11 and n12 are connected between the storing node Q2 of the latch circuit LQ2 and the ground line and between the storing node Q1 of the latch circuit LQ1 and the ground line, respectively. Gate electrodes of the NMOS transistors n11 and n12 are connected to the supply line of the reset signal RST2.

In the read/verify control circuit 23, the gate electrodes of the NMOS transistors n9 and n10 are connected to the node SA. A drain of the NMOS transistor n9 is connected to the inversion storing node /Q2 of the latch circuit LQ2. A drain of the NMOS transistor n10 is connected to the inversion storing node /Q1 of the latch circuit LQ1.

The NMOS transistor n13 is connected between a source of the NMOS transistor n9 and the ground line. The NMOS transistor n14 is connected between a source of the NMOS transistor n10 and the ground line.

The supply lines of the signals ϕLAT1 and ϕLAT2 are led out from the read/verify control circuit 23. A gate electrode of the NMOS transistor n13 is connected to the supply line of the signal ϕLAT1. A gate electrode of the NMOS transistor n14 is connected to the supply line of the signal ϕLAT2.

The storing node Q2 of the latch circuit LQ2 is connected to a data bus line through a predetermined transistor although not shown. The storing node Q1 of the latch circuit LQ1 is connected to the data bus line through a predetermined transistor although not shown.

1-2. Operation Upon Writing in the First Embodiment

Figure 9:
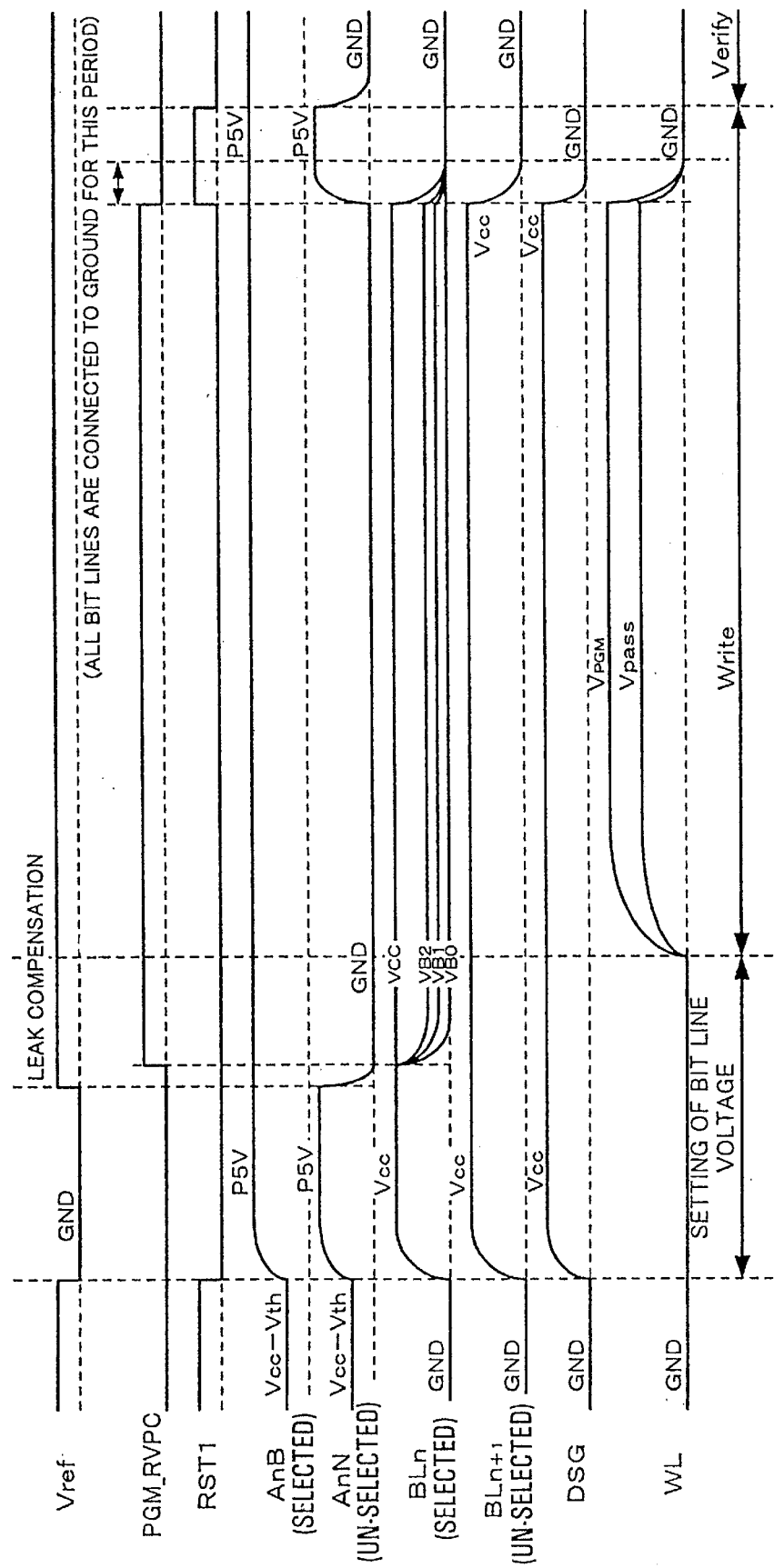
FIG. 9 is a timing chart for use in explanation upon writing in the first embodiment of the invention.

The writing operation of the first embodiment of the invention will now be described with reference to a timing chart of FIG. 9. In the standby mode, the signal PGM_RVPC is set to the low level, the NMOS transistor n1 is held non-conductive, and the bit lines BL0 and BL1 (shown as BLn and BLn+1 in FIG. 9) are disconnected from the bit line voltage generating circuit 22.

The signal RST1 is set to the high level, the signals AnB and AnN are set to (Vcc−Vth), and the bit lines BL0 and BL1 are set to the ground level. In this instance, each of the signals INHB and INHN is set to the low level.

When the writing operation is activated in this state, the write data is fetched and held into the latch circuits LQ2 and LQ1 through a predetermined transistor.

After that, the signal RST1 is switched to the low level and the bit lines BL0 and BL1 are disconnected from the ground line. The signals AnB and AnN are set to the high level (for example, passing voltage upon reading) that is equal to or higher than Vcc. The signal Vref is set to the low level and the PMOS transistor p1 is held conductive. Thus, all of the bit lines BL0 and BL1 are charged to the power voltage Vcc.

In this instance, the signals ϕLAT1 and ϕLAT2 to control the reading/verifying operations are set to the ground level so as not to exercise an influence on the latch data. The selection signal supply line DSG connected to the gate electrode of the selection gate on the drain side of the memory cell is set to the power voltage Vcc.

Upon writing, the signal Vref is set to the high level, the precharging operation is stopped, the address on the side which is not selected by the address signal, for example, AnN is set to the ground level, the signal INHN is set to the high level, and the signal PGM_RVPC is set to the high level. The voltages are set so as to have a relation of (VB2>VB1>VB0=0) in a manner such that the voltage VB2 is set to the highest voltage, the voltage VB1 is set to the second highest voltage, and the voltage VB0 is set to the ground level.

When the write data is "00", the inversion nodes /Q2 and /Q1 of the latch circuits LQ2 and LQ1 are at the high level. Thus, the NMOS transistors n3 and n4 are made conductive and the bit line BL0 is set to the voltage VB0 and set to the ground level.

When the write data is "01", the NMOS transistors n5 and n6 are made conductive and the bit line BL0 is set to the voltage VB1.

When the write data is "10", the NMOS transistors n7 and n8 are made conductive and the bit line BL0 is set to the voltage VB2.

When the write data is "11", since any of the paths from the voltages VB0 to VB2 is disconnected from the bit line BL0, the voltage of the bit line BL0 is held at the Vcc level.

By the above processes, after the selection bit line BL0 was set to the voltage according to the write data, the selected word line WL is set to a writing voltage VPGM, the non-selection word line is set to a write passing voltage VPASS, and the data is written.

As mentioned above, in the embodiment of the invention, the bit line voltage is changed in accordance with the recording data. As mentioned above, by setting the bit line voltage in accordance with the recording data, the electric field that is applied to the cell can be set in accordance with the write data and the recording time can be reduced.

1-3. Operation Upon Verification Reading in the First Embodiment

The verifying and reading operations in the first embodiment of the invention will now be described with reference to a timing chart of FIG. 10. In the verifying and reading operations, the write checks of "00", "01", and "10" are performed.

The verifying and reading operations are performed by sequentially reducing the word line voltage to VVF3→VVF2→VVF1 (refer to FIG. 8A). Upon verifying and reading, the voltage sources VB0 to VB2 are set as shown in FIG. 8B in accordance with the word line voltage.

That is, for a period of time during which the word line voltage is set to VVF3, the voltage VB0 is set to the power voltage Vcc and the other voltages VB1 and VB2 are set to the ground level (GND).

For a period of time during which the word line voltage is set to VVF2, the voltage VB1 is set to the power voltage Vcc and the other voltages VB0 and VB2 are set to the ground level (GND).

For a period of time during which the word line voltage is set to VVF1, the voltage VB2 is set to the power voltage Vcc and the other voltages VB0 and VB1 are set to the ground level (GND).

Prior to verification, for a predetermined period of time, the reset signal RST1 is set to the high level and AnB and AnN are set to P5V (voltage in a range from 5 to 6 V), and all of the bit lines BL0 and BL1 are set to the ground level.

Subsequently, the reset signal RST1 is reset to the low level and, after that, the side that is not selected by address "An", for example, the signal AnN is set to the ground level and the bit line BL1 is disconnected from the latch circuit of the bit line voltage generating circuit 22. To clamp the bit line, the control signal AnB is set to VAnB (VAnB=Vcc−Vth). The control signal Vref is set to the voltage enough to supply a leak compensation current (<<1 $\mu$A) of the bit line.

First, the case where the word line voltage is set to VVF3 will be described. While the word line voltage is set to VVF3, only the voltage VB0 is set to the power voltage Vcc and the other voltages VB1 and VB2 are set to the ground level. For a predetermined period of time, the control signal PGM_RVPC is set to the power voltage Vcc level at a timing shown in FIG. 10 and the NMOS transistor n1 is made conductive.

When the NMOS transistors n3 and n4 are conductive, the bit line is charged to (VAnB−Vth') by the power source Vcc from the voltage VB0. After the charging, by cutting off the NMOS transistor H3, the node SA is charged to Vcc by the leak compensation current by the PMOS transistor p1. When the NMOS transistors n3 and n4 are non-conductive, the bit line is not charged but held at the ground level. Since the other voltages VB1 and VB2 are at the ground level, the charging operation by the path other than the path from the voltage VB0 is not performed.

As mentioned above, when the word line voltage is set to VVF3 and the verification is performed, only when the NMOS transistors n3 and n4 are conductive, the bit line is charged. The NMOS transistors n3 and n4 are conductive only when the inversion node /Q2 of the latch circuit LQ2 is at the high level and the inversion node /Q1 of the latch circuit LQ1 is at the high level, and they are made conductive when the write data is "00".

Consequently, only when the write data is "00", the bit line is charged. In case of the other write data, the node SA is set to the ground level and the data is out of the target of the verification.

In this state, the control signal PGM_RVPC is reset to the ground level and the selection bit line BL0 is disconnected from the bit line voltage generating circuit 22.

When the threshold voltage Vth of the memory cell is larger than the word line voltage VVF3 (Vth>VVF3), since no current flows in the cell, the bit line voltage does not change and the node SA is held at the power voltage Vcc. At this time, obviously, the gate electrodes of the NMOS transistors n9 and n10 are at the Vcc level.

When the threshold voltage Vth of the memory cell is smaller than the word line voltage VVF3 (Vth<VVF3), the cell current larger than the leak compensation current flows, the bit line voltage drops, the NMOS transistor H3 is turned on, and redistribution of charges occurs. The electric potential of the node SA is almost equal to the bit line voltage (VAnB−Vth'). In this instance, the NMOS transistors n9 and n10 cannot be made conductive at all.

Figure 10:
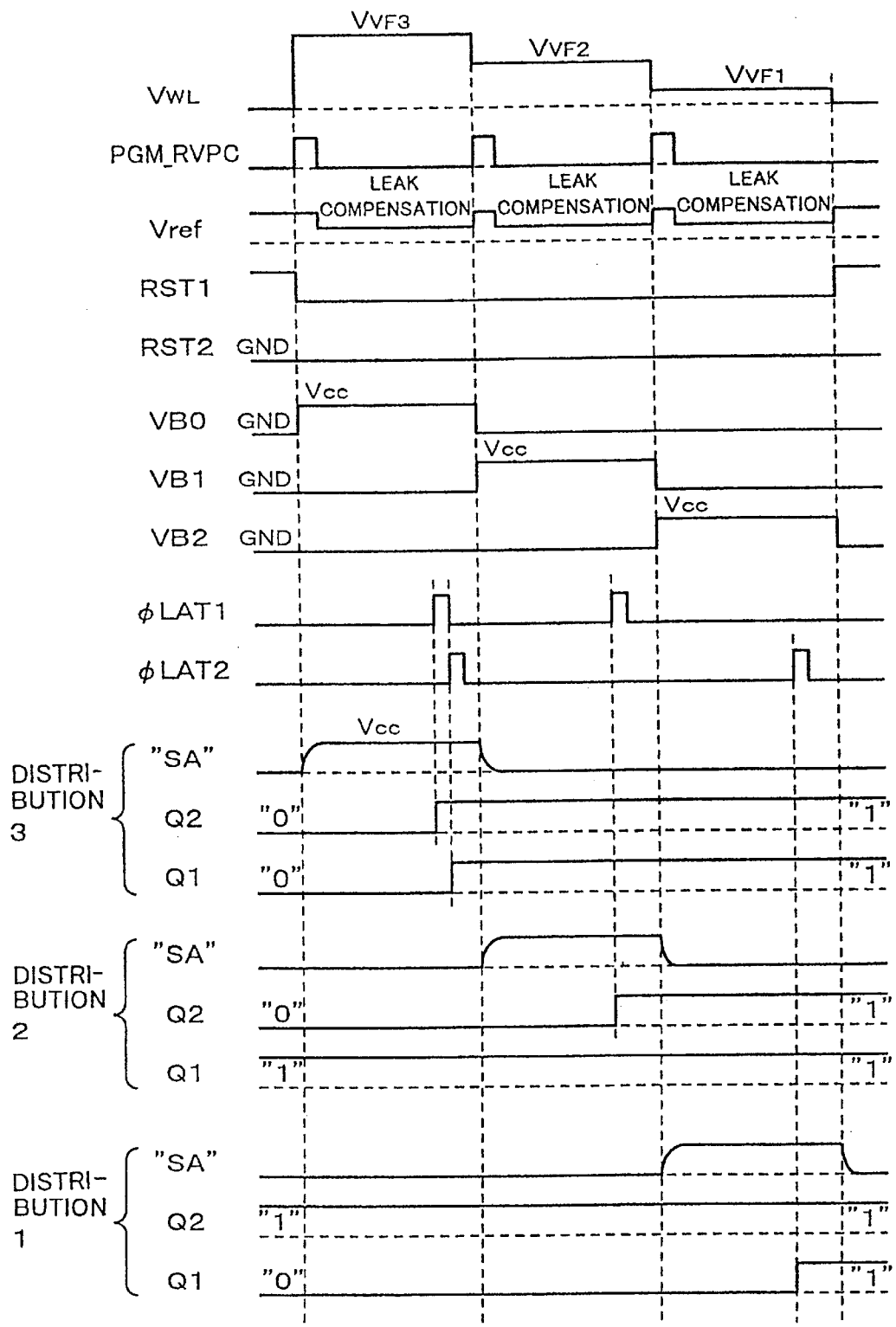
FIG. 10 is a timing chart for use in explanation upon verification in the first embodiment of the invention.

After the elapse of a predetermined time, the pulse-like signals $\phi$LAT1 and $\phi$LAT2 are set to the high level at the timings shown in FIG. 10. when the threshold voltage Vth of the memory cell in which the write data is "00" exceeds the word line voltage VVF3 (Vth>VVF3), the NMOS transistor n13 is switched to the conductive state for a period of time during which the signal $\phi$LAT1 is at the high level. In this instance, since the gate electrode of the NMOS transistor n9 is at the Vcc level, the NMOS transistor n9 is also made conductive. The inversion node /Q2 of the latch circuit LQ2 is set to the low level and the node Q2 of the latch circuit LQ2 is inverted to the high level.

For a period of time during which the signal $\phi$LAT2 is at the high level, the NMOS transistor n14 is switched to the conductive state. In this instance, since the gate electrode of the NMOS transistor n10 is at the Vcc level, the NMOS transistor n10 is also made conductive. The inversion node /Q1 of the latch circuit LQ1 is set to the low level and the node Q1 of the latch circuit LQ1 is inverted to the high level.

As mentioned above, when the word line voltage is set to VVF3, if the threshold voltage Vth of the memory cell in which the write data is "00" is larger than the word line voltage VVF3 (Vth>VVF3), the latch data of the latch circuits LQ2 and LQ1 is inverted to "11" and, after that, upon rewriting, the bit line is set to the power voltage Vcc, the channel is boosted to the non-writing potential, and no data is written.

When the threshold voltage Vth of the memory cell in which the write data is "00" is smaller than the word line voltage VVF3 (Vth<VVF3), the NMOS transistor n13 is made conductive for a period of time during which the signal $\phi$LAT1 is at the high level. However, since the NMOS transistor n9 is not made conductive at all, the current enough to invert the latch circuit LQ2 cannot be supplied. Thus, the inversion of the node of the latch circuit LQ2 does not occur.

For a period of time during which the signal $\phi$LAT2 is at the high level, the NMOS transistor n14 is made conductive. However, since the NMOS transistor n10 is not made conductive at all, the current enough to invert the latch circuit LQ1 cannot be supplied. Therefore, the inversion of the node of the latch circuit LQ1 does not occur.

Consequently, when the word line voltage is set to VVF3, if the threshold voltage Vth of the memory cell in which the write data is "00" is smaller than the word line voltage VVF3 (Vth<VVF3), the latch data of the latch circuits LQ2 and LQ1 is held to "00" and does not change. Upon rewriting, the bit line voltage is set to the writing potential and the writing operation is performed.

The case where the word line voltage is set to WF2 will now be described. For a period of time during which the word line voltage is set to VVF2, only the voltage VB1 is set to the power voltage Vcc and the other voltages VB0 and VB2 are set to the ground level. For a predetermined period of time, the control signal PGM_RVPC is set to the power voltage Vcc level at the timing shown in FIG. 10. The NMOS transistor n1 is made conductive.

If the NMOS transistors n5 and n6 are conductive, the bit line is charged to (VAnB−Vth') by the power source Vcc from the voltage VB1, after completion of the charging, by cutting off the N channel NMOS transistor H3, the node SA is charged to Vcc by the leak compensation current of the PMOS transistor p1. When the NMOS transistors n5 and n6 are non-conductive, the bit line is not charged but held at the ground level. Since the other voltages VB0 and VB2 are at the ground level, the charging operation by the path other than the path from the voltage VB1 is not performed.

As mentioned above, when the word line voltage is set to VVF2 and the verification is performed, so long as the control signal PGM_RVPC is set to the power voltage Vcc level, only when the NMOS transistors n5 and n6 are conductive, the bit line is charged.

The NMOS transistors n5 and n6 are conductive only when the inversion node /Q2 of the latch circuit LQ2 is at the high level and the node Q1 of the latch circuit LQ1 is at the high level, and they are made conductive when the write data is "01".

Consequently, if the word line voltage is set to VVF2 and the verification in which the write data is "01" is performed, only when the write data is "01", the bit line is charged. In case of the other write data, the bit line is set to the ground level and the data is out of the target of the verification.

In this state, the word line voltage is set to VVF2 and the verification and reading are performed. When the threshold voltage Vth of the memory cell is larger than the word line voltage VVF2 (Vth>VVF2), since no current flows in the cell, the bit line voltage does not change and the node SA is held at the power voltage Vcc. Obviously, the gate electrodes of the NMOS transistors n9 and n10 are at the Vcc level.

When the threshold voltage Vth of the memory cell is smaller than the word line voltage VVF2 (Vth<VVF2), the cell current larger than the leak compensation current flows, the bit line voltage drops, the NMOS transistor H3 is turned on, and redistribution of charges occurs. The electric potential of the node SA is set to (VAnB−Vth') that is almost equal to the bit line voltage. In this instance, the NMOS transistors n9 and n10 cannot be made conductive at all.

After the elapse of a predetermined time, the pulse-like signal φLAT1 is set to the high level at the timing shown in FIG. 10.

When the threshold voltage Vth of the memory cell in which the write data is "01" is larger than the word line voltage VVF2 (Vth>VVF2), the NMOS transistor n13 is switched to the conductive state for a period of time during which the signal φLAT1 is at the high level. In this instance, since the gate electrode of the NMOS transistor n9 is at the Vcc level, the NMOS transistor n9 is also made conductive. The inversion node /Q2 of the latch circuit LQ2 is set to the low level and the node Q2 of the latch circuit LQ2 is inverted to the high level.

Consequently, when the word line voltage is set to WF2, if the threshold voltage Vth of the memory cell in which the write data is "01" is larger than the word line voltage VVF2 (Vth>VVF2), the latch data of the latch circuits LQ2 and LQ1 is inverted to "11" and, after that, upon rewriting, the bit line is set to the power voltage Vcc, the channel is boosted to the non-writing potential, and no data is written.

When the threshold voltage Vth of the memory cell is smaller than the word line voltage VVF2 (Vth<VVF2), the NMOS transistor n13 is made conductive for a period of time during which the signal φLAT1 is at the high level. However, since the NMOS transistor n9 is not made conductive at all, the current enough to invert the latch circuit LQ2 cannot be supplied. Thus, the inversion of the node of the latch circuit LQ2 does not occur.

Consequently, when the word line voltage is set to VVF2, if the threshold voltage Vth of the memory cell in which the write data is "01" is smaller than the word line voltage VVF2 (Vth<VVF2), the latch data of the latch circuits LQ2 and LQ1 is held to "01" and does not change. Upon rewriting, the bit line voltage is set to the writing potential and the writing operation is performed.

The case where the word line voltage is set to VVF1 will now be described. For a period of time during which the word line voltage is set to VVF1, only the voltage VB2 is set to the power voltage Vcc and the other voltages VB0 and VB1 are set to the ground level. For a predetermined period of time, the control signal PGM_RVPC is set to the power voltage Vcc level at the timing shown in FIG. 10. The NMOS transistor n1 is made conductive.

If the NMOS transistors n7 and n8 are conductive, the bit line is charged to (VAnB−Vth') by the power source Vcc from the voltage VB2, after completion of the charging, by cutting off the N channel NMOS transistor H3, the node SA is charged to Vcc by the leak compensation current of the PMOS transistor p1. When the NMOS transistors n7 and n8 are non-conductive, the bit line is not charged but held at the ground level. Since the other voltages VB0 and VB1 are at the ground level, the charging operation by the path other than the path from the voltage VB2 is not performed.

As mentioned above, when the word line voltage is set to VVF1 and the verification is performed, so long as the control signal PGM_RVPC is set to the power voltage Vcc level, only when the NMOS transistors n7 and n8 are conductive, the bit line is charged.

The NMOS transistors n7 and n8 are conductive only when the node Q2 of the latch circuit LQ2 is at the high level and the inversion node /Q1 of the latch circuit LQ1 is at the high level, and they are made conductive when the write data is "10".

Consequently, if the word line voltage is set to VVF1 and the verification in which the write data is "10" is performed, only when the write data is "10", the bit line is charged. In case of the other write data, the bit line is set to the ground level and the data is out of the target of the verification.

In this state, the word line voltage is set to VVF1 and the verification and reading are performed. When the threshold voltage Vth of the memory cell is larger than the word line voltage VVF1 (Vth>WF1), since no current flows in the cell, the bit line voltage does not change and the node SA is held at the power voltage Vcc. At this time, obviously, the gate electrodes of the NMOS transistors n9 and n10 are at the Vcc level.

When the threshold voltage Vth of the memory cell is smaller than the word line voltage VVF1 (Vth<VVF1), the cell current larger than the leak compensation current flows, the bit line voltage drops, the NMOS transistor H3 is turned on, and redistribution of charges occurs. The electric potential of the node SA is set to (VAnB−Vth') that is almost equal to the bit line voltage. In this instance, the NMOS transistors n9 and n10 cannot be made conductive at all.

After the elapse of a predetermined time, the pulse-like signal φLAT2 is set to the high level at the timing shown in FIG. 10.

When the threshold voltage Vth of the memory cell in which the write data is "10" is larger than the word line voltage VVF1 (Vth>VVF1), the NMOS transistor n14 is switched to the conductive state for a period of time during which the signal φLAT2 is at the high level. In this instance, since the gate electrode of the NMOS transistor n10 is at the Vcc level, the NMOS transistor n10 is also made conductive. The inversion node /Q1 of the latch circuit LQ1 is set to the low level and the node Q1 of the latch circuit LQ1 is inverted to the high level.

Consequently, when the word line voltage is set to VVF1, if the threshold voltage Vth of the memory cell in which the write data is "10" is larger than the word line voltage VVF1 (Vth>VVF1), the latch data of the latch circuits LQ2 and LQ1 is inverted to "11" and, after that, upon rewriting, the bit line is set to the power voltage Vcc, the channel is boosted to the non-writing potential, and no data is written.

When the threshold voltage Vth of the memory cell is smaller than the word line voltage VVF1 (Vth<VVF1), the NMOS transistor n14 is made conductive for a period of time during which the signal φLAT2 is at the high level. However, since the NMOS transistor n10 is not made conductive at all, the current enough to invert the latch circuit LQ1 cannot be supplied. Thus, the inversion of the node of the latch circuit LQ1 does not occur.

Consequently, when the word line voltage is set to VVF1, if the threshold voltage Vth of the memory cell in which the write data is "10" is smaller than the word line voltage VVF1 (Vth<VVF1), the latch data of the latch circuits LQ2 and LQ1 is held to "10" and does not change. Upon rewriting, the bit line voltage is set to the writing potential and the writing operation is performed.

According to the first embodiment of the invention as mentioned above, upon verification, one of the voltages VB0, VB1, and VB2 is set to the power voltage Vcc, the other voltages are set to the ground level, the NMOS transistors (n3 and n4), (n5 and n6), and (n7 and n8) are controlled in accordance with the write data, and the charge current of the bit line is supplied from one of the voltages VB0, VB1, and VB2, thereby allowing the other write data to be out of the target of the verification. That is, upon verification of the cell of the word line voltage VVF3, by using the voltage VB0, the write data except for "00" is set to be out of the target of the verification. Upon verification of the cell of the word line voltage VVF2, by using the voltage VB1, the write data except for "01" is set to be out of the target of the verification. Upon verification of the cell of the word line voltage VVF1, by using the voltage VB2, the write data except for "10" is set to be out of the target of the verification. Thus, the circuit construction upon verification is simplified.

1-4. Operation Upon Reading in the First Embodiment

The reading operation of the first embodiment of the invention will now be described with reference to a timing chart of FIG. 11. In the standby mode, the control signals AnB and AnN are at the level of (Vcc−Vth), the reset signal RST1 is set to the high level, and all of the bit lines are set to the ground level.

When the reading operation is activated in this state, the reset signal RST1 is set to the low level and the bit line is disconnected from the ground line. When the selection bit line is, for example, the even bit line, the signal AnB is set to the P5V level and the signal AnN is set to the ground level. The odd bit line is disconnected from the latch, the control signal AnB is held at (Vcc−Vth (=VAnB)), and the voltage enough to supply the current for compensating the leakage of the bit line is applied to the control signal Vref. At the same time, the reset signal RST2 is set to the high level, the NMOS transistors n11 and n12 are made conductive, and all of the nodes Q2 and Q1 of the latch circuits LQ2 and LQ1 are reset to "0".

The reading operation is performed by sequentially reducing the word line voltage to VRD3→VRD2→VRD1 (refer to FIG. 8A). Upon reading, the voltage VB0 is always set to the Vcc level and the voltages VB1 and VB2 are always set to the ground level as shown in FIG. 8C.

First, the selection word line voltage is set to VRD3, the control signal PGM_RVPC is set to the power voltage Vcc, and the NMOS transistor n1 is made conductive.

When the NMOS transistors n4 and n3 are conductive, the current from the voltage VB0 flows through the NMOS transistors n4, n3, and ni and the bit line is charged. When the reading operation is started, since all of the latch circuits LQ2 and LQ1 are reset to "0", the inversion node /Q2 of the latch circuit LQ2 is set to "1" and the inversion node /Q1 of the latch circuit LQ1 is set to "1". Therefore, in this instance, the NMOS transistors n4 and n3 are conductive.

Consequently, when the selection word line voltage is set to VRD3 and the control signal PGM_RVPC is set to the power voltage Vcc, all of the even bit lines are charged to (VAnB−Vth') and by cutting off the NMOS transistor H3, all of the nodes SA are charged to Vcc by the leak compensation current. After that the control signal PGM_RVPC is reset to the ground level.

When the threshold voltage Vth of the memory cell is larger than the word line voltage VRD3 (Vth>VRD3) as a result of the reading at the word line voltage VRD3, since no cell current flows, the node SA is held at the power voltage Vcc. In this instance, the NMOS transistors n9 and n10 are made conductive.

Figure 11:
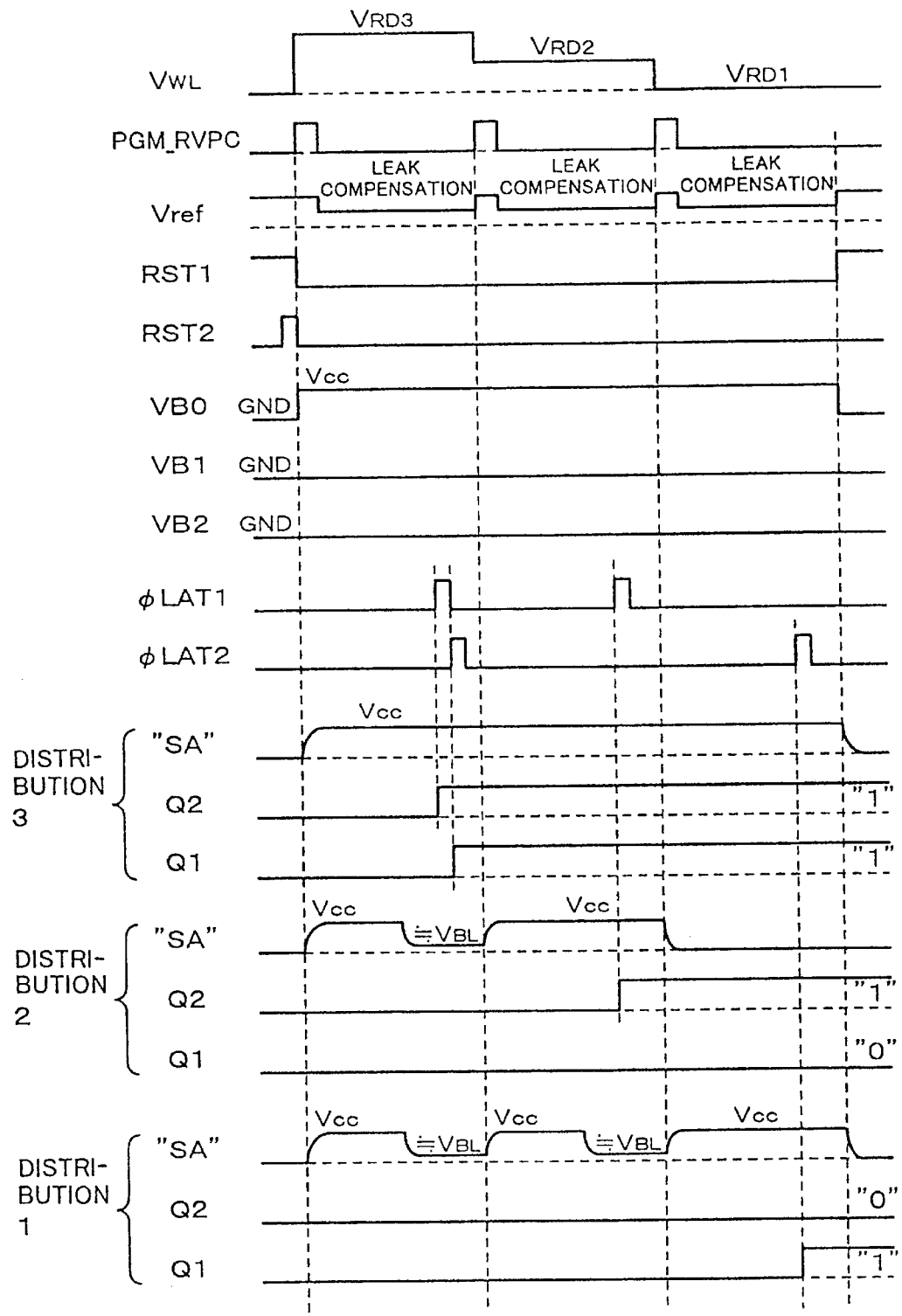
FIG. 11 is a timing chart for use in explanation upon reading in the first embodiment of the invention.

After the elapse of a predetermined time, the pulse-like signals φLAT1 and φLAT2 are set to the high level at the timings shown in FIG. 11.

When the signal φLAT1 is set to the high level, the NMOS transistor n13 is made conductive. Since the gate electrode of the NMOS transistor n9 is set to the Vcc level, the NMOS transistor n9 is also made conductive, the inversion node /Q2 of the latch circuit LQ2 is set to "0", and the node Q2 of the latch circuit LQ2 is inverted to "1".

When the signal φLAT2 is set to the high level, the NMOS transistor n14 is made conductive. Since the gate electrode of the NMOS transistor n10 is set to the Vcc level, the NMOS transistor n10 is also made conductive, the inversion node /Q1 of the latch circuit LQ1 is set to "0", and the node Q1 of the latch circuit LQ1 is inverted to "1".

Consequently, when the threshold voltage Vth of the memory cell is larger than the word line voltage VRD3 (Vth>VRD3), the latch data of the latch circuits LQ2 and LQ1 is inverted to "11". The read data has been inverted. The read data when the latch data is "11" is "00".

On the other hand, when the threshold voltage Vth of the memory cell is smaller than the word line voltage VRD3 (Vth<VRD3), the cell current larger than the leak compensation current flows, the bit line voltage drops, the NMOS transistor H3 is made conductive, and redistribution of charges occurs. The voltage of the node SA is set to (VAnB−Vth') that is almost equal to the bit line voltage. Thus, the NMOS transistors n9 and n10 cannot be made conductive at all.

After the elapse of a predetermined time, the pulse-like signals φLAT1 and φLAT2 are set to the high level at the timings shown in FIG. 10.

When the signal φLAT1 is set to the high level, the NMOS transistor n13 is made conductive. However, since the NMOS transistor n9 is not made conductive at all, a current enough to invert the latch circuit LQ2 cannot be supplied and the inversion of the node of the latch circuit LQ2 does not occur.

When the signal φLAT2 is set to the high level, the NMOS transistor n14 is made conductive. However, since the NMOS transistor n10 is not made conductive at all, a current enough to invert the latch circuit LQ1 cannot be supplied and the inversion of the node of the latch circuit LQ1 does not occur.

Subsequently, the selection word line voltage is set to VRD2 and the control signal PGM_RVPC is set to the power voltage Vcc. The NMOS transistor n1 is made conductive.

When the selection word line voltage is set to VRD3 and the reading operation is performed, if the inversion of the nodes of the latch circuits LQ1 and LQ2 does not occur, since the latch circuits LQ1 and LQ2 are in the initial state "00", the NMOS transistors n3 and n4 are conductive. Therefore, when the control signal PGM_RVPC is set to the power voltage Vcc, the current from the voltage VB0 flows through the NMOS transistors n4, n3, and n9. All of the even bit lines to which the memory cells in which the threshold voltage Vth is lower than VRD3 are connected are charged to (VAnB−Vth').

On the other hand, when the selection word line voltage is set to VRD3 and the reading operation is performed, if the inversion of the nodes of the latch circuits LQ1 and LQ2 occurred, the NMOS transistors n4 and n3 are made non-conductive, are disconnected from the voltage source VB0, and are not connected to the voltage sources VB1 and VB2. The even bit lines enter a floating state while holding the Vcc level. In this state, no influence is exercised on the latch data of the latch circuits LQ1 and LQ2 which have already been inverted.

After that, the control signal PGM_RVPC is reset to the ground level. At this time, the even bit lines to which the cells in which the inversion of the node had not occurred until the previous time are coupled are charged to (VAnB−Vth). By cutting off the NMOS transistor H3, all of the nodes SA are charged to Vcc.

When the threshold voltage Vth of the memory cell is larger than the word line voltage VRD2 (Vth>VRD2), since no cell current flows, the node SA is held at the power voltage Vcc. In this instance, the NMOS transistors n9 and n10 are made conductive.

After the elapse of a predetermined time, the pulse-like signal φLAT1 is set to the high level at the timing shown in FIG. 11.

When the signal φLAT1 is set to the high level, the NMOS transistor n13 is made conductive. In this instance, since the NMOS transistor n9 is conductive, the inversion node /Q2 of the latch circuit LQ2 is set to "0" and the node Q2 of the latch circuit LQ2 is inverted to "1".

Thus, when the threshold voltage Vth of the memory cell is larger than the word line voltage VRD2 (Vth>VRD2), if the inversion of the latch had not occurred until the previous time, the latch data of the latch circuits LQ2 and LQ1 is inverted to "10". On the other hand, if the inversion of the latch had occurred until the previous time and the latch data is "11", the data is held. The read data has been inverted. The read data when the latch data is "10" is "01".

When the threshold voltage Vth of the memory cell is smaller than the word line voltage VRD2 (Vth<VRD2), the cell current larger than the leak compensation current flows, the bit line voltage drops, the NMOS transistor H3 is made conductive, and redistribution of charges occurs. The voltage of the node SA is set to (VAnB−Vth') that is almost equal to the bit line voltage. Thus, the NMOS transistors n9 and n10 cannot be made conductive at all.

After the elapse of a predetermined time, the pulse-like signal φLAT1 is set to the high level at the timing shown in FIG. 11.

When the signal φLAT1 is set to the high level, the NMOS transistor n13 is made conductive. However, since the NMOS transistor n9 is not made conductive at all, the current enough to invert the latch circuit LQ2 cannot be supplied and the inversion of the node of the latch circuit LQ2 does not occur.

Subsequently, the selection word line voltage is set to VRD1, the control signal PGM_RVPC is set to the power voltage Vcc, and the NMOS transistor n1 is made conductive.

If the inversion of the nodes of the latch circuits LQ1 and LQ2 had not occurred until the previous time in the reading operation, the NMOS transistors n4 and n3 are conductive and the bit line is charged by the voltage VB0. If the inversion of the nodes of the latch circuits LQ1 and LQ2 had occurred until the previous time in the reading operation, the NMOS transistors n4 and n3 are made non-conductive, are disconnected from the voltage source VB0, and are not connected to the voltage sources VB1 and VB2. The even bit lines enter a floating state while the Vcc level is held. In this state, there is no influence on the latch data of the latch circuits LQ1 and LQ2 which have already been inverted. If the inversion of the node of only the latch circuit LQ2 side had occurred until the previous time in the reading operation, the NMOS transistor n4 is made non-conductive and disconnected from the voltage source VB0. The NMOS transistors n7 and n8 are made conductive and connected to the voltage source VB2. In this case, since the voltages VB1 and VB2 are at the ground level, the node SA is set to the ground level and the data is out of the target of the reading operation.

After that, the control signal PGM_RVPC is reset to the ground level. In this instance, the even bit lines as targets of the reading operation are charged to (VAnB−Vth') and by cutting off the NMOS transistor H3, the node SA as a target of the reading operation is charged to Vcc.

When the threshold voltage Vth of the memory cell is larger than the word line voltage VRD1 (Vth>VRD1) as a result of the reading at the word line voltage VRD1, since no cell current flows, the node SA is held at the power voltage Vcc. The NMOS transistors n9 and n10 are made conductive.

After the elapse of a predetermined time, the pulse-like signal φLAT2 is set to the high level at the timing shown in FIG. 11.

When the signal φLAT2 is set to the high level, the NMOS transistor n14 is made conductive. In this instance, since the NMOS transistor n10 is conductive, the inversion node /Q1 of the latch circuit LQ1 is set to "0" and the node Q1 of the latch circuit LQ1 is inverted to "1".

Consequently, when the threshold voltage Vth of the memory cell is larger than the word line voltage VRD1 (Vth>VRD1), if the inversion of the latch had not occurred until the previous time, the latch data of the latch circuits LQ2 and LQ1 is inverted to "01". If the inversion of the latch had occurred until the previous time, the data is held. The read data has been inverted. The read data when the latch data is "01" is "10".

When the threshold voltage Vth of the memory cell is smaller than the word line voltage VRD1 (Vth<VRD1), the cell current larger than the leak compensation current flows, the bit line voltage drops, the NMOS transistor H3 is made conductive, and redistribution of charges occurs. The voltage of the node SA is set to (VAnB−Vth') that is almost equal to the bit line voltage. Thus, the NMOS transistors n9 and n10 are not made conductive at all.

After the elapse of a predetermined time, the pulse-like signal φLAT2 is set to the high level at the timing shown in FIG. 11.

When the signal φLAT2 is set to the high level, the NMOS transistor n14 is made conductive. However, the NMOS transistor n10 is not made conductive at all. Therefore, the current enough to invert the latch circuit LQ1 cannot be supplied. The inversion of the node of the latch circuit LQ1 does not occur.

In the first embodiment as mentioned above, upon reading, if the inversion of the data in the latch circuit had occurred until the previous time in the reading operation, the data is out of the target of the reading operation. Only when the inversion of the data in the latch circuit had not occurred until the previous time in the reading operation, the data is read out. With the above construction, the circuit scale is reduced.

If the selection word line voltage is set to VRD3 to VRD1 and the inversion of the latch does not occur at any of those voltages, the data of the latch circuits LQ2 and LQ1 is held to "00". When the latch data is "00", the read data is "11".

2. Second Embodiment

Figure 12:
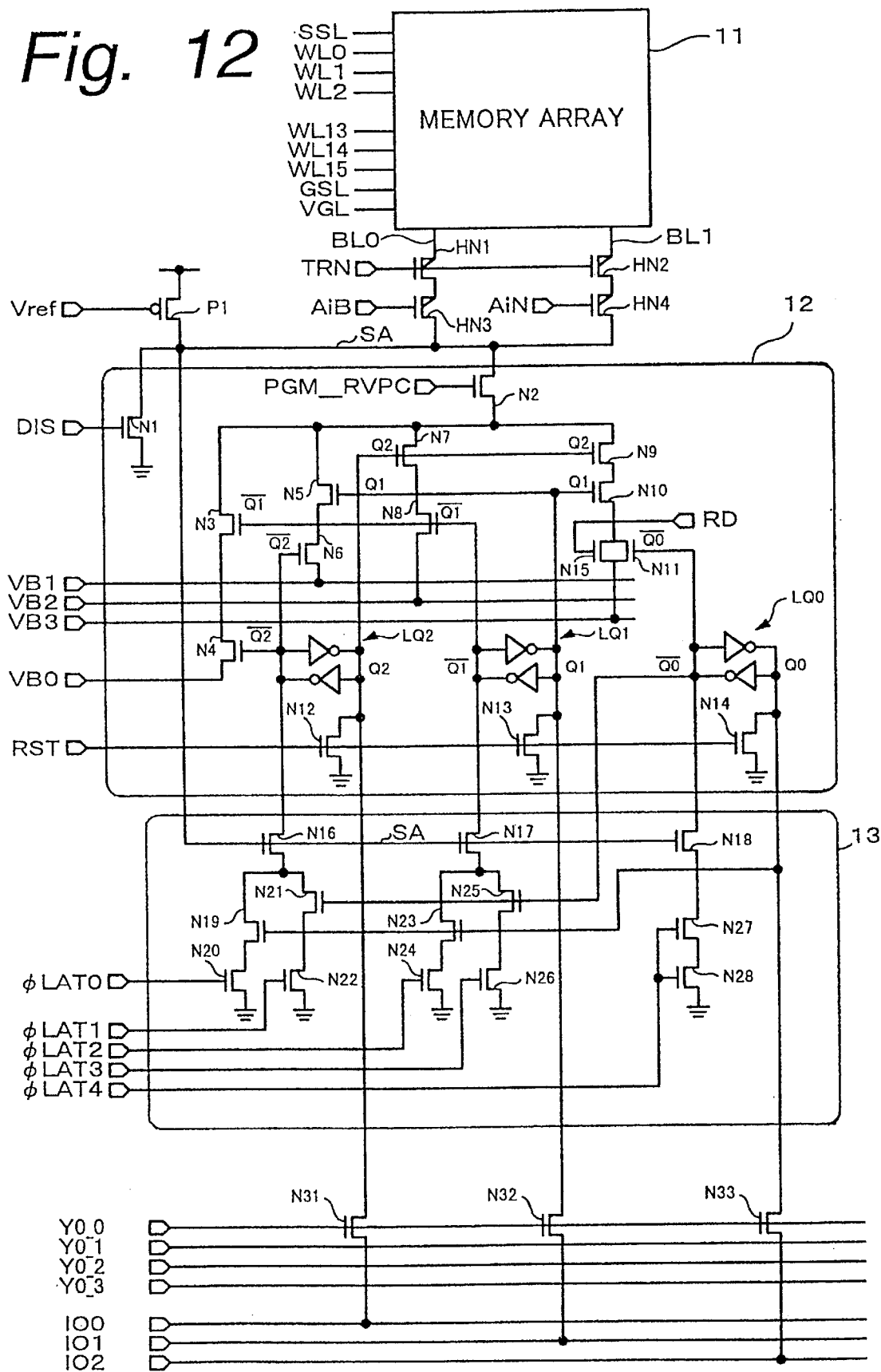
FIG. 12 is a circuit diagram showing the second embodiment of the invention.

FIG. 12 shows the second embodiment of a non-volatile semiconductor memory device according to the invention. The non-volatile semiconductor memory device relates to the case where the storing multivalue level corresponds to the octenary value.

2-1. Whole Construction of the Second Embodiment

As shown in FIG. 12, the non-volatile semiconductor memory device to which the invention is applied comprises: a memory array 11; a bit line voltage generating circuit 12; and a read/verify control circuit 13.

Figure 13:
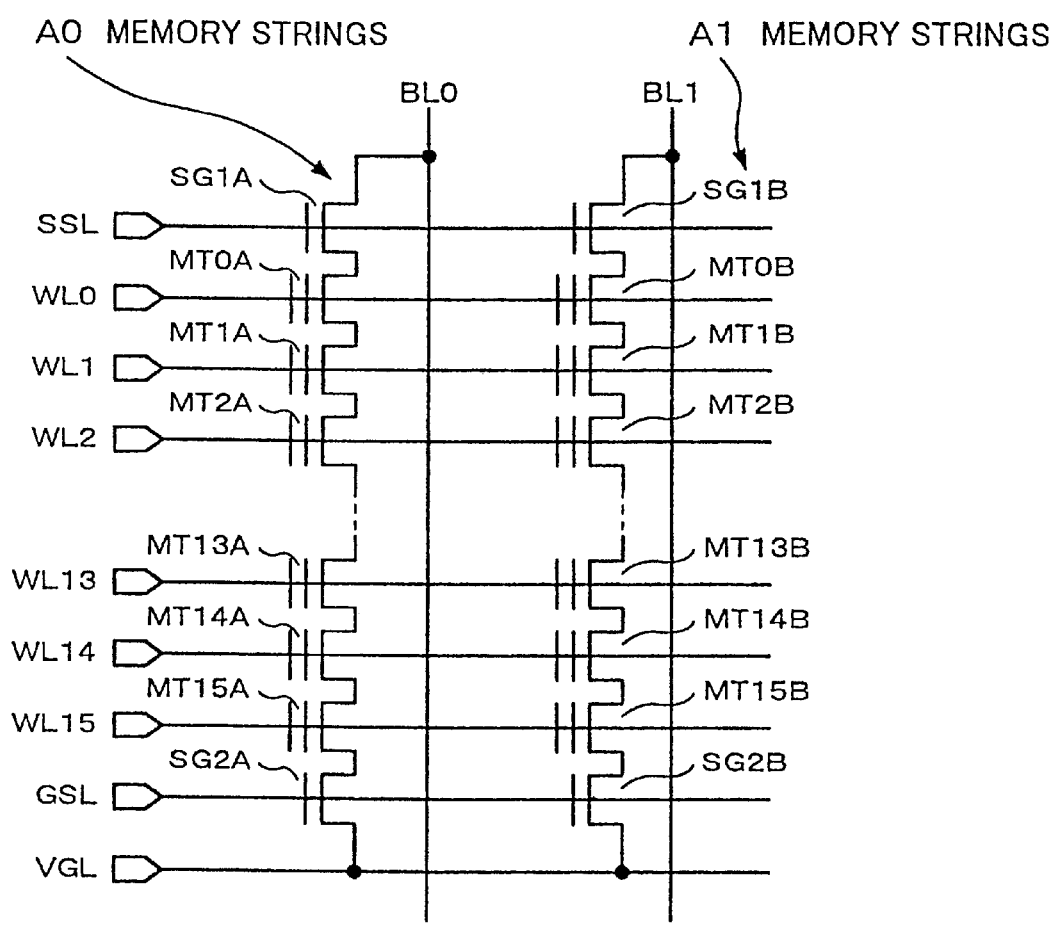
FIG. 13 is a circuit diagram for use in explanation of a memory array.

As shown in FIG. 13, the memory array 11 has a construction such that memory strings A0, A1, . . . in which memory cells are connected to the common word lines WL0 to WL15 are arranged in a matrix form. A page is constructed by the memory cells connected to the same word lines WL0 to WL15.

The memory strings A0 and A1 are constructed by NAND strings in which memory cell transistors MT0A to MT15A and MT0B to MT15B comprising non-volatile semiconductor memory devices having floating gates are serially connected. A drain of the memory cell transistor MT0A of the NAND string is connected to the bit lines BL0 and BL1 through selection gates SG1A and SG1B, respectively. Sources of the memory cell transistors MT15A and MT15B are connected to a reference potential line VGL through selection gates SG2A and SG2B, respectively. Gates of the selection gates SG1A and SG1B are connected in common to a selection signal supply line SSL. Gates of the selection gates SG2A and SG2B are connected in common to a selection signal supply line GSL. Control gates of the memory cells of the same row are connected to the common word lines WL0, WL1, . . . .

Upon writing, for example, the voltage of 20V is applied to the word line of the selected memory cell and the octenary multivalue data is written into the memory cell on a page unit basis. At this time, the selection gates SG1A and SG1B are made conductive, a passing voltage is applied to the word line of the memory cells other than the selected memory cell, and the selection gates SG2A and SG2B are made non-conductive.

Figure 14:
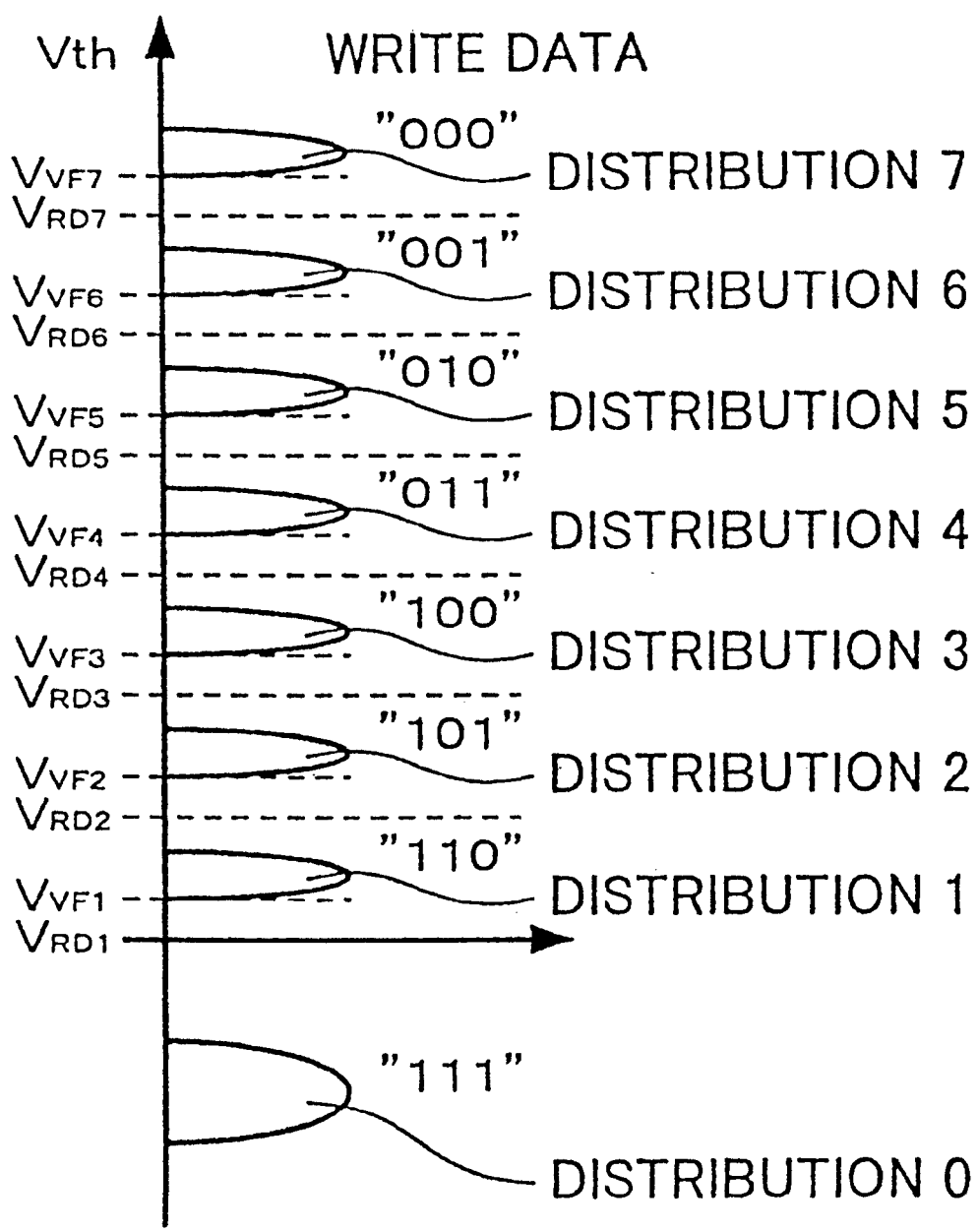
FIG. 14 is a schematic diagram for use in explanation of an octenary writing level.

An octenary data recording as shown in FIG. 14 is performed to the memory cell transistor. As shown in FIG. 14, upon writing, the data is written into each memory cell so that the threshold voltage of the memory cell lies within distributions "7" to "0" in accordance with eight values of the write data "000" to "111", respectively.

In this instance, the verifying operation is performed by the verifying voltages VVF7 to VVF1 and the threshold voltages of the memory cells are controlled so that they lie within distributions "7" to "0" corresponding to each data, respectively. Upon reading, the threshold voltages of the memory cells are detected and read out by the reading voltages VRD7 to VRD1.

At the time of verification and reading, the verifying voltages VVF7 to VVF1 and reading voltages VRD7 to VRD1 are applied to the word line of the selected memory cell. The other memory cells are made conductive. The selection gates SG1A and SG1B and selection gates SG2A and SG2B are made conductive. At this time, whether the threshold voltage of the memory cell exceeds the verifying voltages VVF7 to VVF1 and reading voltages VRD7 to VRD1 or not is discriminated on the basis of whether a current flows in the memory cell or not. The verification and the reading are executed.

In FIG. 12, the bit line voltage generating circuit 12 is constructed by the latch circuits LQ2, LQ1, and LQ0 in which all inputs of NMOS transistors N1 to N15 and inverters are coupled and all outputs of them are coupled. The supply lines of the voltages VB0, VB1, VB2, and VB3 are led out from the bit line voltage generating circuit 12.

Upon writing, a bit line voltage according to the write data is generated by the bit line voltage generating circuit 12 and supplied to the memory cell of the memory array 11. Upon verification, the storing nodes Q2, Q1, and Q0 of the latch circuits LQ2, LQ1, and LQ0 of the bit line voltage generating circuit 12 are set to "111" when the data is sufficiently written into the memory cell of the memory array 11. Upon reading, the threshold voltage of the memory cell of the memory array 11 is detected and the data is read out. At this time, the read data is stored into the storing nodes Q0, Q1, and Q2 of the latch circuits LQ0, LQ1, and LQ2.

The read/verify control circuit 13 is constructed by NMOS transistors N16 to N28. Upon reading or verification, the read/verify control circuit 13 controls states of the latch circuits LQ2, LQ1, and LQ0. Supply lines of the signals φLAT0, φLAT1, φLAT2, φLAT3, and φLAT4 are led out from the read/verify control circuit 13 and pulse-like signals are supplied. Gate electrodes of the NMOS transistors N16, N17, and N18 of the read/verify control circuit 13 are connected to the node SA. The node SA becomes a node to detect the threshold voltage of the memory cell of the memory array 11. That is, as will be explained hereinlater, when the threshold voltage of the memory cell is larger than the word line voltage, no current flows in the cell, so that the node SA is held at the power voltage Vcc (for example, 3.3V). When the threshold voltage of the memory cell is smaller than the word line voltage, the node SA drops to the voltage that is almost equal to the bit line voltage. By the node SA, the NMOS transistors N16, N17, and N18 are controlled and the operation of the read/verify control circuit 13 is set.

A serial connection of NMOS transistors HN1 and HN3 of a high withstanding voltage is provided between the node SA and the bit line BL0. A serial connection of NMOS transistors HN2 and HN4 of a high withstanding voltage is provided between the node SA and the bit line BL1. The address decoding signal AiB is supplied to a gate electrode of the NMOS transistor HN3. The address decoding signal AiN is supplied to a gate electrode of the NMOS transistor HN4. The control signal TRN is supplied to a gate electrode of the NMOS transistors HN1 and HN2.

The NMOS transistor N1 is connected between the node SA and the ground line GND. A PMOS transistor P1 is connected between the node SA and the supply line of the power voltage Vcc. The control signal DIS is supplied to a gate electrode of the NMOS transistor N1. The signal Vref is supplied to a gate electrode of the PMOS transistor P1.

The NMOS transistor N2 is provided between the node SA and the bit line voltage generating circuit 12. That is, a drain of the NMOS transistor N2 is connected to the node SA. A source of the NMOS transistor N2 is connected to drains of the NMOS transistors N3, N5, N7, and N9. The control signal PGM RVPC is supplied to a gate electrode of the NMOS transistor N2.

The NMOS transistors N3 and N4 are serially connected between the source of the NMOS transistor N2 and the supply line of the voltage VB0. The NMOS transistors N5 and N6 are serially connected between the source of the NMOS transistor N2 and the supply line of the voltage VB1. The NMOS transistors N7 and N8 are serially connected between the source of the NMOS transistor N2 and the supply line of the voltage VB2. The NMOS transistors N9, N10, and N11 are serially connected between the source of the NMOS transistor N2 and the supply line of the voltage VB3. The NMOS transistor N15 is connected in parallel to the NMOS transistor N11.

The latch circuits LQ2, LQ1, and LQ0 have the storing nodes Q2, Q1, and Q0 and their inversion storing nodes /Q2, /Q1, and /Q0, respectively. "/" denotes a bar indicative of the inversion.

The inversion storing node /Q2 of the latch circuit LQ2 is connected to gate electrodes of the NMOS transistors N4 and N6. The storing node Q2 of the latch circuit LQ2 is connected to gate electrodes of the NMOS transistors N7 and N9.

The inversion storing node /Q1 of the latch circuit LQ1 is connected to gate electrodes of the NMOS transistors N3 and N8. The storing node Q1 of the latch circuit LQ1 is connected to gate electrodes of the NMOS transistors N5 and N10.

The inversion storing node /Q0 of the latch circuit LQ0 is connected to a gate electrode of the NMOS transistor N11. A supply line of a control signal RD is connected to a gate electrode of the NMOS transistor N15 connected in parallel to the NMOS transistor N11.

The NMOS transistors N12, N13, and N14 are connected between the storing node Q2 of the latch circuit LQ2 and the ground line, between the storing node Q1 of the latch circuit LQ1 and the ground line, and between the storing node Q0 of the latch circuit LQ0 and the ground line, respectively. Gate electrodes of the NMOS transistors N12, N13, and N14 are connected to the supply line of the reset signal RST, respectively.

In the read/verify control circuit 13, the gate electrodes of the NMOS transistors N16, N17, and N18 are connected to the node SA. A drain of the NMOS transistor N16 is connected to the inversion storing node /Q2 of the latch circuit LQ2. A drain of the NMOS transistor N17 is connected to the inversion storing node /Q1 of the latch circuit LQ1. A drain of the NMOS transistor N18 is connected to the inversion storing node /Q0 of the latch circuit LQ0.

The NMOS transistors N19 and N20 are serially connected between a source of the NMOS transistor N16 and the ground line. A serial circuit of the NMOS transistors N21 and N22 is connected in parallel to the NMOS transistors N19 and N20. The NMOS transistors N23 and N24 are serially connected between a source of the NMOS transistor N17 and the ground line. A serial circuit of the NMOS transistors N25 and N26 is connected in parallel to the NMOS transistors N23 and N24. The NMOS transistors N27 and N28 are serially connected between a source of the NMOS transistor N18 and the ground line. The reason why the NMOS transistors N27 and N28 are serially connected is to match the characteristics of the latch inversion. One of the NMOS transistors N27 and N28 can be omitted.

A gate electrode of the NMOS transistor N20 is connected to the supply line of the signal φLAT0. A gate electrode of the NMOS transistor N22 is connected to the supply line of the signal φLAT1. A gate electrode of the NMOS transistor N24 is connected to the supply line of the signal φLAT2. A gate electrode of the NMOS transistor N26 is connected to the supply line of the signal φLAT3. Gate electrodes of the NMOS transistors N27 and N28 are connected to the supply line of the signal φLAT4.

An NMOS transistor N31 is connected between the storing node Q2 of the latch circuit LQ2 and the bus line IO0. An NMOS transistor N32 is connected between the storing node Q1 of the latch circuit LQ1 and the bus line IO1. An NMOS transistor N33 is connected between the storing node Q0 of the latch circuit LQ0 and the bus line IO2.

Gate electrodes of the NMOS transistors N31, N32, and N33 serving as column gates are connected to the supply line of the signal Y0_0.

2-2. Operation Upon Writing in the Second Embodiment

Figure 15:
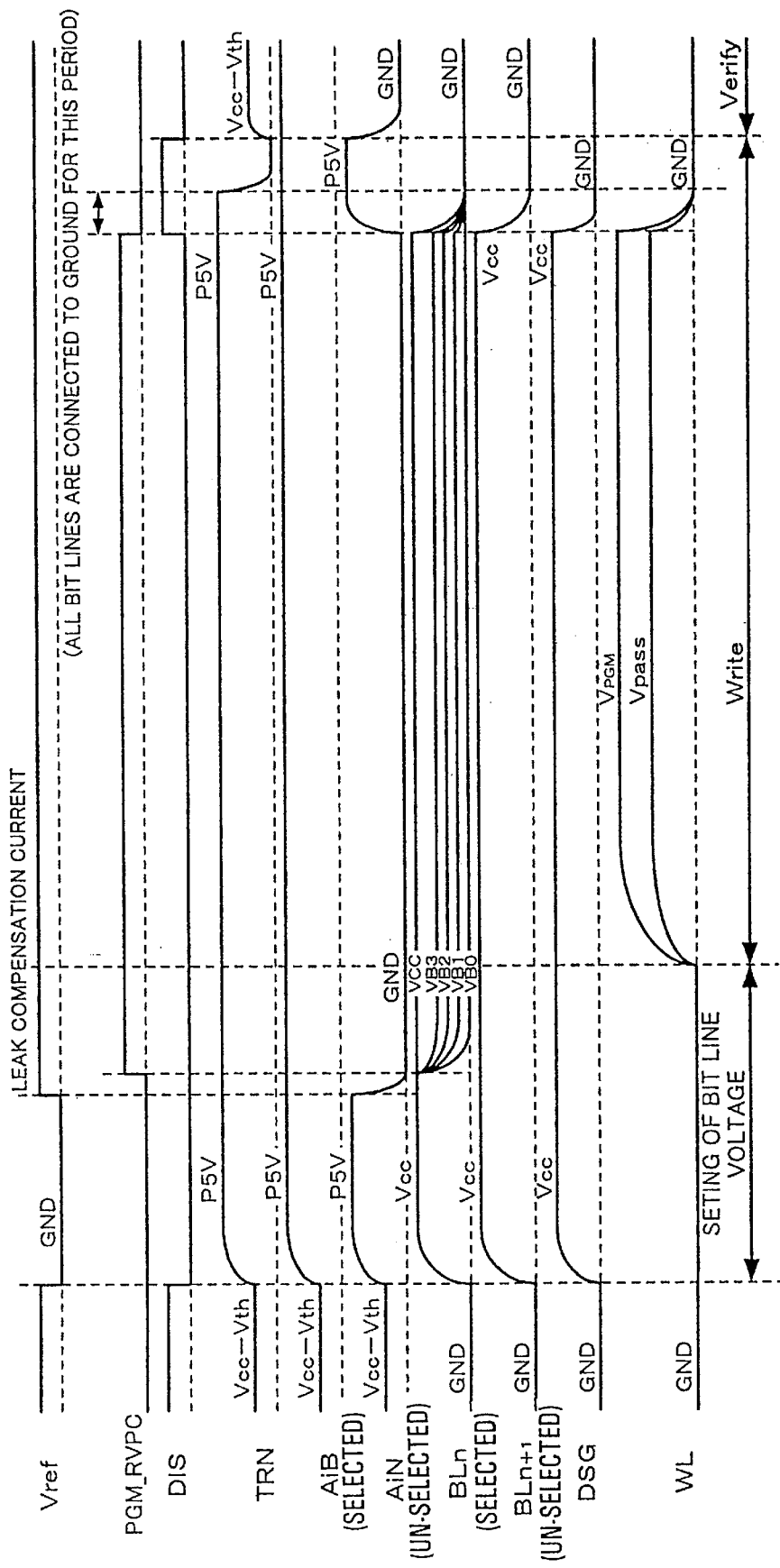
FIG. 15 is a timing chart for use in explanation upon writing in the second embodiment of the invention.

The writing operation of the second embodiment of the invention will now be described with reference to FIG. 15. In the standby mode, the signal PGM_RVPC is set to the low level, the NMOS transistor N2 is held non-conductive, and the bit lines BL0 and BL1 (shown as BLn and BLn+1 in FIG. 15) are disconnected from the latch circuit.

The signal DIS is set to the high level, the signals TRN, AiB, and AiN are set to (Vcc−Vth), and the bit lines BL0 and BL1 are set to the ground level.

When the writing operation is activated in this state, the signal Y0_0 is set to the high level and the write data is fetched and held into the latch circuits LQ2, LQ1, and LQ0.

After that, the signal DIS is switched to the low level and the bit lines BL0 and BL1 are disconnected from the ground line. The signals TRN, AiB, and AiN are set to the high level (for example, passing voltage upon reading) that is equal to or higher than Vcc. The signal Vref is set to the low level and the PMOS transistor P1 is held conductive. Thus, all of the bit lines BL0 and BL1 are charged to the power voltage Vcc.

In this instance, the signals φLAT0 to φLAT4 to control the reading/verifying operations are set to the ground level so as not to exercise an influence on the latch data. The selection signal supply line connected to the gate electrode of the selection gate on the drain side of the memory cell is set to the power voltage Vcc.

Upon writing, the signal Vref is set to the high level, the precharging operation is stopped, the address on the side which is not selected by the address signal, for example, AiN is set to the ground level, and the signal PGM_RVPC is set to the high level. The voltages are set in a manner such that the voltage VB3 is set to the highest voltage, the voltage VB2 is set to the second highest voltage, the voltage VB1 is set to the third highest voltage, and the voltage VB0 is set to the ground level.

When the write data is "00x" (x is 0 or 1), the inversion nodes /Q2 and /Q1 of the latch circuits LQ2 and LQ1 are at the high level. Thus, the NMOS transistors N3 and N4 are made conductive and the bit line BL0 is set to the voltage VB0 and set to the ground level.

When the write data is "01x", the NMOS transistors N5 and N6 are made conductive and the bit line BL0 is set to the voltage VB1.

When the write data is "10x", the NMOS transistors N7 and N8 are made conductive and the bit line BL0 is set to the voltage VB2.

When the write data is "110", the NMOS transistors N9, N10, and N11 are made conductive and the bit line BL0 is set to the voltage VB3.

When the write data is "111", since any of the paths from the voltages VB0 to VB3 is disconnected from the bit line, the voltage of the bit line is held at the Vcc level.

By the above processes, after the selection bit line BL0 was set to the voltage according to the write data, the selected word line WL is set to a writing voltage, the non-selection word line is set to a write passing voltage, and the data is written.

As mentioned above, in the embodiment of the invention, the bit line voltage is changed in accordance with the recording data. In this manner, by setting the bit line voltage in accordance with the recording data, the electric field that is applied to the cell can be set in accordance with the write data and the recording time can be reduced.

2-3. Operation Upon Verification Reading in the Second Embodiment

Figure 16B:
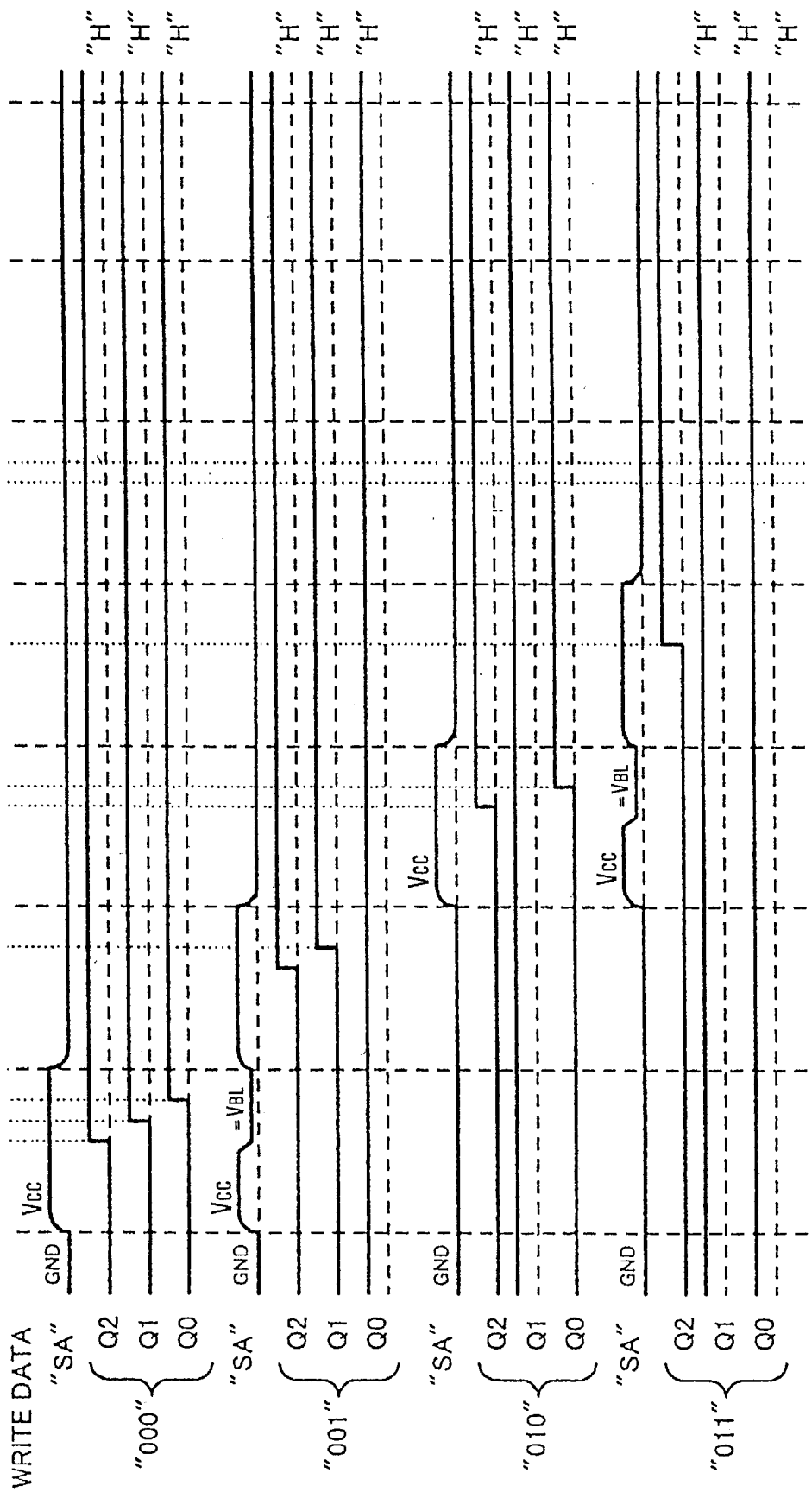
FIG. 16 is a timing chart for use in explanation upon verification in the second embodiment of the invention.
Figure 16C:
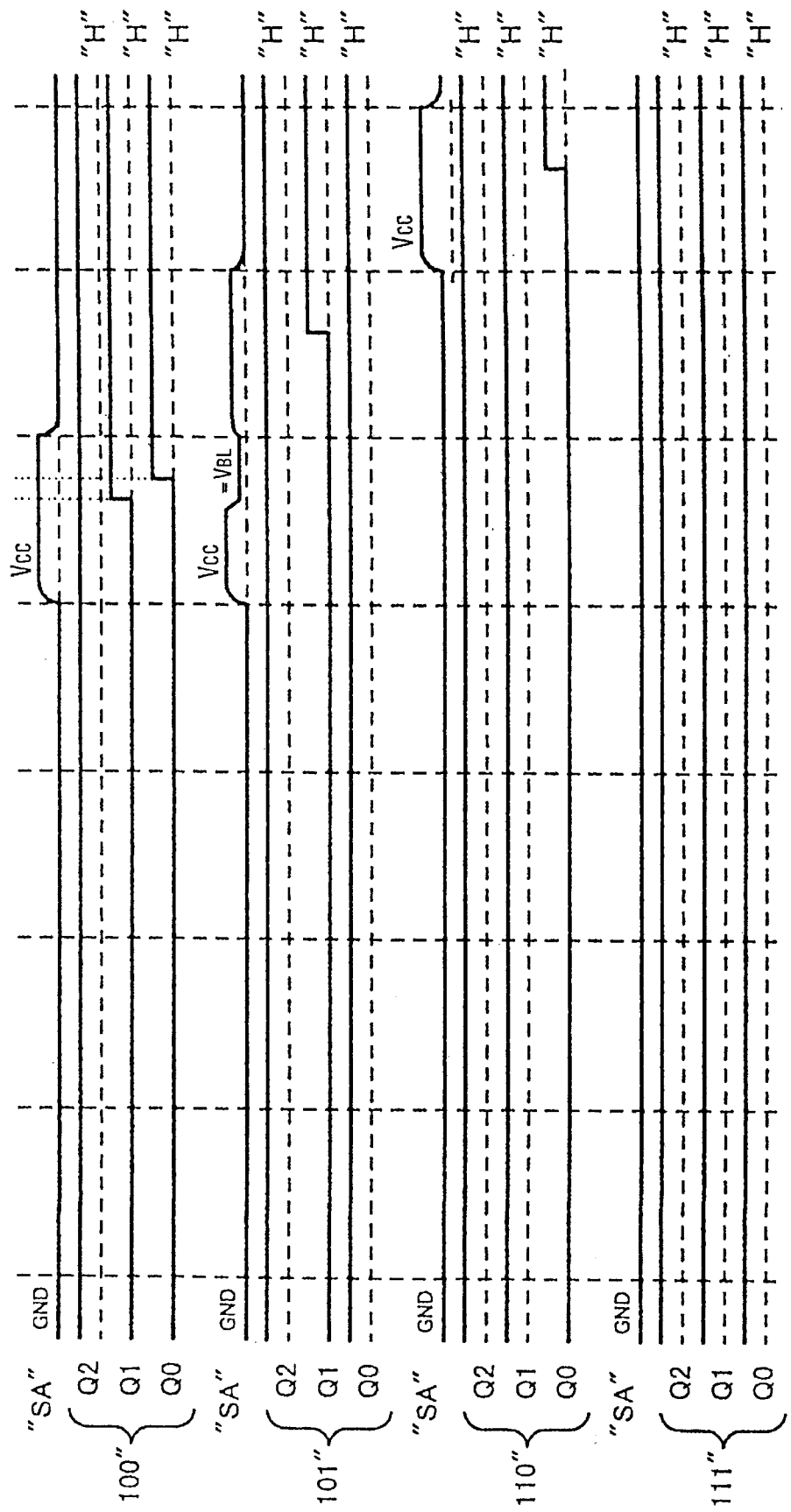

The verifying and reading operations in the second embodiment of the invention will now be described with reference to a timing chart of FIG. 16.

In the verifying and reading operations, the voltage sources VB0 to VB3 are set as shown in FIG. 17A in accordance with the word line voltage.

That is, for a period of time during which the word line voltage is set to VVF7 and for a period of time during which the word line voltage is set to VVF6, the voltage VB0 is set to the power voltage Vcc and the other voltages VB1, VB2, and VB3 are set to the ground level.

For a period of time during which the word line voltage is set to VVF5 and for a period of time during which the word line voltage is set to VVF4, the voltage VB1 is set to the power voltage Vcc and the other voltages VB0, VB2, and VB3 are set to the ground level.

For a period of time during which the word line voltage is set to VVF3 and for a period of time during which the word line voltage is set to VVF2, the voltage VB2 is set to the power voltage Vcc and the other voltages VB0, VB1, and VB3 are set to the ground level.

For a period of time during which the word line voltage is set to VVF1, the voltage VB3 is set to the power voltage Vcc and the other voltages VB0, VB1, and VB2 are set to the ground level.

Upon verification, the control signal RD is always set to the low level and the NMOS transistor N15 is non-conductive.

Prior to the verification, for a predetermined period of time, the control signal DIS is set to the high level, the signals AiB, AiN, and TRN are set to P5V (voltage within a range from 5 to 6 V), and all of the bit lines BL0 and BL1 are set to the ground level.

Subsequently, the control signal DIS is reset to the low level and, after that, the side that is not selected by address "Ai", for example, the signal AiN is set to the ground level and the bit line BL1 is disconnected from the latch circuit of the bit line voltage generating circuit 12. To clamp the bit line, the control signal TRN is set to VTRN (VTRN=Vcc−Vth). The control signal Vref is set to the voltage enough to supply a leak compensation current (<<1 μA) of the bit line.

First, the case where the word line voltage is set to VVF7 will be described. While the word line voltage is set to VVF7, only the voltage VB0 is set to the power voltage Vcc and the other voltages VB1, VB2, and VB3 are set to the ground level. For a predetermined period of time, the control signal PGM RVPC is set to the power voltage Vcc level and the NMOS transistor N2 is made conductive.

When the NMOS transistors N3 and N4 are conductive, the bit line is charged to (VTRN−Vth') by the power source Vcc from the voltage VB0. After the charging, by cutting off the NMOS transistor HN1 of the N channel, the node SA is charged to Vcc by the leak compensation current by the PMOS transistor. When the NMOS transistors N3 and N4 are non-conductive, the bit line is not charged but held at the ground level. Since the other voltages VB1, VB2, and VB3 are at the ground level, the charging operation by the path other than the path from the voltage VB0 is not performed.

As mentioned above, when the word line voltage is set to VVF7 and the verification is performed, only when the NMOS transistors N3 and N4 are conductive, the bit line is charged. The NMOS transistors N3 and N4 are conductive only when the inversion node /Q2 of the latch circuit LQ2 is at the high level and the inversion node /Q1 of the latch circuit LQ1 is at the high level, and they are made conductive when the write data is "00x".

Consequently, only when the write data is "00x", the bit line is charged. In case of the other write data, the node SA is set to the ground level and the data is out of the target of the verification.

In this state, the control signal PGM_RVPC is reset to the ground level and the selection bit line BL0 is disconnected from the bit line voltage generating circuit 12.

When the threshold voltage Vth of the memory cell is larger than the word line voltage VVF7 (Vth>VVF7), since no current flows in the cell, the bit line voltage does not change and the node SA is held at the power voltage Vcc. The NMOS transistors N16, N17, and N18 are held conductive. In this case, since the node is set to the target of the verification only when the write data is "00x", the following two cases are considered.

<1> Case where the write data is "000" and the threshold voltage Vth of the memory cell exceeds the word line voltage VVF7 (Vth>VVF7).

<2> Case where the write data is "001" and the threshold voltage Vth of the memory cell exceeds the word line voltage VVF7 (Vth>VVF7).

However, if the threshold voltage Vth of the memory cell in which the write data is "001" exceeds the word line voltage VVF7, (Vth>VVF6) is obtained in the verification when the word line voltage is set to VVF6 at the previous time. It is determined that the data has sufficiently been written. The write data in the latch circuit becomes "111" and the subsequent data is not written. Therefore, it is impossible.

When the threshold voltage Vth of the memory cell is smaller than the word line voltage WF7 (Vth<VVF7), a cell current larger than the leak compensation current flows, the bit line voltage drops, the NMOS transistor HN1 is turned on, and redistribution of charges occurs. The electric potential of the node SA is set to the voltage VBL (VBL=VTRN−Vth') that is almost equal to the bit line voltage. When the electric potential of the node SA is equal to (VTRN−Vth'), the NMOS transistors N16, N17, and N18 cannot be made conductive at all. In this case, the following two cases are considered.

<1> Case where the write data is "000" and the threshold voltage Vth of the memory cell is smaller than the word line voltage VVF7 (Vth<VVF7).

<2> Case where the write data is "001" and the threshold voltage Vth of the memory cell is smaller than the word line voltage VVF7 (Vth<VVF7).

When the write data is "000", since the inversion node /Q0 of the latch circuit LQ0 is at the high level, the NMOS transistors N21 and N25 are held conductive. When the write data is "001", the NMOS transistors N21 and N25 are non-conductive.

After the elapse of a predetermined time, the pulse-like signals φLAT1, φLAT3, and φLAT4 are sequentially set to the high level.

When the write data is "000" and the threshold voltage Vth of the memory cell exceeds the word line voltage VVF7

(Vth>VVF7), the NMOS transistor N22 is switched to the conductive state for a period of time during which the signal φLAT1 is at the high level. In this instance, since the NMOS transistor N21 is conductive and the NMOS transistor N16 is conductive, the inversion node /Q2 of the latch circuit LQ2 is set to the low level and the node Q2 of the latch circuit LQ2 is inverted to the high level.

For a period of time during which the signal φLAT3 is at the high level, the NMOS transistor N26 is switched to the conductive state. In this instance, since the NMOS transistor N25 is conductive and the NMOS transistor N17 is conductive, the inversion node /Q1 of the latch circuit LQ1 is set to the low level and the node Q1 of the latch circuit LQ1 is inverted to the high level.

For a period of time during which the signal φLAT4 is at the high level, the NMOS transistors N27 and N28 are switched to the conductive state. In this instance, since the NMOS transistor N18 is conductive, the inversion node /Q0 of the latch circuit LQ0 is set to the low level and the node Q0 of the latch circuit LQ0 is inverted to the high level.

Consequently, when the word line voltage is set to VVF7, if the threshold voltage Vth of the memory cell in which the write data is "000" is larger than the word line voltage VVF7 (Vth>VVF7), the latch data of the latch circuits LQ2, LQ1, and LQ0 is inverted to "111". After that, upon rewriting, the bit line is set to the power voltage Vcc and the channel is boosted to the non-writing potential and no data is written.

When the write data is "000" and the threshold voltage Vth of the memory cell is smaller than the word line voltage VVF7 (Vth<VVF7), for a period of time during which the signal φLAT1 is at the high level, the NMOS transistor N22 is made conductive and the NMOS transistor N21 is made conductive. However, since the NMOS transistor N16 is not made conductive at all, the current enough to invert the latch circuit LQ2 cannot be supplied. Thus, the inversion of the node of the latch circuit LQ2 does not occur.

For a period of time during which the signal φLAT3 is at the high level, the NMOS transistor N26 is made conductive and the NMOS transistor N25 is made conductive. However, since the NMOS transistor N17 is not made conductive at all, the current enough to invert the latch circuit LQ1 cannot be supplied. Thus, the inversion of the node of the latch circuit LQ1 does not occur.

For a period of time during which the signal φLAT4 is at the high level, the NMOS transistors N27 and N28 are made conductive. However, since the NMOS transistor N18 is not made conductive at all, the current enough to invert the latch circuit LQ0 cannot be supplied. Thus, the inversion of the node of the latch circuit LQ0 does not occur.

Consequently, when the word line voltage is set to VVF7, if the threshold voltage Vth of the memory cell in which the write data is "000" is smaller than the word line voltage VVF7 (Vth<VVF7), the latch data of the latch circuits LQ2, LQ1, and LQ0 does not change but is held to "000". Upon rewriting, the bit line voltage is set to the writing potential and the data is written.

At this time, with respect to the memory cell in which the write data is "001", since the NMOS transistors N21 and N25 are made non-conductive, the data is out of the target of the verification and the latch data of the latch circuits LQ2, LQ1, and LQ0 is held as it is. As for the other memory cells as well, since the data is out of the target of the verification, the latch data of the latch circuits LQ2, LQ1, and LQ0 is held as it is.

The case where the word line voltage is set to VVF6 will now be described. For a period of time during which the word line voltage is set to VVF6, only the voltage VB0 is set to the power voltage Vcc and the other voltages VB1, VB2, and VB3 are set to the ground level in a manner similar to that mentioned above. The control signal PGM_RVPC is set to the power voltage Vcc level for a predetermined period of time.

When the control signal PGM_RVPC is set to the power voltage Vcc level, the NMOS transistor N2 is made conductive. When the word line voltage is set to VVF6 and the write data is verified, if the control signal PGM_RVPC is set to the power voltage Vcc level, in a manner similar to that mentioned above, the bit line is charged as for only the memory cell in which the write data is "00x". In case of the other write data, the bit line is set to the ground level and the data is out of the target of the verification.

When the threshold voltage Vth of the memory cell is larger than the word line voltage VVF6, since no current flows in the cell, the bit line voltage does not change, and the node SA is held at the power voltage Vcc. The NMOS transistors N16, N17, and N18 are held conductive. In this case, since the data becomes the target of the verification only when the write data is "00x", there are considered a case where the write data is "000" and the threshold voltage Vth of the memory cell exceeds the word line voltage VVF6 and a case where the write data is "001" and the threshold voltage Vth of the memory cell exceeds the word line voltage VVF6.

When the threshold voltage Vth of the memory cell is smaller than the word line voltage VVF6, a cell current larger than the leak compensation current flows, the bit line voltage drops, the NMOS transistor HN1 is turned on, and redistribution of charges occurs. The electric potential of the node SA is set to (VTRN−Vth') that is almost equal to the bit line voltage. When the electric potential of the node SA is equal to (VTRN−Vth'), the NMOS transistors N16, N17, and N18 cannot be made conductive at all. In this case, there are considered a case where the write data is "000" and the threshold voltage Vth of the memory cell is smaller than the word line voltage VVF7 and a case where the write data is "001" and the threshold voltage Vth of the memory cell is smaller than the word line voltage VVF7.

In this state, the word line voltage is set to VVF6 and the verification and reading are performed. After the elapse of a predetermined time, the pulse-like signals φLAT0 and φLAT2 are sequentially set to the high level.

When the write data is "001", since the node Q0 of the latch circuit LQ0 is at the high level, the NMOS transistors N19 and N23 are held conductive.

When the write data is "001" and the threshold voltage Vth of the memory cell exceeds the word line voltage VVF6 (Vth>VVF6), the NMOS transistor N20 is switched to the conductive state for a period of time during which the signal φLAT0 is at the high level. In this instance, since the NMOS transistor N19 is conductive and the NMOS transistor N16 is conductive, the inversion node /Q2 of the latch circuit LQ2 is set to the low level and the node Q2 of the latch circuit LQ2 is inverted to the high level.

For a period of time during which the signal φLAT2 is at the high level, the NMOS transistor N24 is switched to the conductive state. At this time, since the NMOS transistor N23 is conductive and the NMOS transistor N17 is conductive, the inversion node /Q1 of the latch circuit LQ1 is set to the low level and the node Q1 of the latch circuit LQ1 is inverted to the high level.

Consequently, when the word line voltage is set to VVF6, when the threshold voltage Vth of the memory cell in which the write data is "001" is larger than the word line voltage VVF6 (Vth>VVF6), the latch data of the latch circuits LQ2, LQ1, and LQ0 is inverted to "111". After that, upon rewriting, the bit line is set to the power voltage Vcc, the channel is boosted to the non-writing potential, and no data is written.

When the threshold voltage Vth of the memory cell in which the write data is "001" is smaller than the word line voltage VVF6 (Vth<VVF6), a current flows in the cell and the bit line voltage drops. Thus, the NMOS transistors N16, N17, and N18 cannot be made conductive at all.

For a period of time during which the signal φLAT0 is at the high level, the NMOS transistor N20 is made conductive and the NMOS transistor N19 is conductive. However, since the NMOS transistor N16 is not made conductive at all, the current enough to invert the latch circuit LQ2 cannot be supplied. The inversion of the node of the latch circuit LQ2 does not occur.

For a period of time during which the signal φLAT2 is at the high level, the NMOS transistor N24 is made conductive and the NMOS transistor N23 is conductive. However, since the NMOS transistor N17 is not made conductive at all, the current enough to invert the latch circuit LQ1 cannot be supplied. The inversion of the node of the latch circuit LQ1 does not occur.

Consequently, when the word line voltage is set to VVF6, if the threshold voltage Vth of the memory cell in which the write data is "001" is smaller than the word line voltage VVF6 (Vth<VVF6), the latch data of the latch circuits LQ2, LQ1, and LQ0 does not change but is held to "001", and upon rewriting, the bit line voltage is set to the writing potential and the data is written.

In this instance, as for the memory cell in which the write data is "000", since the NMOS transistors N19 and N23 are non-conductive, the data is out of the target of the verification and the data of the latch circuits LQ2, LQ1, and LQ0 is held as it is. With respect to the other memory cells, since the data is out of the target of the verification, the data of the latch circuits LQ2, LQ1, and LQ0 is held as it is.

The case where the word line voltage is set to VVF5 will now be described. While the word line voltage is set to VVF5, only the voltage VB1 is set to the power voltage Vcc and the other voltages VB0, VB2, and VB3 are set to the ground level. For a predetermined period of time, the control signal PGM_RVPC is set to the power voltage Vcc level and the NMOS transistor N2 is made conductive.

When the NMOS transistors N5 and N6 are conductive, the bit line is charged to (VTRN−Vth') by the power source Vcc from the voltage VB1. After the charging, by cutting off the NMOS transistor HN1, the node SA is charged to Vcc by the leak compensation current of the PMOS transistor P1. When the NMOS transistors N5 and N6 are non-conductive, the bit line is not charged but held at the ground level. Since the other voltages VB0, VB2, and VB3 are at the ground level, the charging operation by the path other than the path from the voltage VB1 is not performed.

As mentioned above, if the word line voltage is set to VVF5 and the verification is performed, by setting the control signal PGM_RVPC to the power voltage Vcc level, only when the NMOS transistors N5 and N6 are conductive, the bit line is charged.

The NMOS transistors N5 and N6 are conductive only when the inversion node /Q2 of the latch circuit LQ2 is at the high level and the node Q1 of the latch circuit LQ1 is at the high level, and they are made conductive when the write data is "01x".

Consequently, when the word line voltage is set to VVF5 and the verification in which the write data is "010" is performed, only when the write data is "01x", the bit line is charged. In case of the other write data, the bit line is set to the ground level and the data is out of the target of the verification.

In this state, the word line voltage is set to VVF5 and the verification and reading are performed. When the threshold voltage Vth of the memory cell is larger than the word line voltage VVF5 (Vth>VVF5), since no current flows in the cell, the bit line voltage does not change and the node SA is held at the power voltage Vcc. The NMOS transistors N16, N17, and N18 are held conductive.

When the threshold voltage Vth of the memory cell is smaller than the word line voltage VVF5 (Vth<VVF5), a cell current larger than the leak compensation current flows, the bit line voltage drops, the NMOS transistor HN1 is turned on, and redistribution of charges occurs. The electric potential of the node SA is set to (VTRN−Vth') that is almost equal to the bit line voltage. When the potential of the node SA is equal to (VTRN−Vth'), the NMOS transistors N16, N17, and N18 cannot be made conductive at all.

When the write data is "010", since the inversion node /Q0 of the latch circuit LQ0 is at the high level, the NMOS transistors N21 and N25 are held conductive. When the write data is "011", the NMOS transistors N21 and N25 are made non-conductive and the data is out of the target of the verification.

After the elapse of a predetermined time, the pulse-like signals φLAT1 and φLAT4 are sequentially set to the high level.

When the threshold voltage Vth of the memory cell in which the write data is "010" is larger than the word line voltage VVF5 (Vth>VVF5), the NMOS transistor N22 is switched to the conductive state for a period of time during which the signal φLAT1 is at the high level. In this instance, since the NMOS transistor N21 is conductive and the NMOS transistor N16 is conductive, the inversion node /Q2 of the latch circuit LQ2 is set to the low level and the node Q2 of the latch circuit LQ2 is inverted to the high level.

For a period of time during which the signal φLAT4 is at the high level, the NMOS transistors N27 and N28 are switched to the conductive state. In this instance, since the NMOS transistor N18 is conductive, the inversion node /Q0 of the latch circuit LQ0 is set to the low level and the node Q0 of the latch circuit LQ0 is inverted to the high level.

Consequently, when the word line voltage is set to VVF5, if the threshold voltage Vth of the memory cell in which the write data is "010" is larger than the word line voltage VVF5 (Vth>VVF5), the latch data of the latch circuits LQ2, LQ1, and LQ0 is inverted to "111". After that, upon rewriting, the bit line is set to the power voltage Vcc and the channel is boosted to the non-writing potential and no data is written.

When the threshold voltage Vth of the memory cell is smaller than the word line voltage VVF5 (Vth<VVF5), for a period of time during which the signal φLAT1 is at the high level, the NMOS transistor N22 is made conductive and the NMOS transistor N21 is made conductive. However, since the NMOS transistor N16 is not made conductive at all, the current enough to invert the latch circuit LQ2 cannot be supplied. Thus, the inversion of the node of the latch circuit LQ2 does not occur.

For a period of time during which the signal φLAT4 is at the high level, the NMOS transistors N27 and N28 are made conductive. However, since the NMOS transistor N18 is not made conductive at all, the current enough to invert the latch circuit LQ0 cannot be supplied. Thus, the inversion of the node of the latch circuit LQ0 does not occur.

Consequently, when the word line voltage is set to VVF5, if the threshold voltage Vth of the memory cell in which the write data is "010" is smaller than the word line voltage VVF5 (Vth<VVF5), the latch data of the latch circuits LQ2, LQ1, and LQ0 does not change but is held to "010". Upon rewriting, the bit line voltage is set to the writing potential and the data is written.

At this time, with respect to the memory cell in which the write data is "011", since the NMOS transistors N21 and N25 are made non-conductive, the data is out of the target of the verification and the latch data of the latch circuits LQ2, LQ1, and LQ0 is held as it is. As for the other memory cells as well, since the data is out of the target of the verification, the latch data of the latch circuits LQ2, LQ1, and LQ0 is held as it is.

For a period of time during which the word line voltage is set to VVF4, only the voltage VB1 is set to the power voltage Vcc and the other voltages VB0, VB2, and VB3 are set to the ground level in a manner similar to that mentioned above. The control signal PGM_RVPC is set to the power voltage Vcc level for a predetermined period of time.

When the word line voltage is set to VVF4 and the verification is performed, if the control signal PGM_RVPC is set to the power voltage Vcc level, only in case of the write data "01x", the bit line is charged and in case of the other write data, the bit line is set to the ground level and the data is out of the target of the verification.

When the threshold voltage Vth of the memory cell in which the write data is "01x" is larger than the word line voltage VVF4 (Vth>VVF4), since no current flows in the cell, the bit line voltage does not change and the node SA is held at the power voltage Vcc. The NMOS transistors N16, N17, and N18 are held conductive.

In this state, the word line voltage is set to VVF4 and the verification and reading are performed. After the elapse of a predetermined time, the pulse-like signal φLAT0 is set to the high level.

When the threshold voltage Vth of the memory cell is larger than the word line voltage VVF4, the NMOS transistor N20 is switched to the conductive state for a period of time during which the signal φLAT0 is at the high level. In this instance, since the NMOS transistor N19 is conductive and the NMOS transistor N16 is conductive, the inversion node /Q2 of the latch circuit LQ2 is set to the low level and the node Q2 of the latch circuit LQ2 is inverted to the high level.

Consequently, when the word line voltage is set to VVF4, if the threshold voltage Vth of the memory cell in which the write data is "011" is larger than the word line voltage VVF4 (Vth>VVF4), the latch data of the latch circuits LQ2, LQ1, and LQ0 is inverted to "111". After that, upon rewriting, the bit line is set to the power voltage Vcc, the channel is boosted to the non-writing potential, and no data is written.

When the threshold voltage Vth of the memory cell in which the write data is "011" is smaller than the word line voltage VVF4 (Vth<VVF4), the NMOS transistors N16, N17, and N18 cannot be made conductive at all.

Therefore, when the threshold voltage Vth of the memory cell is smaller than the word line voltage VVF4, the NMOS transistor N20 is made conductive for a period of time during which the signal φLAT0 is at the high level, and the NMOS transistor N19 is made conductive. However, since the NMOS transistor N16 is not made conductive at all, the current enough to invert the latch circuit LQ2 cannot be supplied. Thus, the inversion of the node of the latch circuit LQ2 does not occur.

Consequently, when the word line voltage is set to VVF4, if the threshold voltage Vth of the memory cell in which the write data is "011" is smaller than the word line voltage VVF4 (Vth<VVF4), the latch data of the latch circuits LQ2, LQ1, and LQ0 does not change but is held to "011". Upon rewriting, the bit line voltage is set to the writing potential and the data is written.

At this time, with respect to the memory cell in which the write data is "010", since the NMOS transistors N19 and N23 are made non-conductive, the data is out of the target of the verification and the latch data of the latch circuits LQ2, LQ1, and LQ0 is held as it is. As for the other memory cells as well, since the data is out of the target of the verification, the data of the latch circuits LQ2, LQ1, and LQ0 is held as it is.

Subsequently, the word line voltage is set to VVF3, VVF2, and VVF1 and the verifying operation is similarly performed.

That is, when the word line voltage is set to VVF3 and the verification is performed, only when the write data is "10x", the bit line is charged. In case of the other write data, the bit line is set to the ground level and the data is out of the target of the verification. After the elapse of a predetermined time, the pulse-like signals φLAT3 and φLAT4 are sequentially set to the high level. When the threshold voltage Vth of the memory cell in which the write data is "100" is larger than the word line voltage VVF3 (Vth>VVF3), the latch data of the latch circuits LQ2, LQ1, and LQ0 is inverted to "111". After that, upon rewriting, the bit line BL0 is set to the power voltage Vcc and the channel is boosted to the non-writing potential and no data is written. When the threshold voltage Vth of the memory cell in which the write data is "100" is smaller than the word line voltage VVF3 (Vth<VVF3), the latch data of the latch circuits LQ2, LQ1, and LQ0 does not change but is held to "100". Upon rewriting, the bit line voltage is set to the writing potential and the data is written.

When the word line voltage is set to VVF2 and the verification is performed, the bit line is charged only when the write data is "10x". In case of the other write data, the bit line is set to the ground level and the data is out of the target of the verification. After the elapse of a predetermined time, the pulse-like signal φLAT2 is set to the high level. When the threshold voltage Vth of the memory cell in which the write data is "101" is larger than the word line voltage VVF2 (Vth>VVF2), the latch data of the latch circuits LQ2, LQ1, and LQ0 is inverted to "111". After that, upon rewriting, the bit line BL0 is set to the power voltage Vcc, the channel is boosted to a non-writing potential, and no data is written. When the threshold voltage Vth of the memory cell in which the write data is "101" is smaller than the word line voltage VVF2 (Vth<VVF2), the latch data of the latch circuits LQ2, LQ1, and LQ0 does not change but is held to "101". Upon rewriting, the bit line voltage is set to the writing potential and the data is written.

When the selection word line voltage is set to VVF1 and the verification is performed, only in the case where the write data is "110", the bit line is charged. In case of the other write data, the bit line is set to the ground level and the data is out of the target of the verification. After the elapse of a predetermined time, the pulse-like signal φLAT4 is set to the high level. When the threshold voltage Vth of the memory cell in which the write data is "110" is larger than the word line voltage VVF1 (Vth>VVF1), the latch data of the latch circuits LQ2, LQ1, and LQ0 is inverted to "111". After that, upon rewriting, the bit line BL is set to the power voltage Vcc, the channel is boosted to a non-writing potential, and no data is written. When the threshold voltage Vth of the memory cell in which the write data is "110" is smaller than the word line voltage VVF1 (Vth<VVF1), the latch data of the latch circuits LQ2, LQ1, and LQ0 does not change but is held to "110". Upon rewriting, the bit line voltage is set to the writing potential and the data is written.

As mentioned above, in the second embodiment of the invention, upon verification, any one of the voltages VB0, VB1, VB2, and VB3 is set to the power voltage Vcc, the other voltages are set to the ground level, the NMOS transistors (N3 and N4), (N5 and N6), (N7 and N8), and (N9, N10, and N11) are controlled in accordance with the write data, and the charge current of the bit line is supplied from one of the voltages VB0, VB1, VB2, and VB3, thereby allowing the other write data to be out of the target of the verification. That is, upon verification at the word line voltages VVF7 and WF6, by using the voltage VB0, the data except for "00x" is set to be out of the target of the verification. Upon verification at the word line voltages VVF5 and VVF4, by using the voltage VB1, the data except for "01x" is set to be out of the target of the verification. Upon verification at the word line voltages VVF3 and VVF2, by using the voltage VB2, the data except for "10x" is set to be out of the target of the verification. Upon verification at the word line voltage VVF1, by using the voltage VB3, the data except for "110" is set to be out of the target of the verification. Thus, the circuit construction upon verification is simplified.

2-4. Operation Upon Reading in the Second Embodiment

Figure 18A:
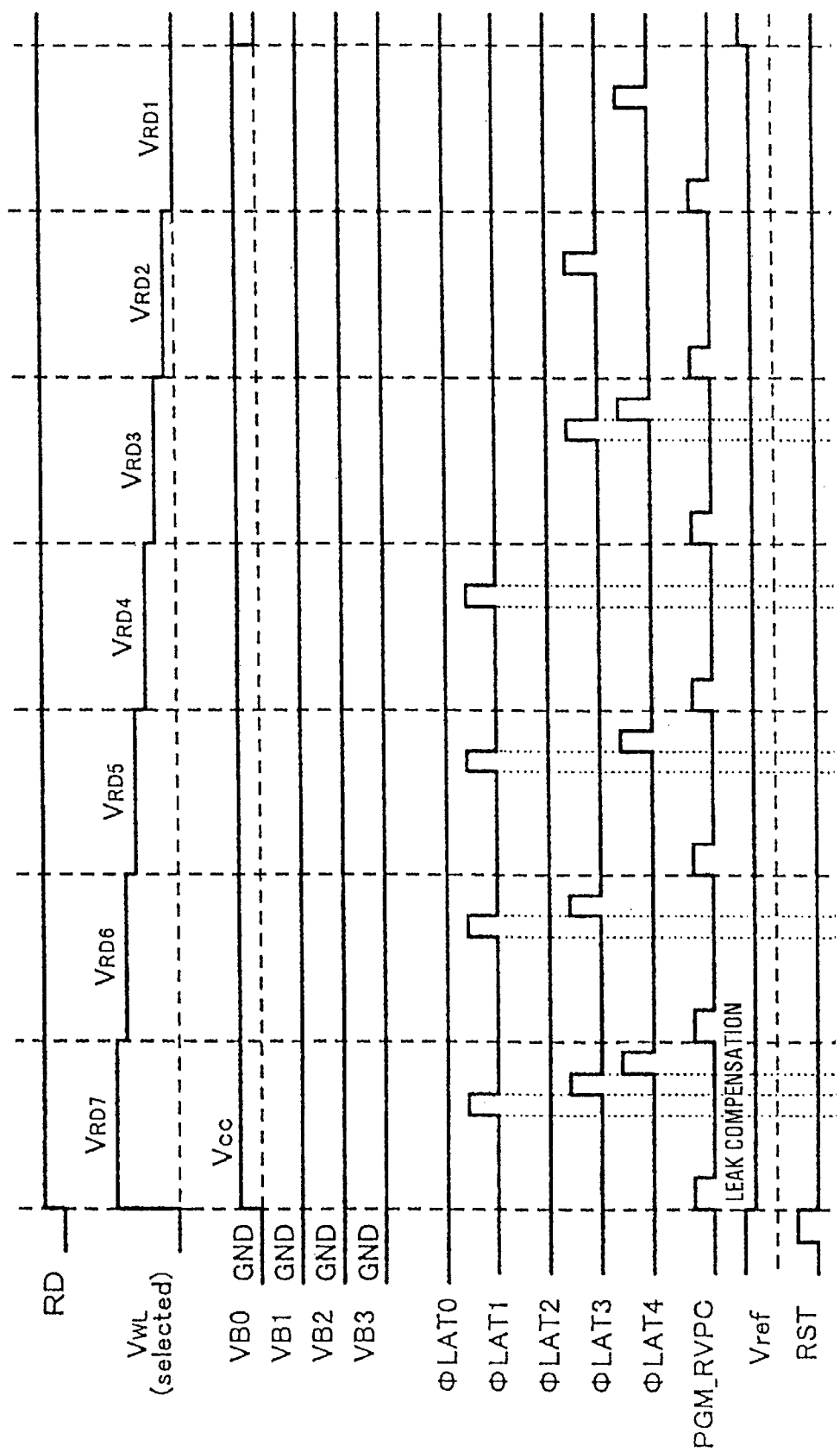
FIG. 18 is a timing chart for use in explanation upon reading in the second embodiment of the invention.
Figure 18B:
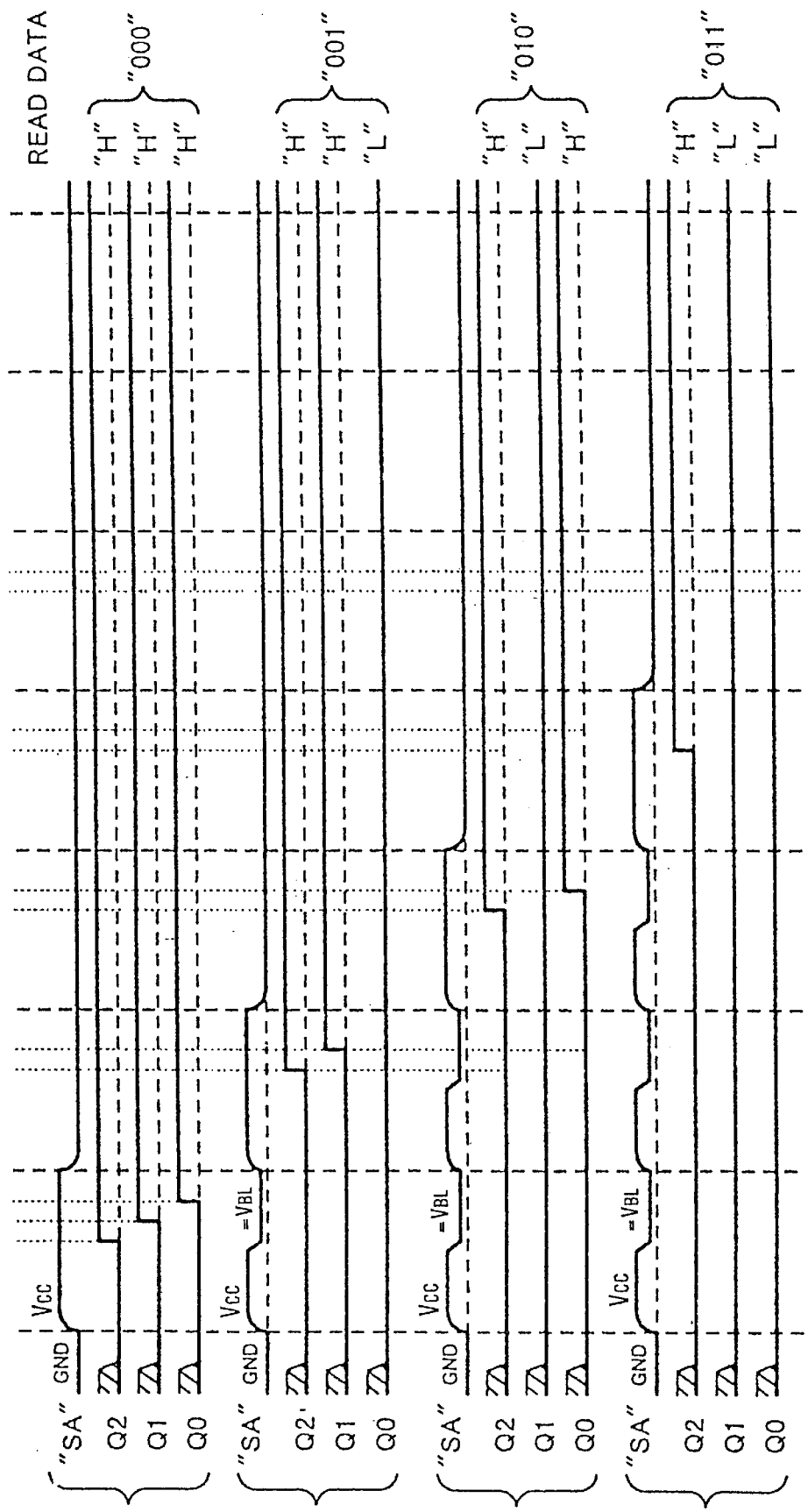
Figure 18C:
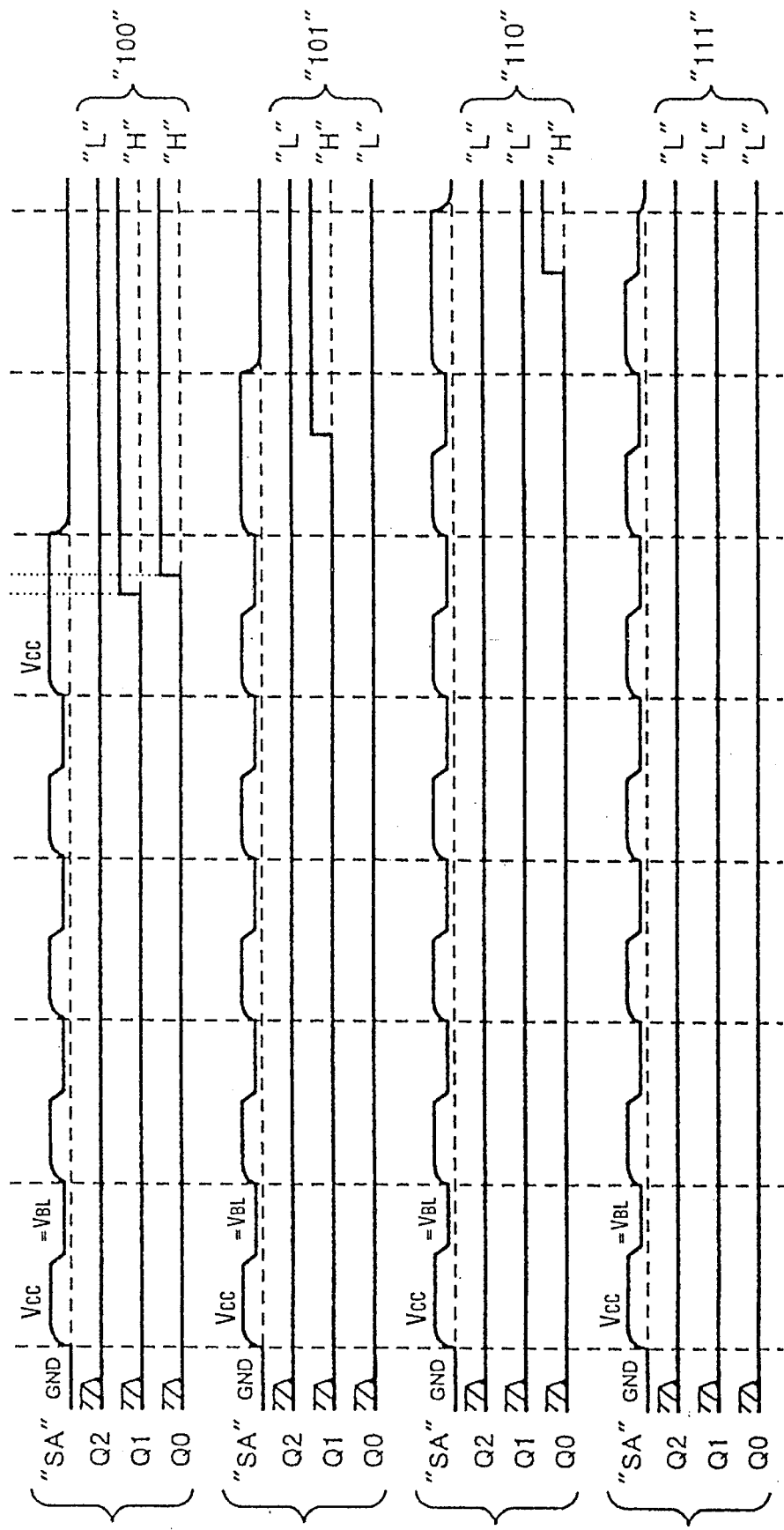

The reading operation of the second embodiment of the invention will now be described with reference to FIG. 18. In the standby mode, the control signals TRN, AiB, and AiN are at the level of (Vcc−Vth), the control signal DIS is set to the high level, the NMOS transistor N1 is made conductive, and all of the bit lines are set to the ground level.

When the reading operation is activated in this state, the control signal DIS is set to the low level and the bit line is disconnected from the ground line. When the selection bit line is, for example, the even bit line, the signal AiB is set to the P5V level and the signal AiN is set to the ground level. The odd bit line is disconnected from the latch, the control signal TRN is held at (Vcc−Vth (=VTRN)), and the voltage enough to supply the current for compensating the leakage of the bit line is applied to the control signal Vref. At the same time, the control signal RST is set to the high level, the NMOS transistors N12, N13, and N14 are made conductive, and all of the nodes Q2, Q1, and Q0 of the latch circuits LQ2, LQ1, and LQ0 are reset to "0".

The reading operation is performed by sequentially reducing the word line voltage to VRD7→VRD6→VRD5→VRD4→VRD3→VRD2→VRD1. Upon reading, the voltage VB0 is always set to the Vcc level and the voltages VB1, VB2, and VB3 are always set to the ground level as shown in FIG. 17B.

The read control signal RD is always set to the high level and the NMOS transistor N15 is always conductive for the period of time of reading.

First, the selection word line voltage is set to VRD7, the control signal PGM_RVPC is set to the power voltage Vcc, and the NMOS transistor N2 is made conductive.

When the NMOS transistors N4 and N3 are conductive, the current from the voltage VB0 flows through the NMOS transistors N4, N3, and N2 and the bit line is charged. When the reading operation is started, since all of the latch circuits LQ2, LQ1, and LQ0 are reset to "0", the inversion node /Q2 of the latch circuit LQ2 is set to "1" and the inversion node /Q1 of the latch circuit LQ1 is set to "1". Therefore, in this instance, the NMOS transistors N4 and N3 are conductive.

Thus, the current from the voltage VB0 flows through the NMOS transistors N4, N3, and N2 and all of the even bit lines are charged to (VTRN−Vth'). By cutting off the NMOS transistor HN1, all of the nodes SA are charged to Vcc by the leak compensation current. After that, the control signal PGM_RVPC is reset to the ground level.

When the threshold voltage Vth of the memory cell is larger than the word line voltage VRD7 (Vth>VRD7) as a result of the reading at the word line voltage VRD7, since no cell current flows, the node SA is held at the power voltage Vcc. In this instance, the NMOS transistors N16, N17, and N18 are made conductive. In the initial state, since all of the latch circuits LQ2, LQ1, and LQ0 are reset to "0", the NMOS transistors N21 and N25 are conductive.

After the elapse of a predetermined time, the pulse-like signals φLAT1, φLAT3, and φLAT4 are sequentially set to the high level.

When the signal φLAT1 is set to the high level, the NMOS transistor N22 is made conductive. The NMOS transistors N16 and N21 are conductive. Therefore, the inversion node /Q2 of the latch circuit LQ2 is set to "0" and the node Q2 of the latch circuit LQ2 is inverted to "1".

When the signal φLAT3 is set to the high level, the NMOS transistor N26 is made conductive. The NMOS transistors N17 and N25 are conductive. Therefore, the inversion node /Q1 of the latch circuit LQ1 is set to "0" and the node Q1 of the latch circuit LQ1 is inverted to "1".

When the signal φLAT4 is set to the high level, the NMOS transistors N27 and N28 are made conductive. The NMOS transistor N18 is conductive. Therefore, the inversion node /Q0 of the latch circuit LQ0 is set to "0" and the node Q0 of the latch circuit LQ0 is inverted to "1".

Consequently, when the threshold voltage Vth of the memory cell is larger than the word line voltage VRD7 (Vth>VRD7), the latch data of the latch circuits LQ2, LQ1, and LQ0 is inverted to "111". The read data has been inverted. The read data when the latch data is "111" is "000".

On the other hand, when the threshold voltage Vth of the memory cell is smaller than the word line voltage VRD7 (Vth<VRD7), the cell current larger than the leak compensation current flows, the bit line voltage drops, the NMOS transistor HN1 is made conductive, and redistribution of charges occurs. The voltage of the node SA is set to (VTRN−Vth') that is almost equal to the bit line voltage. Thus, the NMOS transistors N16, N17, and N18 are not made conductive at all.

After the elapse of a predetermined time, the pulse-like signals φLAT1, φLAT3, and φLAT4 are sequentially set to the high level.

When the signal φLAT1 is set to the high level, the NMOS transistor N22 is made conductive. Although the NMOS transistors N22 and N21 are conductive, since the NMOS transistor N16 is not conductive at all, a current enough to invert the latch circuit LQ2 cannot be supplied and the inversion of the node of the latch circuit LQ2 does not occur.

When the signal φLAT3 is set to the high level, the NMOS transistor N26 is made conductive. Although the NMOS transistors N26 and N25 are conductive, since the NMOS transistor N17 is not conductive at all, a current enough to invert the latch circuit LQ1 cannot be supplied and the inversion of the node of the latch circuit LQ1 does not occur.

When the signal φLAT4 is set to the high level, the NMOS transistors N27 and N28 are conductive. However, since the NMOS transistor N18 is not conductive at all, a current enough to invert the latch circuit LQ0 cannot be supplied and the inversion of the node of the latch circuit LQ0 does not occur.

Subsequently, the selection word line voltage is set to VRD6 and the control signal PGM_RVPC is set to the power voltage Vcc. The NMOS transistor N2 is made conductive.

When the selection word line voltage is set to VRD7 and the reading operation is performed at the previous time, if the inversion of the nodes of the latch circuits LQ0, LQ1, and LQ2 had not occurred, since the latch circuits LQ0, LQ1, and LQ2 are in the initial state "000", the NMOS transistors N3 and N4 are conductive. Therefore, the current from the voltage VB0 flows through the NMOS transistors N4, N3, and N2. All of the even bit lines to which the memory cells in which the threshold voltage Vth is lower than VRD7 are connected are charged to (VTRN−Vth').

On the other hand, when the selection word line voltage is set to VRD7 and the reading operation is performed at the previous time, if the inversion of the nodes of the latch circuits LQ1 and LQ2 occurred, the NMOS transistors N4 and N3 are made non-conductive. The NMOS transistors N9 and N10 are made conductive. Since the control signal RD is at the high level, the NMOS transistor N15 is made conductive and connected to the supply source of the voltage VB3. In this case, since the voltages VB1 to VB3 are at the ground level, the node SA is set to the ground level and the data is out of the target of the reading operation.

After that, the control signal PGM_RVPC is reset to the ground level. At this time, the even bit lines to which the cells in which the inversion of the node had not occurred until the previous time are coupled are charged to (VTRN−Vth'). By cutting off the NMOS transistor HN1, the node SA is charged to Vcc.

When the threshold voltage Vth of the memory cell is larger than the word line voltage VRD6 (Vth>VRD6), since no cell current flows, the node SA is held at the power voltage Vcc. In this instance, the NMOS transistors N16, N17, and N18 are made conductive.

After the elapse of a predetermined time, the pulse-like signals φLAT1 and φLAT3 are sequentially set to the high level.

When the signal φLAT1 is set to the high level, the NMOS transistor N22 is made conductive. The NMOS transistors N16 and N21 are conductive. Therefore, the inversion node /Q2 of the latch circuit LQ2 is set to "0" and the node Q2 of the latch circuit LQ2 is inverted to "1".

When the signal φLAT3 is set to the high level, the NMOS transistor N26 is made conductive. The NMOS transistors N17 and N25 are conductive. Therefore, the inversion node /Q1 of the latch circuit LQ1 is inverted to "0" and the node Q1 of the latch circuit LQ1 is inverted to "1".

Thus, when the threshold voltage Vth of the memory cell is larger than the word line voltage VRD6 (Vth>VRD6), if the inversion of the latch had not occurred until the previous time, the latch data of the latch circuits LQ2, LQ1, and LQ0 is inverted to "110". If the inversion of the latch had occurred until the previous time, the node SA is set to the ground level and the data is out of the target of the reading operation, so that the data is held. The read data has been inverted. The read data when the latch data is "110" is "001".

When the threshold voltage Vth of the memory cell is smaller than the word line voltage VRD6 (Vth<VRD6), the cell current larger than the leak compensation current flows, the bit line voltage drops, the NMOS transistor HN1 is made conductive, and redistribution of charges occurs. The voltage of the node SA is set to (VTRN−Vth') that is almost equal to the bit line voltage. Thus, the NMOS transistors N16, N17, and N18 are not made conductive at all.

After the elapse of a predetermined time, the pulse-like signals φLAT1 and φLAT3 are sequentially set to the high level.

When the signal φLAT1 is set to the high level, the NMOS transistor N22 is made conductive. Although the NMOS transistor N21 is conductive, since the NMOS transistor N16 is not conductive at all, the current enough to invert the latch circuit LQ2 cannot be supplied and the inversion of the node of the latch circuit LQ2 does not occur.

When the signal φLAT3 is set to the high level, the NMOS transistor N26 is made conductive. Although the NMOS transistor N25 is conductive, since the NMOS transistor N17 is not conductive at all, the current enough to invert the latch circuit LQ1 cannot be supplied and the inversion of the node of the latch circuit LQ1 does not occur.

When the selection word line voltage is set to VRD5, the control signal PGM_RVPC is set to the power voltage Vcc and the NMOS transistor N2 is made conductive.

If the inversion of the nodes of the latch circuits LQ1 and LQ2 had not occurred until the previous time in the reading operation, the NMOS transistors N4 and N3 are made conductive and the bit line is charged by the voltage VB0. If the inversion of the nodes of the latch circuits LQ1 and LQ2 had occurred until the previous time in the reading operation, the NMOS transistors N4 and N3 are made non-conductive. In this case, since the voltages VB1 to VB3 are at the ground level, the node SA is set to the ground level and the data is out of the target of the reading operation.

After that, the control signal PGM_RVPC is reset to the ground level. In this instance, the even bit lines as targets of the reading operation are charged to (VTRN−Vth') and by cutting off the NMOS transistor HN1, the node SA as a target of the reading operation is charged to Vcc.

When the threshold voltage Vth of the memory cell is larger than the word line voltage VRD5 (Vth>VRD5) as a result of the reading at the word line voltage VRD5, since no cell current flows, the node SA is held at the power voltage Vcc. At this time, the NMOS transistors N16, N17, and N18 are made conductive.

After the elapse of a predetermined time, the pulse-like signals φLAT1 and φLAT4 are sequentially set to the high level.

When the signal φLAT1 is set to the high level, the NMOS transistor N22 is made conductive. The NMOS transistors N16 and N21 are conductive. Therefore, the inversion node /Q2 of the latch circuit LQ2 is set to "0" and the node Q2 of the latch circuit LQ2 is inverted to "1".

When the signal φLAT4 is set to the high level, the NMOS transistors N27 and N28 are made conductive. The NMOS transistor N18 is conductive. Therefore, the inversion node /Q0 of the latch circuit LQ0 is inverted to "0" and the node Q0 of the latch circuit LQ0 is inverted to "1".

Consequently, when the threshold voltage Vth of the memory cell is larger than the word line voltage VRD5 (Vth>VRD5), if the inversion of the latch had not occurred until the previous time, the latch data of the latch circuits LQ2, LQ1, and LQ0 is inverted to "101". If the inversion of the latch had occurred until the previous time, the data is held. The read data has been inverted. The read data when the latch data is "101" is "010".

When the threshold voltage Vth of the memory cell is smaller than the word line voltage VRD5 (Vth<VRD5), the cell current larger than the leak compensation current flows, the bit line voltage drops, the NMOS transistor HN1 is made conductive, and redistribution of charges occurs. The voltage of the node SA is set to (VTRN−Vth') that is almost equal to the bit line voltage. Thus, the NMOS transistors N16, N17, and N18 are not made conductive at all.

After the elapse of a predetermined time, the pulse-like signals φLAT1 and φLAT4 are sequentially set to the high level.

When the signal φLAT1 is set to the high level, the NMOS transistor N22 is made conductive. Although the NMOS transistor N21 is conductive, the NMOS transistor N16 is not made conductive at all. Therefore, the current enough to invert the latch circuit LQ2 cannot be supplied. The inversion of the node of the latch circuit LQ2 does not occur.

When the signal φLAT4 is set to the high level, the NMOS transistors N27 and N28 are made conductive. However, the NMOS transistor N18 is not made conductive at all. Therefore, the current enough to invert the latch circuit LQ0 cannot be supplied. The inversion of the node of the latch circuit LQ0 does not occur.

Subsequently, the selection word line voltage is set to VRD4 and the reading operation is performed in a manner similar to that mentioned above. After the elapse of a predetermined time, the pulse-like signal φLAT1 is set to the high level.

If the inversion of the data in the latch circuit had not occurred until the previous time, when the threshold voltage Vth of the memory cell is larger than the word line voltage VRD4 (Vth>VRD4), since no cell current flows, the node SA is held at the power voltage Vcc. In this instance, the NMOS transistors N16, N17, and N18 are made conductive.

When the signal φLAT1 is set to the high level, the NMOS transistor N22 is made conductive. The NMOS transistors N16 and N21 are conductive. Therefore, the inversion node /Q2 of the latch circuit LQ2 is set to "0" and the node Q2 of the latch circuit LQ2 is inverted to "1".

Consequently, when the threshold voltage Vth of the memory cell is larger than the word line voltage VRD4 (Vth>VRD4), if the inversion of the latch had not occurred until the previous time, the latch data of the latch circuits LQ2, LQ1, and LQ0 is inverted to "100". If the inversion of the latch had occurred until the previous time, the data is held. The read data has been inverted. The read data when the latch data is "100" is "011".

When the threshold voltage Vth of the memory cell is smaller than the word line voltage VRD4 (Vth<VRD4), the cell current larger than the leak compensation current flows, the bit line voltage drops, the NMOS transistor HN1 is made conductive, and redistribution of charges occurs. The voltage of the node SA is set to (VTRN−Vth') that is almost equal to the bit line voltage. Thus, the NMOS transistors N16, N17, and N18 are not made conductive at all.

When the signal φLAT1 is set to the high level, the NMOS transistor N22 is made conductive. Although the NMOS transistor N21 is conductive, the NMOS transistor N16 is not made conductive at all. Therefore, the inversion of the node of the latch circuit LQ2 does not occur.

In a manner similar to the above, the reading operation is performed. That is, the selection word line voltage is set to VRD3 and the reading operation is performed. After the elapse of a predetermined time, the pulse-like signals φLAT3 and φLAT4 are sequentially set to the high level. When the threshold voltage Vth of the memory cell is larger than the word line voltage VRD3 (Vth>VRD3), if the inversion of the latch had not occurred until the previous time, the latch data of the latch circuits LQ2, LQ1, and LQ0 is inverted to "011". The read data has been inverted. The read data when the latch data is "011" is "100". When the threshold voltage Vth of the memory cell is smaller than the word line voltage VRD3, even if the signals φLAT3 and φLAT4 are set to the high level, the current enough to invert the latch circuits LQ1 and LQ0 cannot be supplied and the inversion of the node of the latch circuit LQ0 does not occur.

Subsequently, the selection word line voltage is set to VRD2 and the reading operation is performed. After the elapse of a predetermined time, the pulse-like signal φLAT3 is set to the high level. When the threshold voltage Vth of the memory cell is larger than the word line voltage VRD2 (Vth>VRD2), if the inversion of the latch had not occurred until the previous time, the latch data of the latch circuits LQ2, LQ1, and LQ0 is inverted to "010". The read data has been inverted. The read data when the latch data is "010" is "101". When the threshold voltage Vth of the memory cell is smaller than the word line voltage VRD2, even if the signal φLAT3 is set to the high level, the current enough to invert the latch circuit LQ1 cannot be supplied and the inversion of the node of the latch circuit LQ1 does not occur.

Subsequently, the selection word line voltage is set to VRD1 and the reading operation is performed. After the elapse of a predetermined time, the pulse-like signal φLAT4 is set to the high level. When the threshold voltage Vth of the memory cell is larger than the word line voltage VRD1 (Vth>VRD1), the latch data of the latch circuits LQ2, LQ1, and LQ0 is inverted to "001". The read data has been inverted. The read data when the latch data is "001" is "110". When the threshold voltage Vth of the memory cell is smaller than the word line voltage VRD1, even if the signal φLAT4 is set to the high level, the current enough to invert the latch circuit LQ0 cannot be supplied and the inversion of the node of the latch circuit LQ0 does not occur.

The selection word line voltages are set to VRD7 to VRD1. If the inversion of the latch at any of the above voltages did not occur, the data of the latch circuits LQ2, LQ1, and LQ0 is held to "000". When the latch data is "000", the read data is "111".

In the embodiment as mentioned above, upon reading, if the inversion of the data in the latch circuit had occurred until the previous time, the data is out of the target of the reading operation. Only when the inversion of the data in the latch circuit had not occurred until the previous time in the reading operation, the data is read out. With the above construction, the circuit scale is reduced.

3. Third Embodiment

Figure 19:
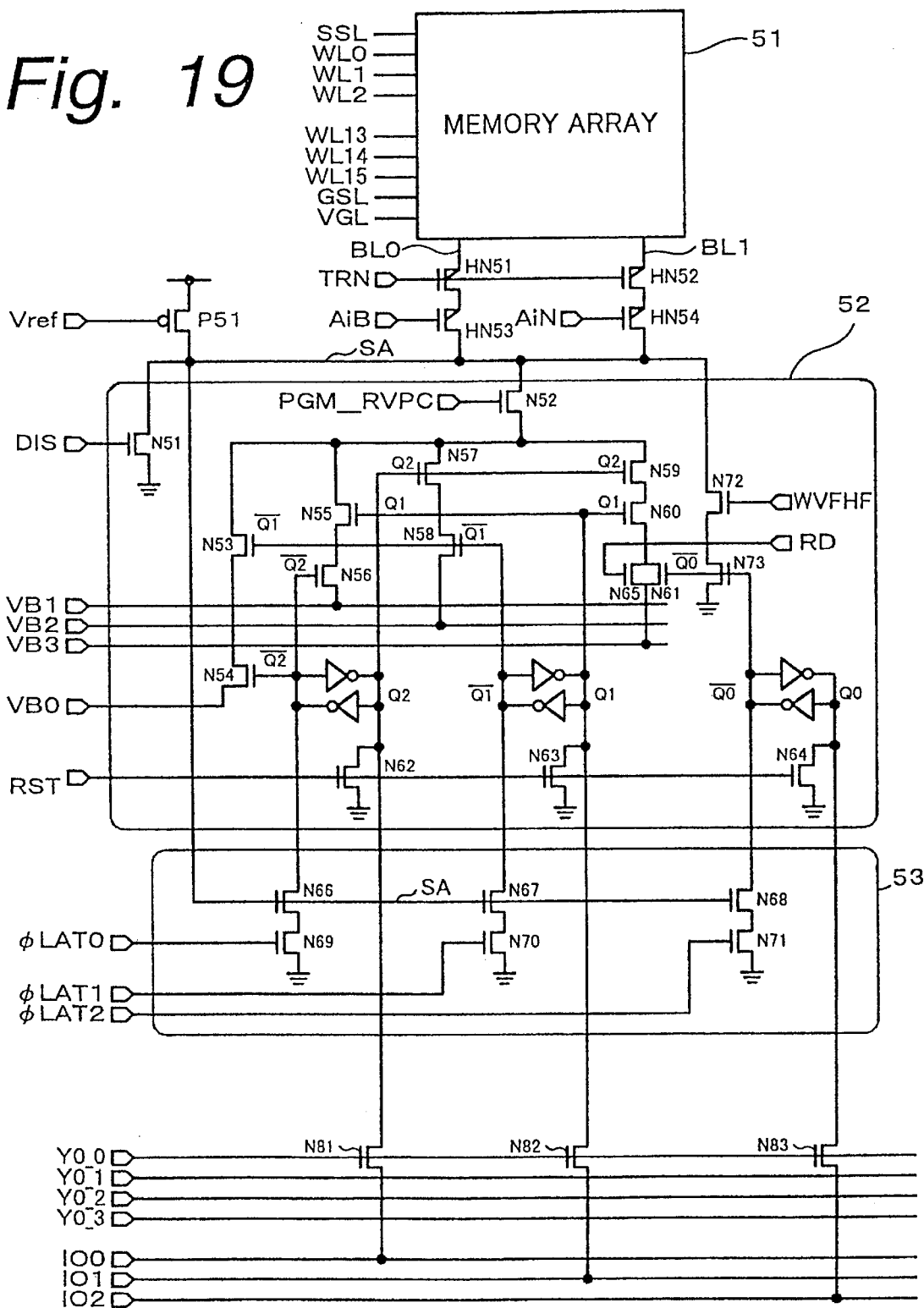
FIG. 19 is a circuit diagram showing the third embodiment of the invention.

FIG. 19 shows the third embodiment of a non-volatile semiconductor memory device according to the invention. The non-volatile semiconductor memory device relates to the case where the storing multivalue level corresponds to the octenary value in a manner similar to the foregoing second embodiment.

In the above second embodiment, whether the bit line is charged or not upon verification is controlled in accordance with the latch data set in the latch circuits LQ2 and LQ1 except for the data of the latch circuit LQ0 of the least significant bit, and the verification is performed. As for the latch circuit LQ0 corresponding to the data of the least significant bit, the data of the node Q0 and the data of the inversion node /Q0 are supplied to the gate circuits (N19 and N23) and (N21 and N25). On the basis of a discrimination result about whether the least significant bit is equal to "1" or "0" upon verification, whether the inversion of the node of the latch circuit is inhibited or not is set, thereby setting whether the verification is out of the target or not.

On the other hand, in the third embodiment, on the basis of a discrimination result about whether the least significant bit is equal to "1" or "0" upon verification by a signal WVFHF, the execution of the discharge of the bit line is controlled, thereby setting whether the verification is out of the target or not. In the third embodiment, since the gate circuits (N19 and N23) and (N21 and N25) which are controlled by the data of the node Q0 of the latch circuit LQ0 as data of the least significant bit and the data of the inversion node /Q0 are unnecessary, the circuit scale can be further reduced.

3-1. Whole Construction of the Third Embodiment

According to the third embodiment, in a manner similar to the foregoing second embodiment, a memory device comprises: a memory array 51; a bit line voltage generating circuit 52; and a read/verify control circuit 53.

In a manner similar to the second embodiment, the memory array 51 is constructed by the memory strings A0 and A1 in which memory cells are arranged in a matrix form and connected to the common word lines WL0 to WL15.

The bit line voltage generating circuit 52 is constructed by the latch circuits LQ2, LQ1, and LQ0 in which all inputs of NMOS transistors N51 to N64, N72, and N73 and inverters are coupled and all outputs of them are coupled. The supply lines of the voltages VB0, VB1, VB2, and VB3 are led out from the bit line voltage generating circuit 52.

Upon writing, a bit line voltage according to the write data is generated by the bit line voltage generating circuit 52 and supplied to the memory array 51. Upon verification, the storing nodes Q2, Q1, and Q0 of the latch circuits LQ2, LQ1, and LQ0 of the bit line voltage generating circuit 52 are set to "111" when the data is sufficiently written into the memory cell of the memory array 51. Upon reading, the threshold voltage of the memory cell of the memory array 51 is detected and the data is read out. At this time, the read data is stored into the storing nodes Q0, Q1, and Q2 of the latch circuits LQ0, LQ1, and LQ2.

The read/verify control circuit 53 is constructed by NMOS transistors N66 to N71. Upon reading or verification, the read/verify control circuit 53 controls states of the latch circuits LQ2, LQ1, and LQ0. Supply lines of the signals φLAT0, φLAT1, and φLAT2 are led out from the read/verify control circuit 53 and pulse-like signals are supplied. Gate electrodes of the NMOS transistors N66, N67, and N68 of the read/verify control circuit 53 are connected to the node SA. The node SA becomes a node to detect the threshold voltage of the memory cell of the memory array 51.

A serial connection of NMOS transistors HN51 and HN53 of a high withstanding voltage is provided between the node SA and the bit line BL0. A serial connection of NMOS transistors HN52 and HN54 of a high withstanding voltage is provided between the node SA and the bit line BL1. The address decoding signal AiB is supplied to a gate electrode of the NMOS transistor HN53. The address decoding signal AiN is supplied to a gate electrode of the NMOS transistor HN54. The control signal TRN is supplied to gate electrodes of the NMOS transistors HN51 and HN52.

The NMOS transistor N51 is connected between the node SA and the ground line GND. A PMOS transistor P51 is connected between the node SA and the supply line of the power voltage Vcc. The control signal DIS is supplied to the gate electrode of the NMOS transistor N51. The signal Vref is supplied to a gate electrode of the PMOS transistor P51.

The NMOS transistor N52 is provided between the node SA and the bit line voltage generating circuit 52. That is, a drain of the NMOS transistor N52 is connected to the node SA. A source of the NMOS transistor N52 is connected to drains of the NMOS transistors N53, N55, N57, and N59. The control signal PGM_RVPC is supplied to the gate electrode of the NMOS transistor N52.

The NMOS transistors N53 and N54 are serially connected between the source of the NMOS transistor N52 and the supply line of the voltage VB0. The NMOS transistors N55 and N56 are serially connected between the source of the NMOS transistor N52 and the supply line of the voltage VB1. The NMOS transistors N57 and N58 are serially connected between the source of the NMOS transistor N52 and the supply line of the voltage VB2. The NMOS transistors N59, N60, and N61 are serially connected between the source of the NMOS transistor N52 and the supply line of the voltage VB3. The NMOS transistor N65 is connected in parallel to the NMOS transistor N61.

Further, the NMOS transistors N72 and N73 are serially connected between the node SA and the ground line. A gate electrode of the NMOS transistor N72 is connected to a supply line of the signal WVFHF. A gate electrode of the NMOS transistor N73 is connected to a gate electrode of the NMOS transistor N61.

The latch circuits LQ2, LQ1, and LQ0 have the storing nodes Q2, Q1, and Q0 and their inversion storing nodes /Q2, /Q1, and /Q0, respectively. "/" denotes a bar indicative of the inversion.

The inversion storing node /Q2 of the latch circuit LQ2 is connected to gate electrodes of the NMOS transistors N54 and N56. The storing node Q2 of the latch circuit LQ2 is connected to gate electrodes of the NMOS transistors N57 and N59.

The inversion storing node /Q1 of the latch circuit LQ1 is connected to gate electrodes of the NMOS transistors N53 and N58. The storing node Q1 of the latch circuit LQ1 is connected to gate electrodes of the NMOS transistors N55 and N60.

The inversion storing node /Q0 of the latch circuit LQ0 is connected to the gate electrodes of the NMOS transistors N61 and N73. A supply line of the control signal RD is connected to a gate electrode of an NMOS transistor N65 connected in parallel to the NMOS transistor N61.

The NMOS transistors N62, N63, and N64 are connected between the storing node Q2 of the latch circuit LQ2 and the ground line, between the storing node Q1 of the latch circuit LQ1 and the ground line, and between the storing node Q0 of the latch circuit LQ0 and the ground line, respectively. Gate electrodes of the NMOS transistors N62, N63, and N64 are connected to the supply line of the reset signal RST, respectively.

In the read/verify control circuit 53, the gate electrodes of the NMOS transistors N66, N67, and N68 are connected to the node SA. A drain of the NMOS transistor N66 is connected to the inversion storing node /Q2 of the latch circuit LQ2. A drain of the NMOS transistor N67 is connected to the inversion storing node /Q1 of the latch circuit LQ1. A drain of the NMOS transistor N68 is connected to the inversion storing node /Q0 of the latch circuit LQ0.

The NMOS transistor N69 is con ted between a source of the NMOS transistor N66 and the ground line. The NMOS transistor N70 is connected between a source of the NMOS transistor N67 and the ground line. The NMOS transistor N71 is connected between the NMOS transistor N68 and the ground line.

The supply lines of the signals φLAT0, φLAT1, and φLAT2 are led out from the read/verify control circuit 53. A gate electrode of the NMOS transistor N69 is connected to the supply line of the signal φLAT0. A gate electrode of the NMOS transistor N70 is connected to the supply line of the signal φLAT1. A gate electrode of the NMOS transistor N71 is connected to the supply line of the signal φLAT2.

An NMOS transistor N81 is connected between the storing node Q2 of the latch circuit LQ2 and the bus line IO0. An NMOS transistor N82 is connected between the storing node Q1 of the latch circuit LQ1 and the bus line IO1. An NMOS transistor N83 is connected between the storing node Q0 of the latch circuit LQ0 and the bus line IO2.

Gate electrodes of the NMOS transistors N81, N82, and N83 serving as column gates are connected to the supply line of the signal Y0_0.

3-2. Operation Upon Writing in the Third Embodiment

The writing operation of the third embodiment of the invention will now be described. The fundamental operation upon writing is similar to that in the foregoing second embodiment. That is, in the standby mode, the signal PGM_RVPC is set to the low level, the NMOS transistor N52 is held non-conductive, and the bit lines BL0 and BL1 are disconnected from the latch circuit.

The signal DIS is set to the high level, the signals TRN, AiB, and AiN are set to (Vcc−Vth), and the bit lines BL0 and BL1 are set to the ground level.

When the writing operation is activated in this state, the signal Y0_0 is set to the high level and the write data is fetched and held into the latch circuits LQ2, LQ1, and LQ0.

After that, the signal DIS is switched to the low level and the bit lines BL0 and BL1 are disconnected from the ground line. The signals TRN, AiB, and AiN are set to the high level (for example, passing voltage P5V upon reading) that is equal to or higher than Vcc. The signal Vref is set to the low level and the PMOS transistor P51 is held conductive. Thus, all of the bit lines BL0 and BL1 are charged to the power voltage Vcc.

In this instance, the signals φLAT0 to φLAT2 to control the reading/verifying operations are set to the ground level so as not to exercise an influence on the latch data. The selection signal supply line SSL connected to the gate electrode of the selection gate on the drain side of the memory cell is set to the power voltage Vcc.

Upon writing, the address on the side which is not selected by the address signal, for example, AiN is set to the ground level and the signal PGM_RVPC is set to the high level. Voltages are set in a manner such that the voltage VB3 is set to the highest voltage, the voltage VB2 is set to the second highest voltage, the voltage VB1 is set to the third highest voltage, and the voltage VB0 is set to the ground level.

When the write data is "00x" (x is 0 or 1), the inversion nodes /Q2 and /Q1 of the latch circuits LQ2 and LQ1 are at the high level. Thus, the NMOS transistors N53 and N54 are made conductive and the bit line BL0 is set to the voltage VB0 and set to the ground level.

When the write data is "01x", the NMOS transistors N55 and N56 are made conductive and the bit line BL0 is set to the voltage VB1.

When the write data is "10x", the NMOS transistors N57 and N58 are made conductive and the bit line BL0 is set to the voltage VB2.

When the write data is "110", the NMOS transistors N59, N60, and N61 are made conductive. When the NMOS transistors N59, N60, and N61 are made conductive, the bit line BL0 is set to the voltage VB3.

When the write data is "111", since any of the paths from the voltages VB0 to VB3 is disconnected from the bit line, the voltage of the bit line is held at the Vcc level.

By the above processes, after the selection bit line BL0 was set to the voltage according to the write data, the word line is set to a writing voltage, the non-selection word line is set to a write passing voltage, and the data is written.

3-3. Operation Upon Verification Reading in the Third Embodiment

Figure 20B:
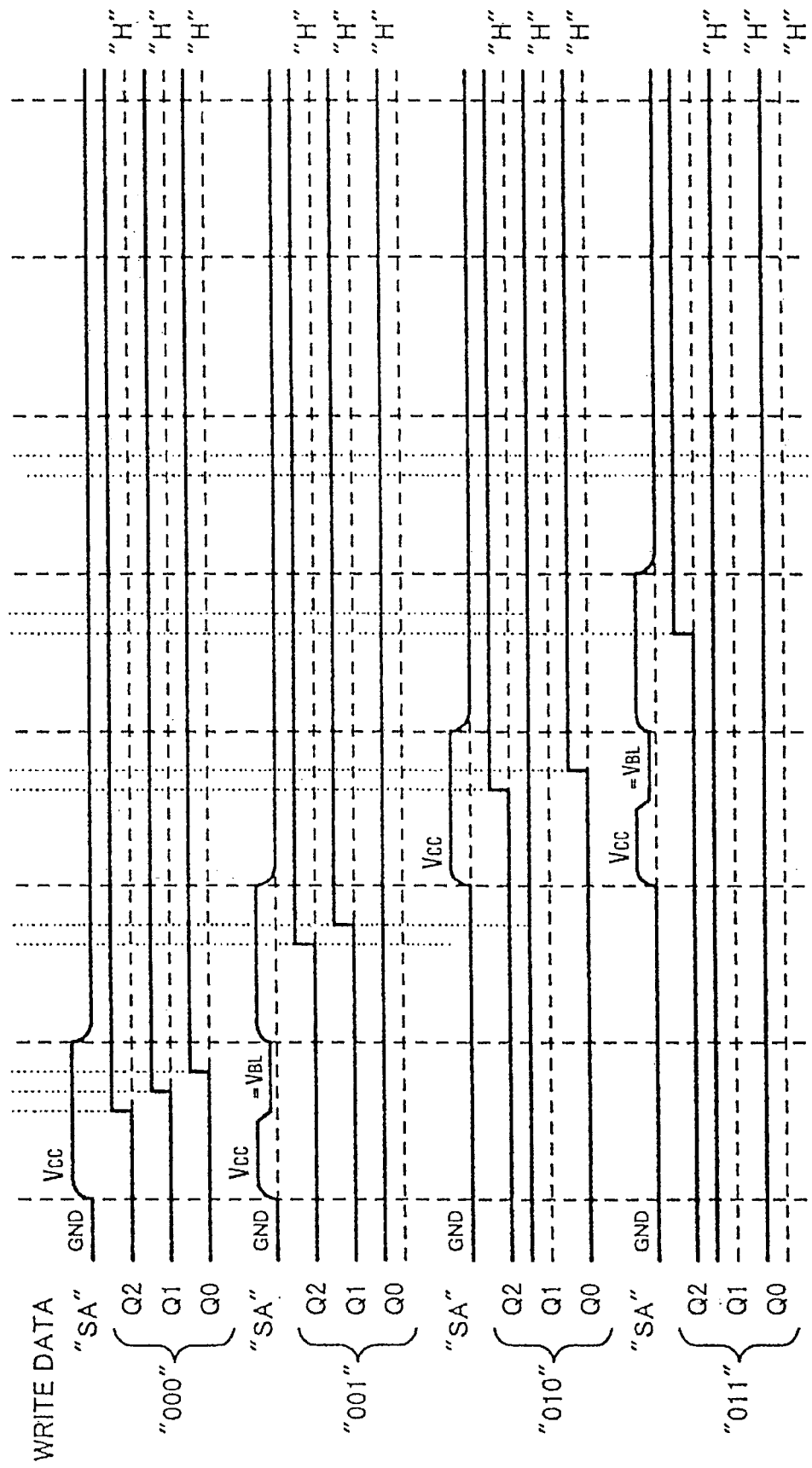
FIG. 20 is a timing chart for use in explanation upon verification in the third embodiment of the invention.
Figure 20C:
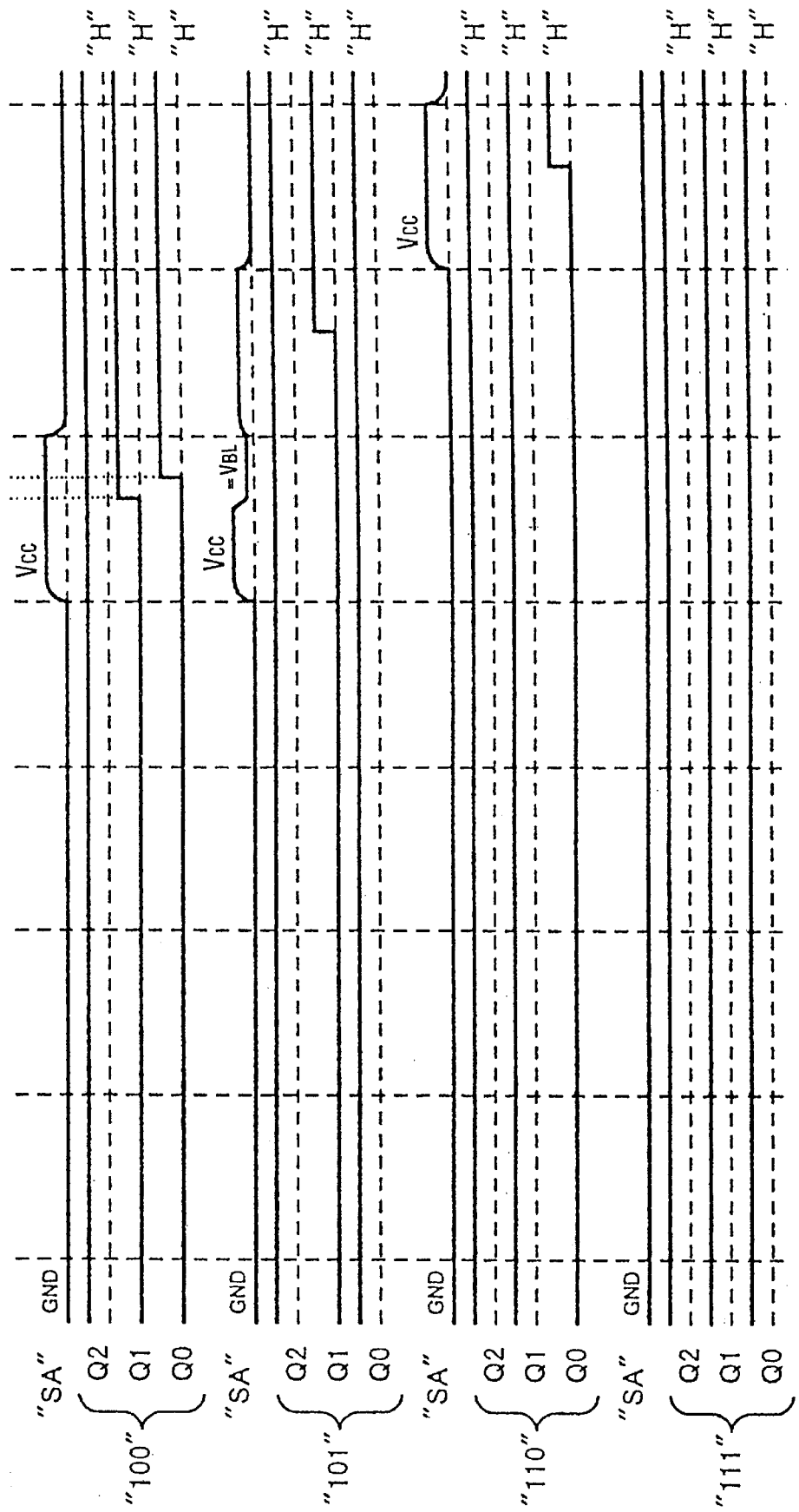

The verifying and reading operations in the third embodiment of the invention will now be described with reference to a timing chart of FIG. 20.

In the verifying and reading operations, the voltage sources VB0 to VB3 are set as shown in FIG. 17A in accordance with the word line voltage in a manner similar to the foregoing second embodiment.

That is, for a period of time during which the word line voltage is set to VVF7 and for a period of time during which the word line voltage is set to VVF6, the voltage VB0 is set to the power voltage Vcc and the other voltages VB1, VB2, and VB3 are set to the ground level.

For a period of time during which the word line voltage is set to VVF5 and for a period of time during which the word line voltage is set to VVF4, the voltage VB1 is set to the power voltage Vcc and the other voltages VB0, VB2, and VB3 are set to the ground level.

For a period of time during which the word line voltage is set to VVF3 and for a period of time during which the word line voltage is set to VVF2, the voltage VB2 is set to the power voltage Vcc and the other voltages VB0, VB1, and VB3 are set to the ground level.

For a period of time during which the word line voltage is set to VVF1, the voltage VB3 is set to the power voltage Vcc and the other voltages VB0, VB1, and VB2 are set to the ground level.

The control signal WVFHF is set to the low level for a period of time during which the word line voltage is set to VVF7, VVF5, VVF3, and VVF1. The control signal WVFHF is set to the high level for a period of time during which the word line voltage is set to VVF6, VVF4, and VVF2 (except for the precharge time).

Upon verification, the control signal RD is always set to the low level and the NMOS transistor N65 is non-conductive during the verifying operation.

Prior to the verification, for a predetermined period of time, the control signal DIS is set to the high level, the signals AiB and AiN are set to P5V, and all of the bit lines BL0 and BL1 are set to the ground level.

Subsequently, the control signal DIS is reset to the low level and, after that, the side that is not selected by address "Ai", for example, the signal AiN is set to the ground level and the bit line BL1 is disconnected from the latch circuit. To clamp the bit line, the control signal TRN is set to VTRN (VTRN=Vcc−Vth). The voltage enough to supply a leak compensation current (<<1 μA) of the bit line is applied to the control signal Vref.

First, the case where the selection word line voltage is set to VVF7 will be described. While the word line voltage is set to VVF7, only the voltage VB0 is set to the power voltage Vcc and the other voltages VB1, VB2, and VB3 are set to the ground level. For a predetermined period of time, the control signal PGM_RVPC is set to the power voltage Vcc level and the NMOS transistor N52 is made conductive.

When the NMOS transistors N53 and N54 are conductive, the bit line is charged to (VTRN−Vth') by the power source Vcc from the voltage VB0. After the charging, by cutting off the NMOS transistor HN51 of the N channel, the node SA is charged to Vcc. Since the other voltages VB1, VB2, and VB3 are at the ground level, if the NMOS transistors N53 and N54 are non-conductive, the bit line is not charged but held at the ground level.

As mentioned above, when the word line voltage is set to VVF7 and the verification in which the write data is "000" is performed, only when the NMOS transistors N53 and N54 are conductive, the bit line is charged. The NMOS transistors N53 and N54 are conductive only when the inversion node /Q2 of the latch circuit LQ2 is at the high level and the inversion node /Q1 of the latch circuit LQ1 is at the high level, and they are made conductive when the write data is "00x".

Consequently, only when the write data is "00x", the bit line is charged. In case of the other write data, the bit line is set to the ground level and the data is out of the target of the verification.

In this state, the control signal PGM_RVPC is set to the ground level and the selection bit line BL0 is disconnected from the bit line voltage generating circuit 52.

When the word line voltage is set to VVF7 and the verification is performed, the control signal WVFHF is set to the low level. After the elapse of a predetermined time, the pulse-like signals φLAT0, φLAT1, and φLAT2 are sequentially set to the high level.

When the threshold voltage Vth of the memory cell is larger than the word line voltage VVF7 (Vth>VVF7), since no current flows in the cell, the bit line voltage does not change and the node SA is held at the power voltage Vcc. The NMOS transistors N66, N67, and N68 are held conductive. In this case, since the node is set to the target of the verification only when the write data is "00x", the following two cases are considered.

<1> Case where the write data is "000" and the threshold voltage Vth of the memory cell exceeds the word line voltage VVF7 (Vth>VVF7).

<2> Case where the write data is "001" and the threshold voltage Vth of the memory cell exceeds the word line voltage VVF7 (Vth>VVF7).

However, if the threshold voltage Vth of the memory cell in which the write data is "001" exceeds the word line voltage VVF7, (Vth>VVF6) is obtained in the verification when the word line voltage is set to VVF6. It is determined that the data has sufficiently been written. The write data in the latch circuit becomes "111" and the subsequent data is not written. Therefore, it is impossible.

The verifying operation with respect to the case of <1> will be described. For a period of time during which the signal φLAT0 is at the high level, the NMOS transistor N69 is switched to the conductive state. In this instance, since the NMOS transistor N66 is conductive, the inversion node /Q2 of the latch circuit LQ2 is set to the low level and the node Q2 of the latch circuit LQ2 is inverted to the high level.

For a period of time during which the signal φLAT1 is at the high level, the NMOS transistor N70 is switched to the conductive state. In this instance, since the NMOS transistor N67 is conductive, the inversion node /Q1 of the latch circuit LQ1 is set to the low level and the node Q1 of the latch circuit LQ1 is inverted to the high level.

For a period of time during which the signal φLAT2 is at the high level, the NMOS transistor N71 is switched to the conductive state. In this instance, since the NMOS transistor N68 is conductive, the inversion node /Q0 of the latch circuit LQ0 is set to the low level and the node Q0 of the latch circuit LQ0 is inverted to the high level.

Consequently, when the word line voltage VVF7 is set, if the threshold voltage Vth of the memory cell in which the write data is "000" is larger than the word line voltage VVF7 (Vth>VVF7), the latch data of the latch circuits LQ2, LQ1, and LQ0 is inverted to "111". After that, upon rewriting, the bit line BL0 is set to the power voltage Vcc and the channel is boosted to the non-writing potential and no data is written.

On the other hand, when the threshold voltage Vth of the memory cell is smaller than the word line voltage VVF7 (Vth<VVF7), a cell current larger than the leak compensation current flows, the bit line voltage drops, the NMOS transistor HN51 is turned on, and redistribution of charges occurs. The electric potential of the node SA is set to (VTRN−Vth') that is almost equal to the bit line voltage. The NMOS transistors N66, N67, and N68 cannot be made conductive at all.

In this case, the following two cases are considered.

<3> Case where the write data is "000" and the threshold voltage Vth of the memory cell is smaller than the word line voltage VVF7 (Vth<VVF7).

<4> Case where the write data is "001" and the threshold voltage Vth of the memory cell is smaller than the word line voltage VVF7 (Vth<VVF7).

In those cases, for a period of time during which the signal φLAT0 is at the high level, although the NMOS transistor N69 is conductive, the NMOS transistor N66 is not made conductive at all, so that the current enough to invert the latch circuit LQ2 cannot be supplied. Therefore, the inversion of the node of the latch circuit LQ2 does not occur.

For a period of time during which the signal φLAT1 is at the high level, although the NMOS transistor N70 is conductive, the NMOS transistor N67 is not made conductive at all, so that the current enough to invert the latch circuit LQ1 cannot be supplied. Therefore, the inversion of the node of the latch circuit LQ1 does not occur.

For a period of time during which the signal φLAT2 is at the high level, although the NMOS transistor N71 is conductive, the NMOS transistor N68 is not made conductive at all, so that the current enough to invert the latch circuit LQ0 cannot be supplied. Therefore, the inversion of the node of the latch circuit LQ0 does not occur.

Consequently, when the word line voltage is set to VVF7, if the threshold voltage Vth of the memory cell in which the write data is "000" is smaller than the word line voltage VVF7 (Vth<VVF7), the latch data of the latch circuits LQ2, LQ1, and LQ0 does not change but is held to "000". Upon rewriting, the bit line voltage is set to the writing potential and the data is written.

The case where the selection word line voltage is set to VVF6 will now be described. For a period of time during which the word line voltage is set to VVF6, in a manner similar to the case of the verification of "000", only the voltage VB0 is set to the power voltage Vcc and the other voltages VB1, VB2, and VB3 are set to the ground level. For a predetermined period of time, the control signal PGM RVPC is set to the power voltage Vcc level and the NMOS transistor N52 is made conductive.

At this time, in a manner similar to the above, with respect to only the memory cell in which the write data is "00x", the bit line is charged. In case of the other write data, the bit line is set to the ground level and the data is out of the verification.

When the word line voltage is set to VVF6, the control signal WVFHF is set to the high level and the NMOS transistor N72 is made conductive.

In this instance, as for the memory cell in which the write data is "000", the inversion node /Q0 of the latch circuit LQ0 is set to the high level and the NMOS transistor N73 is made conductive. Therefore, the node SA is set to the ground level through the NMOS transistors N72 and N73. Thus, as for the memory cell in which the write data is "000", the data is out of the target of the verification.

After the elapse of a predetermined time, the pulse-like signals φLAT0 and φLAT1 are sequentially set to the high level.

When the threshold voltage Vth of the memory cell is larger than the word line voltage VVF6 (Vth>VVF6), since no current flows in the cell, the bit line voltage does not change. The node SA is held at the power voltage Vcc. The NMOS transistors N66, N67, and N68 are held conductive. In this case, only when the write data is "001", the data becomes the target of the verification.

For a period of time during which the signal φLAT0 is at the high level, the NMOS transistor N69 is switched to the conductive state. In this instance, since the NMOS transistor N66 is conductive, the inversion node /Q2 of the latch circuit LQ2 is set to the low level and the node Q2 of the latch circuit LQ2 is inverted to the high level.

For a period of time during which the signal φLAT1 is at the high level, the NMOS transistor N70 is switched to the conductive state. In this instance, since the NMOS transistor N67 is conductive, the inversion node /Q1 of the latch circuit LQ1 is set to the low level and the node Q1 of the latch circuit LQ1 is inverted to the high level.

Consequently, when the word line voltage is set to VVF6, if the threshold voltage Vth of the memory cell in which the write data is "001" is larger than the word line voltage VVF6 (Vth>VVF6), the latch data of the latch circuits LQ2, LQ1, and LQ0 is inverted to "111". After that, upon rewriting, the bit line BL0 is set to the power voltage Vcc and the channel is boosted to the non-writing potential and no data is written.

When the threshold voltage Vth of the memory cell is smaller than the word line voltage VVF6, a cell current larger than the leak compensation current flows, the bit line voltage drops, the NMOS transistor HN51 is turned on, and redistribution of charges occurs. The electric potential of the node SA is set to (VTRN−Vth') that is almost equal to the bit line voltage. When the electric potential of the node SA is equal to (VTRN−Vth'), the NMOS transistors N66, N67, and N68 cannot be made conductive at all.

For a period of time during which the signal φLAT0 is at the high level, the NMOS transistor N69 is made conductive. However, since the NMOS transistor N66 is not made conductive at all, the current enough to invert the latch circuit LQ2 cannot be supplied. Thus, the inversion of the node of the latch circuit LQ2 does not occur.

For a period of time during which the signal φLAT1 is at the high level, the NMOS transistor N70 is made conductive. However, since the NMOS transistor N67 is not made conductive at all, the current enough to invert the latch circuit LQ1 cannot be supplied. Thus, the inversion of the node of the latch circuit LQ1 does not occur.

Consequently, when the word line voltage is set to VVF6, if the threshold voltage Vth of the memory cell in which the write data is "001" is smaller than the word line voltage VVF6 (Vth<VVF6), the latch data of the latch circuits LQ2, LQ1, and LQ0 does not change but is held to "001". Upon rewriting, the bit line voltage is set to the writing potential and the data is written.

The case where the selection word line voltage is set to VVF5 will now be described. For a period of time during which the selection word line voltage is set to VVF5, only the voltage VB1 is set to the power voltage Vcc and the other voltages VB0, VB2, and VB3 are set to the ground level. For a predetermined period of time, the control signal PGM RVPC is set to the power voltage Vcc level and the NMOS transistor N52 is made conductive.

If the NMOS transistors N55 and N56 are conductive, the bit line is charged to (VTRN−Vth') by the power source Vcc from the voltage VB1. After it was charged, by cutting off the NMOS transistor HN51, the node SA is charged to Vcc. Since the other voltages VB0, VB2, and VB3 are at the ground level, if the NMOS transistors N55 and N56 are non-conductive, the bit line is not charged but is held at the ground level.

As mentioned above, when the word line voltage is set to VVF5 and the verification in which the write data is "010" is performed, only when the NMOS transistors N55 and N56 are conductive, the bit line is charged.

The NMOS transistors N55 and N56 are made conductive only when the inversion node /Q2 of the latch circuit LQ2 is at the high level and the node Q1 of the latch circuit LQ1 is at the high level. They are made conductive when the write data is "01x".

Consequently, when the word line voltage is set to VVF5 and the verification is performed, only when the write data is "01x", the bit line is charged. In case of the other write data, the bit line is set to the ground level and the data is out of the target of the verification.

In this state, the word line voltage is set to VVF5 and the verification and reading are performed. When the threshold voltage Vth of the memory cell is larger than the word line voltage VVF5 (Vth>VVF5), since no current flows in the cell, the bit line voltage does not change and the node SA is held at the power voltage Vcc. The NMOS transistors N66, N67, and N68 are held conductive.

When the threshold voltage Vth of the memory cell is smaller than the word line voltage VVF5 (Vth<VVF5), the cell current larger than the leak compensation current flows, the bit line voltage drops, the NMOS transistor HN51 is turned on, and redistribution of charges occurs. The electric potential of the node SA is set to (VTRN−Vth') that is almost equal to the bit line voltage. The NMOS transistors N66, N67, and N68 cannot be made conductive at all.

After the elapse of a predetermined time, the pulse-like signals φLAT0 and φLAT2 are sequentially set to the high level.

When the threshold voltage Vth of the memory cell in which the write data is "010" is larger than the word line voltage VVF5 (Vth>VVF5), the NMOS transistor N69 is switched to the conductive state for a period of time during which the signal φLAT0 is at the high level. In this instance, since the NMOS transistor N66 is conductive, the inversion node /Q2 of the latch circuit LQ2 is set to the low level and the node Q2 of the latch circuit LQ2 is inverted to the high level.

For a period of time during which the signal φLAT2 is at the high level, the NMOS transistor N71 is switched to the conductive state. In this instance, since the NMOS transistor N68 is conductive, the inversion node /Q0 of the latch circuit LQ0 is set to the low level and the node Q0 of the latch circuit LQ0 is inverted to the high level.

Consequently, when the word line voltage is set to VVF5, if the threshold voltage Vth of the memory cell in which the write data is "010" is larger than the word line voltage VVF5 (Vth>VVF5), the latch data of the latch circuits LQ2, LQ1, and LQ0 is inverted to "111" and, after that, upon rewriting, the bit line is set to the power voltage Vcc, the channel is boosted to the non-writing potential, and no data is written.

When the threshold voltage Vth of the memory cell is smaller than the word line voltage VVF5 (Vth<VVF5), the NMOS transistor N69 is made conductive for a period of time during which the signal φLAT0 is at the high level. However, since the NMOS transistor N66 is not made conductive at all, the current enough to invert the latch circuit LQ2 cannot be supplied. Thus, the inversion of the node of the latch circuit LQ2 does not occur.

For a period of time during which the signal φLAT2 is at the high level, although the NMOS transistor N71 is made conductive, since the NMOS transistor N68 is not made conductive at all, the current enough to invert the latch circuit LQ0 cannot be supplied. Thus, the inversion of the node of the latch circuit LQ0 does not occur.

Consequently, when the word line voltage is set to VVF5, if the threshold voltage Vth of the memory cell in which the write data is "010" is smaller than the word line voltage VVF5 (Vth<VVF5), the latch data of the latch circuits LQ2, LQ1, and LQ0 does not change but is held to "010". Upon rewriting, the bit line voltage is set to the writing potential and the writing operation is performed.

The case where the word line voltage is set to VVF4 will now be described. For a period of time during which the word line voltage is set to VVF4, in a manner similar to the case of the verification of "010", only the voltage VB1 is set to the power voltage Vcc and the other voltages VB0, VB2, and VB3 are set to the ground level. For a predetermined period of time, the control signal PGM_RVPC is set to the power voltage Vcc level.

In this instance, only when the write data is "01x", the bit line is charged. In case of the other write data, the bit line is set to the ground level and the data is out of the target of the verification. After the control signal PGM_RVPC was trailed to the low level, the control signal WVFHF is set to the high level.

At this time, as for the memory cell in which the write data is "010", the inversion node /Q0 of the latch circuit LQ0 is set to the high level and the NMOS transistor N73 is made conductive. In this instance, since the control signal WVFHF is set to the high level, the NMOS transistor N72 is conductive. Therefore, the bit line and the node SA are set to the ground level through the NMOS transistors N72 and N73. Thus, with respect to the memory cell in which the write data is "010", the data is out of the target of the verification. Only with regard to the memory cell in which the write data is "011", the data becomes the target of the verification.

After the elapse of a predetermined time, the pulse-like signal φLAT0 is set to the high level.

When the threshold voltage Vth of the memory cell in which the write data is "011" is larger than the word line voltage VVF4 (Vth>VVF4), since no current flows in the cell, the bit line voltage does not change, and the node SA is held at the power voltage Vcc. The NMOS transistors N66, N67, and N68 are held conductive.

For a period of time during which the signal φLAT0 is at the high level, the NMOS transistor N69 is switched to the conductive state. At this time, since the NMOS transistor N66 is conductive, the inversion node /Q2 of the latch circuit LQ2 is set to the low level and the node Q2 of the latch circuit LQ2 is inverted to the high level.

Consequently, when the word line voltage is set to VVF4, if the threshold voltage Vth of the memory cell in which the write data is "011" is larger than the word line voltage VVF4 (Vth>VVF4), the latch data of the latch circuits LQ2, LQ1, and LQ0 is inverted to "111". After that, upon rewriting, the bit line is set to the power voltage Vcc, the channel is boosted to the non-writing potential, and no data is written.

When the threshold voltage Vth of the memory cell is smaller than the word line voltage VVF4 (Vth<VVF4), the NMOS transistors N66, N67, and N68 cannot be made conductive at all.

Therefore, for a period of time during which the signal φLAT0 is at the high level, the NMOS transistor N69 is made conductive. However, since the NMOS transistor N66 is not made conductive at all, the current enough to invert the latch circuit LQ2 cannot be supplied. The inversion of the node of the latch circuit LQ2 does not occur.

Consequently, when the threshold voltage Vth of the memory cell in which the write data is "011" is smaller than the word line voltage VVF4 (Vth<VVF4), the latch data of the latch circuits LQ2, LQ1, and LQ0 does not change but is held to "011", and upon rewriting, the bit line voltage is set to the writing potential and the data is written.

After that, when the word line voltage is set to VVF3, VVF2, and VVF1, the verification is performed by the similar operation.

That is, when the word line voltage is set to VVF3, only when the write data is "10x", the bit line is charged. In case of the other write data, the bit line is set to the ground level and the data is out of the target of the verification. After the elapse of a predetermined time, the pulse-like signals φLAT1 and φLAT2 are sequentially set to the high level. When the threshold voltage Vth of the memory cell in which the write data is "100" is larger than the word line voltage VVF3 (Vth>VVF3), the latch data of the latch circuits LQ2, LQ1, and LQ0 is inverted to "111". After that, upon rewriting, the bit line is set to the power voltage Vcc and the channel is boosted to the non-writing potential and no data is written. When the threshold voltage Vth of the memory cell in which the write data is "100" is smaller than the word line voltage VVF3 (Vth<VVF3), the latch data of the latch circuits LQ2, LQ1, and LQ0 does not change but is held to "100". Upon rewriting, the bit line voltage is set to the writing potential and the data is written.

For a period of time during which the word line voltage is set to VVF2, only when the write data is "lox", the bit line is charged. In case of the other write data, the bit line is set to the ground level and the data is out of the target of the verification. After the bit line was charged, when the control signal WVFHF is set to the high level, the bit line of the cell in which the write data is "100" is discharged to the GND level and the data is out of the target of the verification. After the elapse of a predetermined time, the pulse-like signal φLAT1 is set to the high level. When the threshold voltage Vth of the memory cell in which the write data is "101" is larger than the word line voltage VVF2 (Vth>VVF2), the latch data of the latch circuits LQ2, LQ1, and LQ0 is inverted to "111". After that, upon rewriting, the bit line BL0 is set to the power voltage Vcc and the channel is boosted to the non-writing potential and no data is written. When the threshold voltage Vth of the memory cell in which the write data is "101" is smaller than the word line voltage VVF2 (Vth<VVF2), the latch data of the latch circuits LQ2, LQ1, and LQ0 does not change but is held to "101". Upon rewriting, the bit line voltage is set to the writing potential and the data is written.

For a period of time during which the word line voltage is set to VVF1, only when the write data is "110", the bit line is charged. In case of the other write data, the bit line is set to the ground level and the data is out of the target of the verification. After the elapse of a predetermined time, the pulse-like signal φLAT2 is set to the high level. When the threshold voltage Vth of the memory cell in which the write data is "110" is larger than the word line voltage VVF1 (Vth>VVF1), the latch data of the latch circuits LQ2, LQ1, and LQ0 is inverted to "111". After that, upon rewriting, the bit line BL0 is set to the power voltage Vcc, the channel is boosted to a non-writing potential, and no data is written. When the threshold voltage Vth of the memory cell in which the write data is "110" is smaller than the word line voltage VVF1 (Vth<VVF1), the latch data of the latch circuits LQ2, LQ1, and LQ0 does not change but is held to "110". Upon rewriting, the bit line voltage is set to the writing potential and the data is written.

3-4. Operation Upon Reading in the Third Embodiment

Figure 21A:
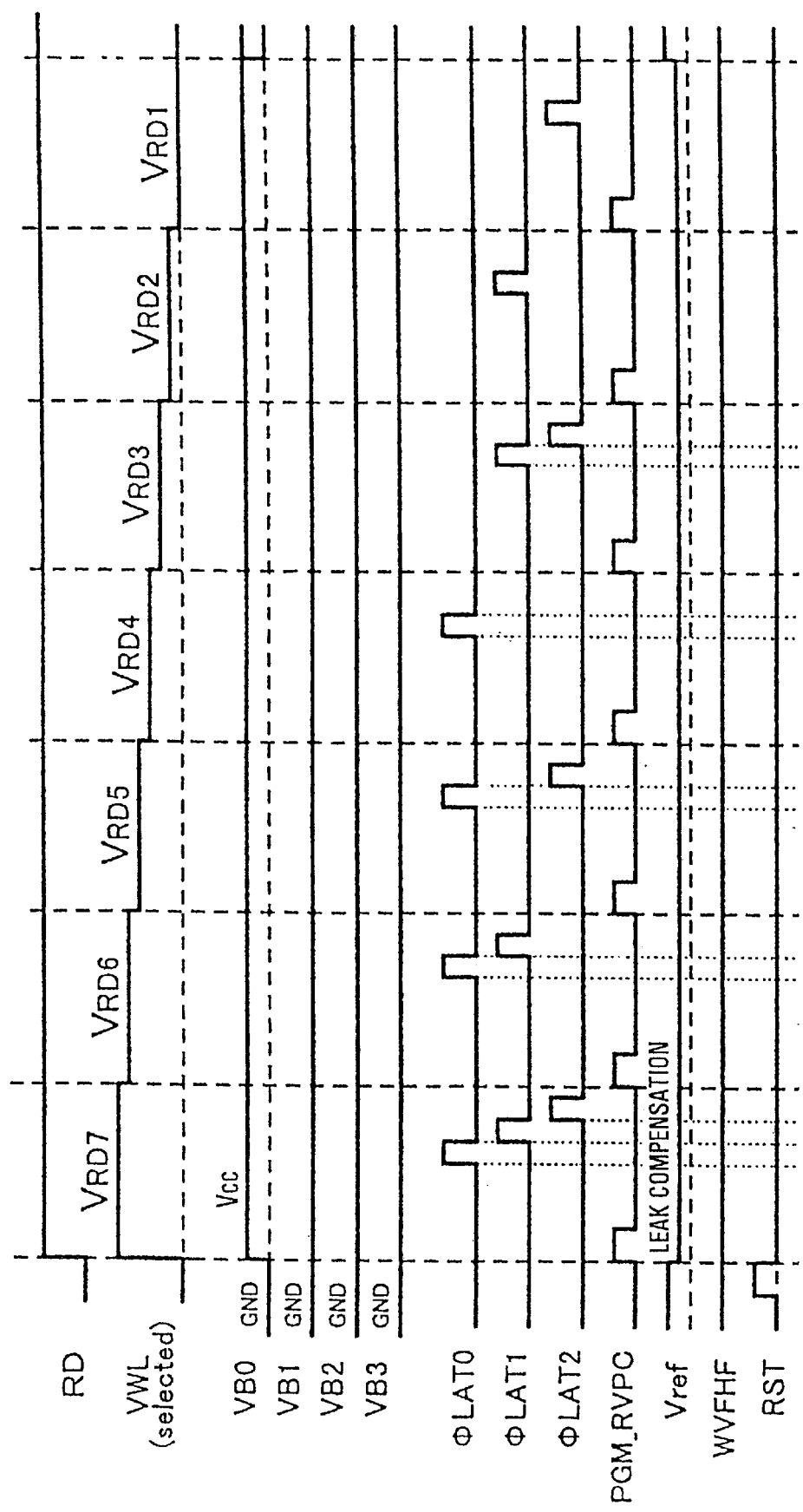
FIG. 21 is a timing chart for use in explanation upon reading in the third embodiment of the invention.
Figure 21B:
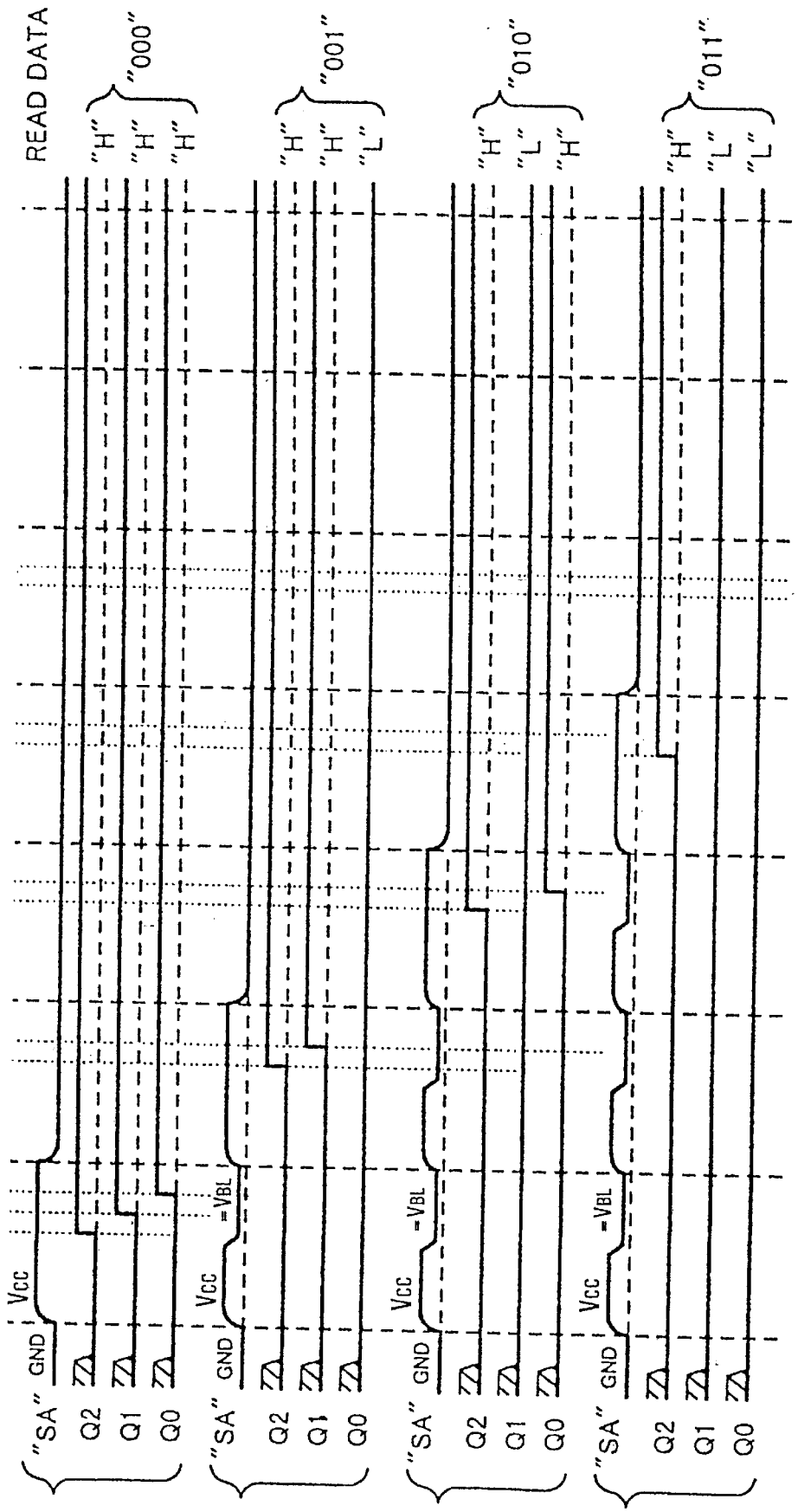
Figure 21C:
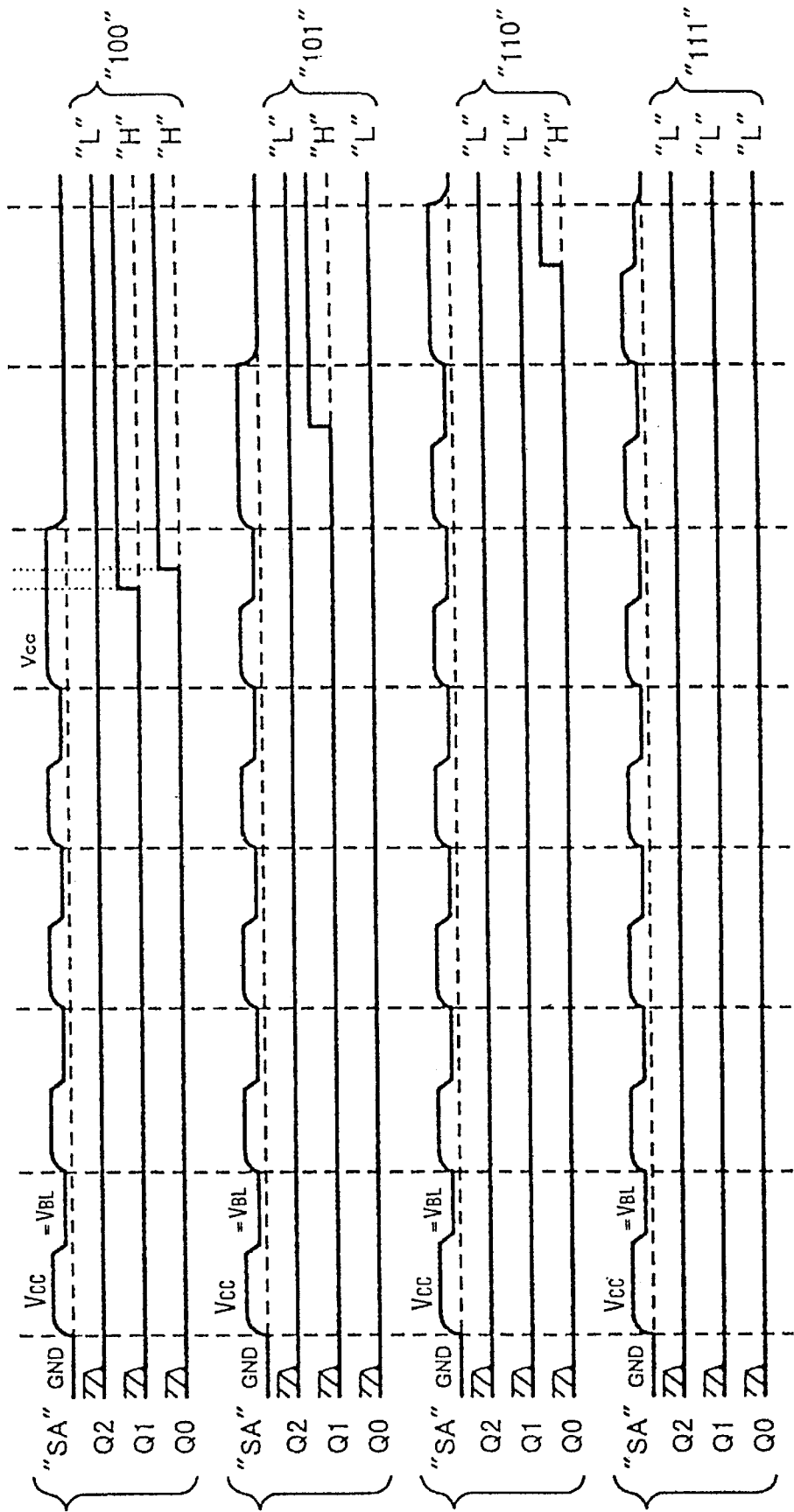

The reading operation of the third embodiment of the invention will now be described with reference to FIG. 21. The fundamental operation upon reading is similar to that in the foregoing second embodiment. That is, in the standby mode, the control signals TRN, AiB, and AiN are at the level of (Vcc−Vth) and the control signal DIS is set to the high level. In this instance, the NMOS transistor N51 is made conductive, and all of the bit lines are set to the ground level.

When the reading operation is activated in this state, the control signal DIS is set to the low level and the bit line is disconnected from the ground line. When the selection bit line is, for example, the even bit line, the signal AiB is set to the P5V level and the signal AiN is set to the ground level. The odd bit line is disconnected from the latch, the control signal TRN is held at (Vcc−Vth (=VTRN)). At the same time, the control signal RST is set to the high level and all of the nodes Q2, Q1, and Q0 of the latch circuits LQ2, LQ1, and LQ0 are reset to "0".

The reading operation is performed by sequentially reducing the word line voltage to VRD7→VRD6→VRD5→VRD4→VRD3→VRD2→VRD1. Upon reading, the voltage VB0 is always set to the Vcc level and the voltages VB1, VB2, and VB3 are always set to the ground level as shown in FIG. 17B. For this period of time, the voltage to supply the current to compensate the leakage of the bit line is applied to the control signal Vref.

The read control signal RD is always set to the high level and the NMOS transistor N65 is always conductive for the reading period of time. At the time of reading, since the signal WVFHF is always at the low level, the transistor N72 is always OFF.

First, the selection word line voltage is set to VRD7, the control signal PGM_RVPC is set to the power voltage Vcc, and the NMOS transistor N52 is made conductive.

When the NMOS transistors N54 and N53 are conductive, the current from the voltage VB0 flows through the NMOS transistors N54, N53, and N52 and the bit line is charged. When the reading operation is started, since all of the latch circuits LQ2, LQ1, and LQ0 are reset to "0", the inversion node /Q2 of the latch circuit LQ2 is set to "1" and the inversion node /Q1 of the latch circuit LQ1 is set to "1". Therefore, in this instance, the NMOS transistors N54 and N53 are conductive.

Therefore, the current from the voltage VB0 flows through the NMOS transistors N54, N53, and N52 and all of the even bit lines are charged to (VTRN−Vth). By cutting off the NMOS transistor HN51, all of the nodes SA are charged to Vcc. After that, the control signal PGM_RVPC is reset to the ground level.

When the threshold voltage Vth of the memory cell is larger than the word line voltage VRD7 (Vth>VRD7) as a result of the reading at the word line voltage VRD7, since no cell current flows, the node SA is held at the power voltage Vcc. In this instance, the NMOS transistors N66, N67, and N68 are made conductive.

After the elapse of a predetermined time, the pulse-like signals φLAT0, φLAT1, and φLAT2 are sequentially set to the high level.

When the signal φLAT0 is set to the high level, the NMOS transistor N69 is made conductive. The NMOS transistor N66 is conductive. Therefore, the inversion node /Q2 of the latch circuit LQ2 is set to "0" and the node Q2 of the latch circuit LQ2 is inverted to "1".

When the signal φLAT1 is set to the high level, the NMOS transistor N70 is made conductive. The NMOS transistor N67 is conductive. Therefore, the inversion node /Q1 of the latch circuit LQ1 is set to "0" and the node Q1 of the latch circuit LQ1 is inverted to "1".

When the signal φLAT2 is set to the high level, the NMOS transistor N71 is made conductive. The NMOS transistor N68 is conductive. Therefore, the inversion node /Q0 of the latch circuit LQ0 is set to "0" and the node Q1 of the latch circuit LQ0 is inverted to "1".

Consequently, when the threshold voltage Vth of the memory cell is larger than the word line voltage VRD7 (Vth>VRD7), the latch data of the latch circuits LQ2, LQ1, and LQ0 is inverted to "111". The read data has been inverted. The read data when the latch data is "111" is "000".

On the other hand, when the threshold voltage Vth of the memory cell is smaller than the word line voltage VRD7 (Vth<VRD7), the cell current larger than the leak compensation current flows, the bit line voltage drops, the NMOS transistor HN51 is made conductive, and redistribution of charges occurs. The voltage of the node SA is set to (VTRN−Vth) that is almost equal to the bit line voltage. Thus, the NMOS transistors N66, N67, and N68 are not made conductive at all.

After the elapse of a predetermined time, the pulse-like signals φLAT0, φLAT1, and φLAT2 are sequentially set to the high level.

When the signal φLAT0 is set to the high level, the NMOS transistor N69 is made conductive. However, since the NMOS transistor N66 is not conductive at all, a current enough to invert the latch circuit LQ2 cannot be supplied and the inversion of the node of the latch circuit LQ2 does not occur.

When the signal φLAT1 is set to the high level, the NMOS transistor N70 is made conductive. However, since the NMOS transistor N67 is not conductive at all, a current enough to invert the latch circuit LQ1 cannot be supplied and the inversion of the node of the latch circuit LQ1 does not occur.

When the signal φLAT2 is set to the high level, the NMOS transistor N71 is made conductive. However, since the NMOS transistor N68 is not conductive at all, a current enough to invert the latch circuit LQ0 cannot be supplied and the inversion of the node of the latch circuit LQ0 does not occur.

Subsequently, the selection word line voltage is set to VRD6 and the control signal PGM_RVPC is set to the power voltage Vcc. The NMOS transistor N52 is made conductive.

When the selection word line voltage is set to VRD7 and the reading operation is performed at the previous time, the current from the voltage VB0 is supplied through the NMOS transistors N54, N53, and N52 to the bit line connected to the cell in which the inversion of the nodes of the latch circuits LQ1 and LQ2 did not occur, so that the bit line is charged to (VTRN−Vth'). By cutting off the NMOS transistor HN51, the node SA is charged to Vcc.

When the selection word line voltage is set to VRD7 and the reading operation is performed at the previous time, if the inversion of the nodes of the latch circuits LQ1 and LQ2 occurred, the NMOS transistors N54 and N53 are made non-conductive. In this case, the data is out of the target of the reading operation. After that, the control signal PGM_RVPC is reset to the ground level.

When the threshold voltage Vth of the memory cell is larger than the word line voltage VRD6 (Vth>VRD6) as a result of the reading at the word line voltage VRD6, since no cell current flows, the node SA is held at the power voltage Vcc. In this instance, the NMOS transistors N66, N67, and N68 are made conductive.

After the elapse of a predetermined time, the pulse-like signals φLAT0 and φLAT1 are sequentially set to the high level.

When the signal φLAT0 is set to the high level, the NMOS transistor N69 is made conductive. Since the NMOS transistor N66 is conductive, the inversion node /Q2 of the latch circuit LQ2 is set to "0" and the node Q2 of the latch circuit LQ2 is inverted to "1".

When the signal φLAT1 is set to the high level, the NMOS transistor N70 is made conductive. Since the NMOS transistor N67 is conductive, the inversion node /Q1 of the latch circuit LQ1 is inverted to "0" and the node Q1 of the latch circuit LQ1 is inverted to "1".

Thus, when the threshold voltage Vth of the memory cell is larger than the word line voltage VRD6 (Vth>VRD6), if the inversion of the latch had not occurred until the previous time, the latch data of the latch circuits LQ2, LQ1, and LQ0 is inverted to "110". On the other hand, if the inversion of the latch had occurred until the previous time, the data is held. The read data has been inverted. The read data when the latch data is "110" is "001".

When the threshold voltage Vth of the memory cell is smaller than the word line voltage VRD6 (Vth<VRD6), the cell current larger than the leak compensation current flows, the bit line voltage drops, the NMOS transistor HN51 is made conductive, and redistribution of charges occurs. The voltage of the node SA is set to (VTRN−Vth) that is almost equal to the bit line voltage. Thus, the NMOS transistors N66, N67, and N68 are not made conductive at all.

After the elapse of a predetermined time, the pulse-like signals φLAT0 and φLAT1 are sequentially set to the high level.

When the signal φLAT0 is set to the high level, the NMOS transistor N69 is made conductive. However, since the NMOS transistor N66 is not conductive at all, the current enough to invert the latch circuit LQ2 cannot be supplied and the inversion of the node of the latch circuit LQ2 does not occur.

When the signal φLAT1 is set to the high level, the NMOS transistor N70 is made conductive. However, since the NMOS transistor N67 is not conductive at all, the current enough to invert the latch circuit LQ1 cannot be supplied and the inversion of the node of the latch circuit LQ1 does not occur.

Subsequently, when the selection word line voltage is set to VRD5, the control signal PGM_RVPC is set to the power voltage Vcc and the NMOS transistor N52 is made conductive.

If the inversion of the nodes had not occurred until the previous time, since the NMOS transistors N54 and N53 are conductive, the bit line is charged by the voltage VB0. In this instance, the even bit line as a target of the reading operation is charged to (VTRN−Vth'). By cutting off the NMOS transistor HN51, the node SA as a target of the reading operation is charged to Vcc.

If the inversion of the nodes of the latch circuits LQ1 and LQ2 had occurred until the previous time in the reading operation, the NMOS transistors N54 and N53 are made non-conductive. In this case, the data is out of the target of the reading operation.

After that, the control signal PGM_RVPC is reset to the ground level.

When the threshold voltage Vth of the memory cell is larger than the word line voltage VRD5 (Vth>VRD5) as a result of the reading at the word line voltage VRD5, since no cell current flows, the node SA is held at the power voltage Vcc. At this time, the NMOS transistors N66, N67, and N68 are made conductive.

After the elapse of a predetermined time, the pulse-like signals φLAT0 and φLAT2 are sequentially set to the high level.

When the signal φLAT0 is set to the high level, the NMOS transistor N69 is made conductive. Since the NMOS transistor N66 is conductive, the inversion node /Q2 of the latch circuit LQ2 is set to "0" and the node Q2 of the latch circuit LQ2 is inverted to "1".

When the signal φLAT2 is set to the high level, the NMOS transistor N71 is made conductive. Since the NMOS transistor N68 is conductive, the inversion node /Q0 of the latch circuit LQ0 is inverted to "0" and the node Q0 of the latch circuit LQ0 is inverted to "1".

Consequently, when the threshold voltage Vth of the memory cell is larger than the word line voltage VRD5 (Vth>VRD5), if the inversion of the latch had not occurred until the previous time, the latch data of the latch circuits LQ2, LQ1, and LQ0 is inverted to "101". If the inversion of the latch had occurred until the previous time, the data is held. The read data has been inverted. The read data when the latch data is "101" is "010".

When the threshold voltage Vth of the memory cell is smaller than the word line voltage VRD5 (Vth<VRD5), the cell current larger than the leak compensation current flows, the bit line voltage drops, the NMOS transistor HN51 is made conductive, and redistribution of charges occurs. The voltage of the node SA is set to (VTRN−Vth') that is almost equal to the bit line voltage. Thus, the NMOS transistors N66, N67, and N68 are not made conductive at all.

After the elapse of a predetermined time, the pulse-like signals φLAT0 and φLAT2 are sequentially set to the high level.

When the signal φLAT0 is set to the high level, the NMOS transistor N69 is made conductive. However, since the NMOS transistor N66 is not made conductive at all, the current enough to invert the latch circuit LQ2 cannot be supplied. The inversion of the node of the latch circuit LQ2 does not occur.

When the signal φLAT2 is set to the high level, the NMOS transistor N71 is made conductive. However, since the NMOS transistor N68 is not made conductive at all, the current enough to invert the latch circuit LQ0 cannot be supplied. The inversion of the node of the latch circuit LQ0 does not occur.

Subsequently, the selection word line voltage is set to VRD4 and the reading operation is performed. After the elapse of a predetermined time, the pulse-like signal φLAT0 is set to the high level.

When the threshold voltage Vth of the memory cell is larger than the word line voltage VRD4 (Vth>VRD4) as a result of the reading at the word line voltage VRD4, since no cell current flows, the node SA is held at the power voltage Vcc. In this instance, the NMOS transistors N66, N67, and N68 are made conductive.

When the signal φLAT0 is set to the high level, the NMOS transistor N69 is made conductive. Since the NMOS transistor N66 is conductive, the inversion node /Q2 of the latch circuit LQ2 is set to "0" and the node Q2 of the latch circuit LQ2 is inverted to "1".

Consequently, when the threshold voltage Vth of the memory cell is larger than the word line voltage VRD4 (Vth>VRD4), if the inversion of the latch had not occurred until the previous time, the latch data of the latch circuits LQ2, LQ1, and LQ0 is inverted to "100". If the inversion of the latch had not occurred until the previous time, the data is held. The read data has been inverted. The read data when the latch data is "100" is "011".

When the threshold voltage Vth of the memory cell is smaller than the word line voltage VRD4 (Vth<VRD4), the cell current larger than the leak compensation current flows, the bit line voltage drops, the NMOS transistor HN51 is made conductive, and redistribution of charges occurs. The voltage of the node SA is set to (VTRN−Vth') that is almost equal to the bit line voltage. Thus, the NMOS transistors N66, N67, and N68 are not made conductive at all.

When the signal φLAT0 is set to the high level, the NMOS transistor N69 is made conductive. However, since the NMOS transistor N66 is not made conductive at all, the current enough to invert the latch circuit LQ2 cannot be supplied and the inversion of the node of the latch circuit LQ2 does not occur.

In a manner similar to the above, the reading operation is performed. That is, the selection word line voltage is set to VRD3 and the reading operation is performed. After the elapse of a predetermined time, the pulse-like signals φLAT1 and φLAT2 are sequentially set to the high level.

Consequently, when the threshold voltage Vth of the memory cell is larger than the word line voltage VRD3 (Vth>VRD3), if the inversion of the latch had not occurred until the previous time, the latch data of the latch circuits LQ2, LQ1, and LQ0 is inverted to "011". The read data has been inverted. The read data when the latch data is "011" is "100". When the threshold voltage Vth of the memory cell is smaller than the word line voltage VRD3, even if the signals φLAT1 and φLAT2 are set to the high level, the current enough to invert the latch circuits LQ1 and LQ0 cannot be supplied and the inversion of the node of the latch circuits LQ1 and LQ0 does not occur.

Subsequently, the selection word line voltage is set to VRD2 and the reading operation is performed. After the elapse of a predetermined time, the pulse-like signal φLAT1 is set to the high level. Thus, when the threshold voltage Vth of the memory cell is larger than the word line voltage VRD2 (Vth>VRD2), if the inversion of the latch had not occurred until the previous time, the latch data of the latch circuits LQ2, LQ1, and LQ0 is inverted to "010". The read data has been inverted. The read data when the latch data is "010" is "101". When the threshold voltage Vth of the memory cell is smaller than the word line voltage VRD2, even if the signal φLAT1 is set to the high level, the current enough to invert the latch circuit LQ1 cannot be supplied and the inversion of the node of the latch circuit LQ1 does not occur.

Subsequently, the selection word line voltage is set to VRD1 and the reading operation is performed. After the elapse of a predetermined time, the pulse-like signal φLAT2 is set to the high level.

Consequently, when the threshold voltage Vth of the memory cell is larger than the word line voltage VRD1 (Vth>VRDL), if the inversion of the latch had not occurred until the previous time, the latch data of the latch circuits LQ2, LQ1, and LQ0 is inverted to "001". The read data has been inverted. The read data when the latch data is "001" is "110". When the threshold voltage Vth of the memory cell is smaller than the word line voltage VRD1, even if the signal φLAT2 is set to the high level, the current enough to invert the latch circuit LQ0 cannot be supplied and the inversion of the node of the latch circuit LQ0 does not occur.

The selection word line voltages are set to VRD7 to VRD1. If the inversion of the latch at any of the above voltages did not occur, the data of the latch circuits LQ2, LQ1, and LQ0 is held to "000". When the latch data is "000", the read data is "111".

In the embodiment as mentioned above, upon reading, if the inversion of the data in the latch circuit had occurred until the previous time in the reading operation, the data is out of the target of the reading operation. Only when the inversion of the data in the latch circuit had not occurred until the previous time in the reading operation, the data read out. With the above construction, the circuit scale is reduced.

4. Modification

The quartic data is recorded in the memory cell in the first embodiment. The octenary data is recorded in the memory cell in the second and third embodiments. However, the invention is not limited to those embodiments. For example, the hexadecimal data can be recorded into the memory cell.

In the above first, second, and third embodiments, at the time of the verifying operation, the word line voltage is switched to (2n−1) stages in accordance with the distribution state of the threshold voltage and whether the bit line is precharged or not is controlled in accordance with the latched data.

That is, in the first embodiment, when the word line voltage is set to VVF3, the voltage of Vcc is applied to only the voltage VB0 and the voltages VB1 and VB2 are set to the ground level. Therefore, only when the write data latched in the latch circuit is "00", the NMOS transistors n3 and n4 are made conductive and the bit line is precharged. In case of the other data, the bit line is not precharged.

In a manner similar to the above, when the word line voltage is set to VVF2, the voltage of Vcc is applied to only the voltage VB1 and the voltages VB0 and VB2 are set to the ground level. Only when the write data latched in the latch circuit is "01", the bit line is precharged. In case of the other data, the bit line is not precharged. When the word line voltage is set to VVF1, the voltage of Vcc is applied to only the voltage VB2 and the voltages VB0 and VB1 are set to the ground level. Only when the write data latched in the latch circuit is "10", the bit line is precharged. In case of the other data, the bit line is not precharged.

In the second and third embodiments, when the word line voltage is set to VVF7 and VVF6, the voltage of Vcc is applied to only the voltage VB0 and the voltages VB1, VB2, and VB3 are set to the ground level. Therefore, only when the write data latched in the latch circuit is "00x", the NMOS transistors N3 and N4 are made conductive. The bit line is precharged. In case of the other data, the bit line is not precharged.

Similarly, when the word line voltage is set to VVF5 and VVF4, the voltage of Vcc is given to only the voltage VB1 and the voltages VB0, VB2, and VB3 are set to the ground level. Therefore, only when the write data latched in the latch circuit is "01x", the bit line is precharged. In case of the other data, the bit line is not precharged. When the word line voltage is set to VVF3 and VVF2, the voltage of Vcc is given to only the voltage VB2 and the voltages VB0, VB1, and VB3 are set to the ground level. Therefore, only when the write data latched in the latch circuit is "10x", the bit line is precharged. In case of the other data, the bit line is not precharged. When the word line voltage is set to VVF1, the voltage of Vcc is given to only the voltage VB3 and the voltages VB0, VB1, and VB2 are set to the ground level. Therefore, only when the write data latched in the latch circuit is "110", the bit line is precharged. In case of the other data, the bit line is not precharged.

When the verification is performed as mentioned above, in the third embodiment, with respect to the least significant bit, the status of the node of the least significant bit is supplied to gates of the NMOS transistors N19 and N23, and the status of the inversion node is supplied to the NMOS transistors N12 and N25. Whether the latch circuits LQ2, LQ1, and LQ0 are set or not set is controlled in accordance with the status of the latch circuit of the least significant bit.

In the third embodiment, further, when the verification is performed as mentioned above, with respect to the least significant bit which is latched into the latch circuit LQ0, the bit line is controlled so as to be discharged by the NMOS transistors N72 and N73 in accordance with the status of the least significant bit.

It is possible to discriminate all of the bits of the latch data and control whether the bit line is precharged or not instead of controlling whether the latch circuits LQ2 and LQ1 are set or not in accordance with the status of the latch circuit of the least significant bit or controlling whether the discharge of the bit line is inhibited.

Upon reading, it is controlled so that only when the inversion of the node of the latch circuit had not occurred so far, the bit line is precharged. It is controlled so that if the inversion of the node of the latch circuit had occurred until the previous time, the precharge current does not flow to the bit line. That is, upon reading in the first embodiment, only the voltage VB0 is set to Vcc and the voltages VB1 and VB2 are set to the ground level. Only when the inversion of the latch circuit had not occurred in the reading operation so far, the NMOS transistors n4 and n3 are made conductive. The bit line is precharged by the voltage VB0, the data is read out, and the read data is set into the latch circuit. If the inversion of the latch circuit had occurred in the reading operation so far, the bit line is not precharged and the data so far is held. At the time of the reading in the second and third embodiments, only the voltage VB0 is set to Vcc and the voltages VB1, VB2, and VB3 are set to the ground level. Only when the inversion of the latch circuit did not occur in the reading operation so far, the NMOS transistors N4 and N3 are made conductive, the bit line is precharged by the voltage VB0, and the data is read out. The read data is set into the latch circuit. If the inversion of the latch circuit had occurred in the reading operation so far, the bit line is not precharged and the data so far is held.

In the foregoing second and third embodiments, whether the inversion of the latch circuit has occurred or not is discriminated from the data of the latch circuits LQ2 and LQ1. However, the occurrence of the inversion of the latch circuit can be discriminated from all of the data in the latch circuits LQ2, LQ1, and LQ0.

The present invention is not limited to the foregoing embodiments but many modifications and variations are possible within the spirit and scope of the appended claims of the invention.

What is claimed is:

1. A non-volatile semiconductor memory device which has memory cells in each of which an amount of charges accumulated in a charge accumulating unit changes in accordance with voltages applied to a word line and a bit line, a threshold voltage changes in accordance with the change in charge amount, and data of a value according to said threshold voltage is stored, and in which multivalue data of n bits is written into said memory cells, comprising:

n latch circuits in each of which write data is latched at the time of writing and, when the data is sufficiently written at the time of verification, it is set to predetermined data, and further, read data is set at the time of reading;

write control means for setting a bit line voltage according to the data latched in said latch circuit at the time of writing;

verify control means for setting a word line voltage in accordance with a distribution state of the threshold voltage at the time of verification, specifying said latch circuit depending on whether the threshold voltage of said memory cell exceeds the voltage applied to said word line or not, and controlling so that when the data is sufficiently written at the time of said verification, predetermined data is set into said latch circuit; and read control means for setting the word line voltage in accordance with the distribution state of the threshold voltage at the time of reading, specifying said latch circuit depending on whether the threshold voltage of said memory cell exceeds the voltage applied to said word line or not, and controlling so that the read data is set into the latch circuit, wherein in the verifying operation, said verify control means sets the word line voltage to a plurality of stages in accordance with the distribution state of the threshold voltage, controls so that said bit line is precharged or not in accordance with the data latched in said latch circuit, detects whether the threshold voltage of said memory cell exceeds the voltage applied to said word line or not on the basis of whether a current flows in said memory cell or not, and specifies said latch circuit in accordance with an output of said detection, thereby allowing the predetermined data to be set into said latch circuit when the data is sufficiently written at the time of said verification.

2. A memory device according to claim 1, wherein said memory cell comprises a memory string connected to the bit line and a source line through a selection transistor in which conductive states of one end and the other end are controlled in accordance with a gate voltage.

3. A memory device according to claim 1, wherein said verify control means includes:

means for controlling so as to supply a precharge current to said bit line only when the predetermined data excluding the least significant bit has been latched in said latch circuit; and means for controlling so that the state of said latch circuit is not inverted in accordance with the status of said least significant bit.

4. A memory device according to claim 1, wherein said verify control means includes:

means for controlling so as to supply a precharge current to said bit line only when the predetermined data excluding the least significant bit has been latched in said latch circuit; and means for controlling so as to discharge said bit line in accordance with the status of said least significant bit.

5. A memory device according to claim 1, wherein the multivalue data of (n=2) bits is written into said memory cell.

6. A memory device according to claim 1, wherein the multivalue data of (n=3) bits is written into said memory cell.

7. A non-volatile semiconductor memory device which has memory cells in each of which an amount of charges accumulated in a charge accumulating unit changes in accordance with voltages applied to a word line and a bit line, a threshold voltage changes in accordance with the change in charge amount, and data of a value according to said threshold voltage is stored, and in which multivalue data of n bits is written into said memory cells, comprising:

n latch circuits in each of which write data is latched at the time of writing and, when the data is sufficiently written at the time of verification, it is set to predetermined data, and further, read data is set at the time of reading;

write control means for setting a bit line voltage according to the data latched in said latch circuit at the time of writing;

verify control means for setting a word line voltage in accordance with a distribution state of the threshold voltage at the time of verification, specifying said latch circuit depending on whether the threshold voltage of said memory cell exceeds the voltage applied to said word line or not, and controlling so that when the data is sufficiently written at the time of said verification, predetermined data is set into said latch circuit; and read control means for setting the word line voltage in accordance with the distribution state of the threshold voltage at the time of reading, specifying said latch circuit depending on whether the threshold voltage of said memory cell exceeds the voltage applied to said word line or not, and controlling so that the read data is set into the latch circuit, wherein at the time of reading, said read control means sets the word line voltage to a plurality of stages in accordance with the distribution state of the threshold voltage, precharges said bit line only when an inversion of a node of said latch circuit had not occurred until the previous time, detects whether the threshold voltage of said memory cell exceeds the voltage applied to said word line or not on the basis of whether a current flows in said memory cell or not, and specifies said latch circuit in accordance with an output of said detection, thereby allowing the read data to be set into said latch circuit at the time of said reading.

8. A memory device according to claim 7, wherein said memory cell comprises a memory string connected to the bit line and a source line through a selection transistor in which conductive states of one end and the other end are controlled in accordance with a gate voltage.

9. A memory device according to claim 7, wherein the multivalue data of (n=2) bits is written into said memory cell.

10. A memory device according to claim 7, wherein the multivalue data of (n=3) bits is written into said memory cell.

11. A verifying method of a non-volatile semiconductor memory device which has memory cells in each of which an amount of charges accumulated in a charge accumulating unit changes in accordance with voltages applied to a word line and a bit line, a threshold voltage changes in accordance with the change in charge amount, and data of a value according to the threshold voltage is stored, and in which multivalue data of n bits is written into said memory cells, comprising the steps of:

setting a word line voltage to a plurality of stages in accordance with a distribution state of the threshold voltage;

controlling so that the bit line is precharged or not in accordance with data latched in a latch circuit;

detecting whether the threshold voltage of said memory cell exceeds the voltage applied to said word line or not on the basis of whether a current flows in said memory cell or not; and specifying said latch circuit in accordance with an output of said detection, thereby allowing predetermined data to be set into said latch circuit when the data is sufficiently written at the time of said verification.

12. A reading method of a non-volatile semiconductor memory device which has memory cells in each of which an amount of charges accumulated in a charge accumulating unit changes in accordance with voltages applied to a word line and a bit line, a threshold voltage changes in accordance with the change in charge amount, and data of a value according to the threshold voltage is stored, and in which multivalue data of n bits is written into said memory cells, comprising the steps of:

setting a word line voltage to a plurality of stages in accordance with a distribution state of the threshold voltage;

precharging said bit line only when an inversion of a node of said latch circuit had not occurred until the previous time;

detecting whether the threshold voltage of said memory cell exceeds the voltage applied to said word line or not on the basis of whether a current flows in said memory cell or not; and specifying said latch circuit in accordance with an output of said detection, thereby allowing read data to be set into said latch circuit at the time of said reading.

* * * * *